United States Patent
Sakotsubo

(10) Patent No.: US 8,710,478 B2
(45) Date of Patent: Apr. 29, 2014

(54) NONVOLATILE SEMICONDUCTOR STORAGE DEVICE AND A MANUFACTURING METHOD THEREOF

(75) Inventor: Yukihiro Sakotsubo, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/474,690

(22) Filed: May 17, 2012

(65) Prior Publication Data

US 2012/0313068 A1    Dec. 13, 2012

(30) Foreign Application Priority Data

Jun. 7, 2011   (JP) .................................. 2011-127506

(51) Int. Cl.
   *H01L 29/02*   (2006.01)

(52) U.S. Cl.
   USPC ................ 257/2; 257/3; 257/4; 257/E29.002; 438/102; 438/104; 438/382; 438/478

(58) Field of Classification Search
   USPC ................... 257/2–5, E29.002, E45.002; 438/102–104, 382, 478, 678
   See application file for complete search history.

(56) References Cited

U.S. PATENT DOCUMENTS

| 5,640,343 | A | 6/1997 | Gallagher et al. |
| 2008/0258129 | A1 | 10/2008 | Toda |
| 2010/0038617 | A1 | 2/2010 | Nakajima et al. |

FOREIGN PATENT DOCUMENTS

| JP | 2007-149170 A | 6/2007 |
| JP | 2010-067942 A | 3/2010 |

OTHER PUBLICATIONS

W. W. Zhuang et al., "Novell Colossal Mangetoresistive Thin Film Nonvolatile Resistance Random Access Memory (RRAM)", Electron Devices Meeting, 2002. IEDM '02. Digest. International, pp. 193-196 (2002).
Shima et al. "Resistance switching in the metal deficient-type oxides: NiO and CoO", Appl. Phys. Lett. 91, 012901 (2007).
Tsunoda et al., "Low Power and High Speed Switching of Ti-doped NiO ReRAM under the Unipolar Voltage Source of less than 3V", Electron Devices Meeting, 2007. IEDM 2007. IEEE International, pp. 767-770 (2007).
Y. Sakotsubo et al., "A New Approach for Improving Operating Margin of Unipolar ReRAM Using Local Minimum of Reset Voltage", 2010 Symposium on VLSI Technology Digest of Technical Papers, pp. 87-88 (2010).
Y. Sasago et al., "Cross-point phase change memory resistivity with 4F2 cell size driven by low-contact-resistivity poly-Si diode", 2009 Symposium on VLSI Technology Digest of Technical Papers, pp. 24-25 (2009).
J. H. Oh, et al., "Full Integration of Highly Manufacturable 512Mb PRAM based on 90 nm Technology", Electron Devices Meeting, 2006. IEDM '06. International, pp. 1-4 (2006).

*Primary Examiner* — Mark A Laurenzi
(74) *Attorney, Agent, or Firm* — McGinn IP Law Group, PLLC

(57) ABSTRACT

Provided is a resistance change type nonvolatile semiconductor storage device including a diode capable of passing therethrough a sufficient current to a resistance changing operation even when the memory cell is miniaturized. A nonvolatile semiconductor storage device has first wires extending in X direction, second wires extending in Y direction, and memory cells disposed at intersection points of the first wires and the second wires. The memory cell includes a diode disposed over the first wire, and coupled to the first wire at one end, and a resistance change part disposed over the diode, and series-coupled to the diode at one end, and coupled to the second wire at the other end, and storing information through changes in resistance value. The diode includes a first conductivity type first semiconductor layer, and a second conductivity type second semiconductor layer extending into the inside of the first semiconductor layer.

10 Claims, 55 Drawing Sheets

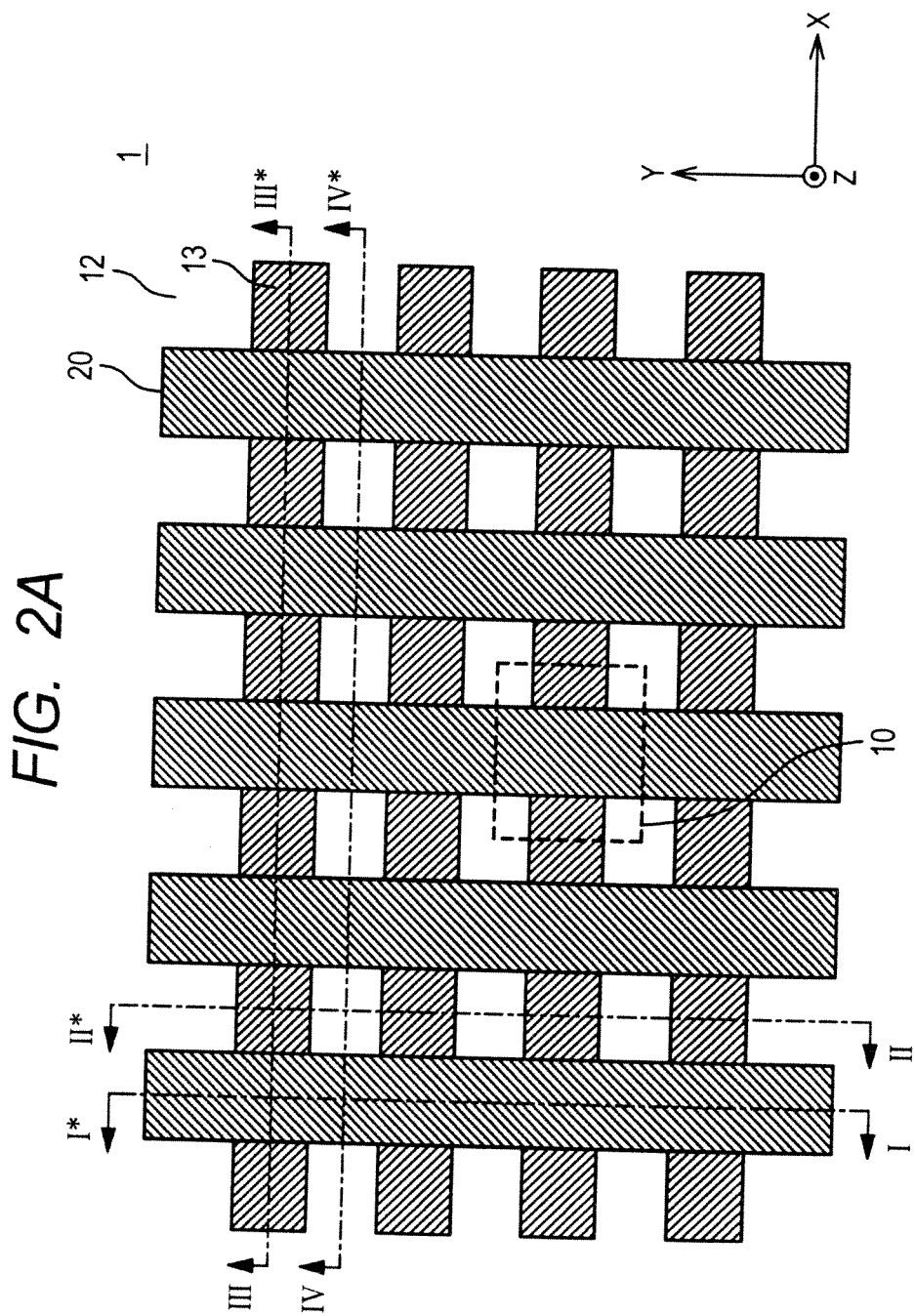

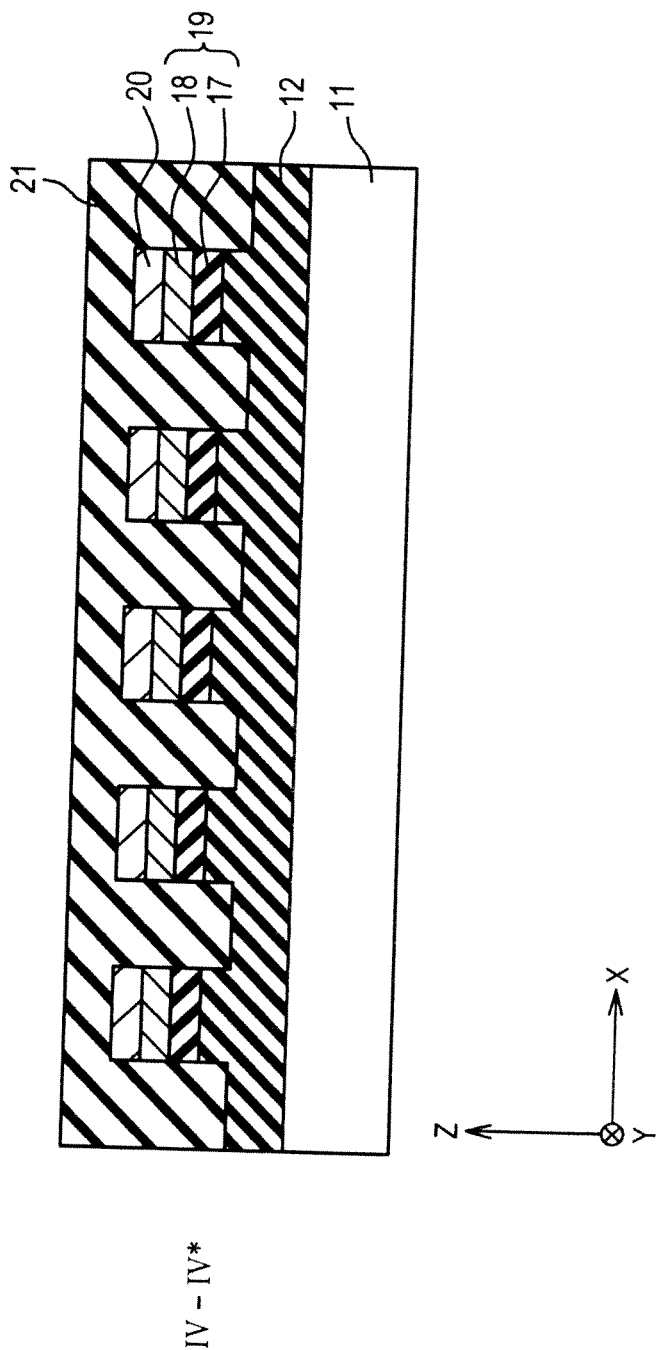

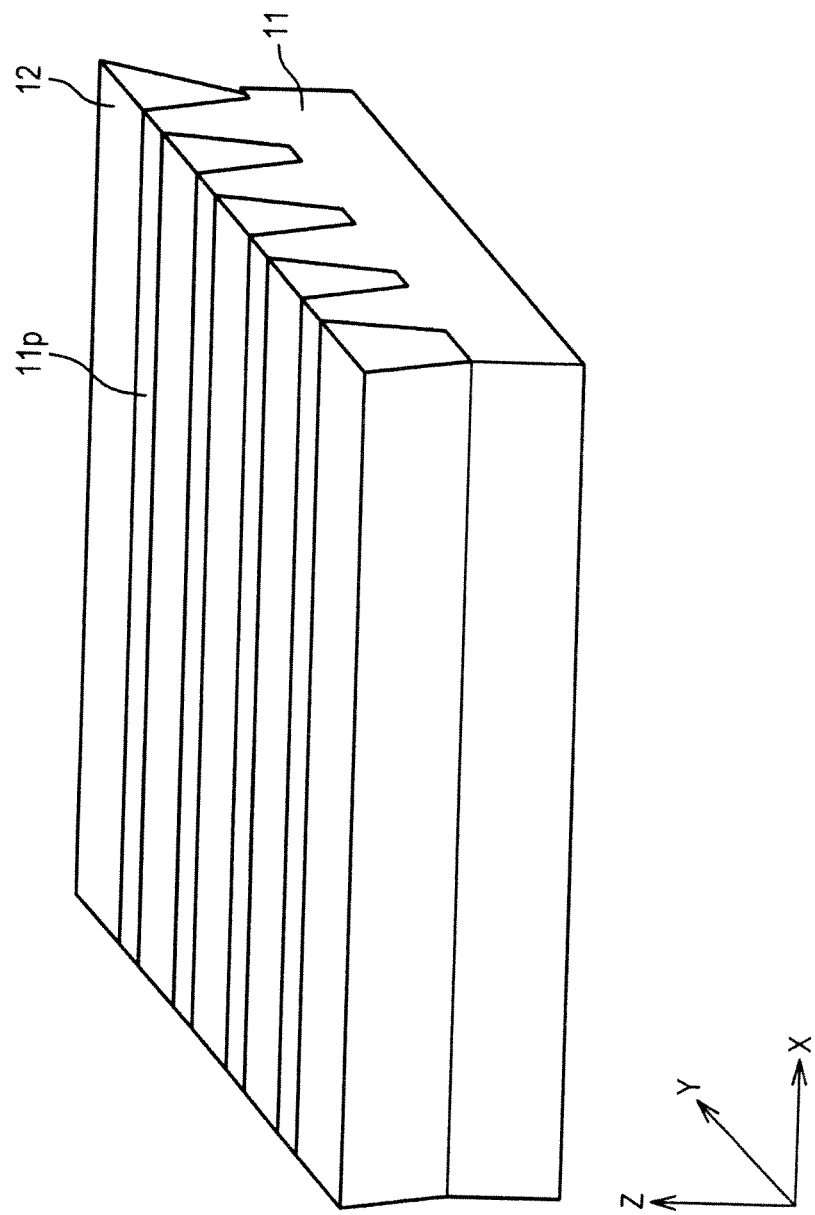

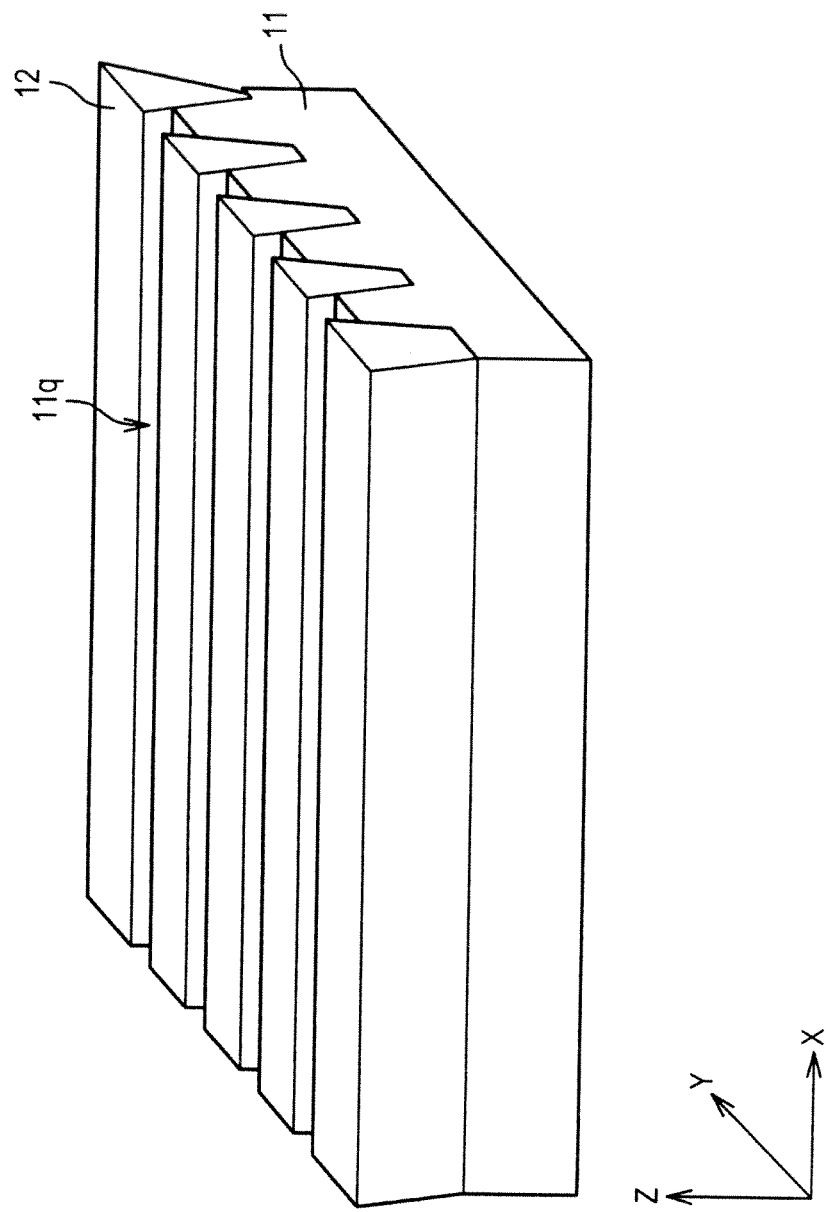

FIG. 6B
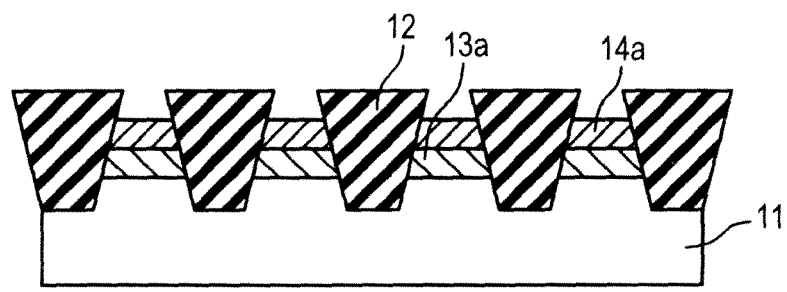
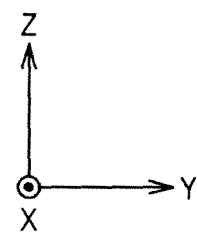
FIG. 6C
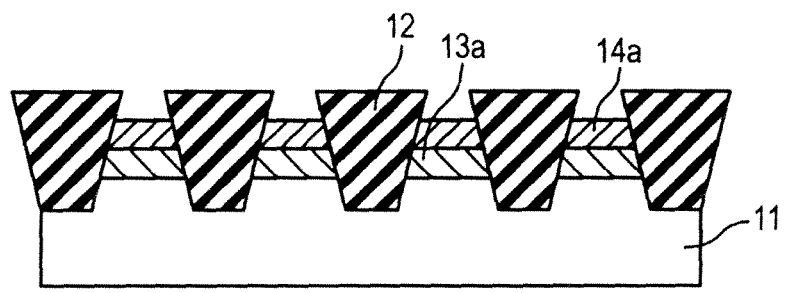
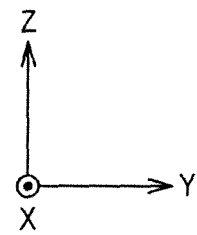

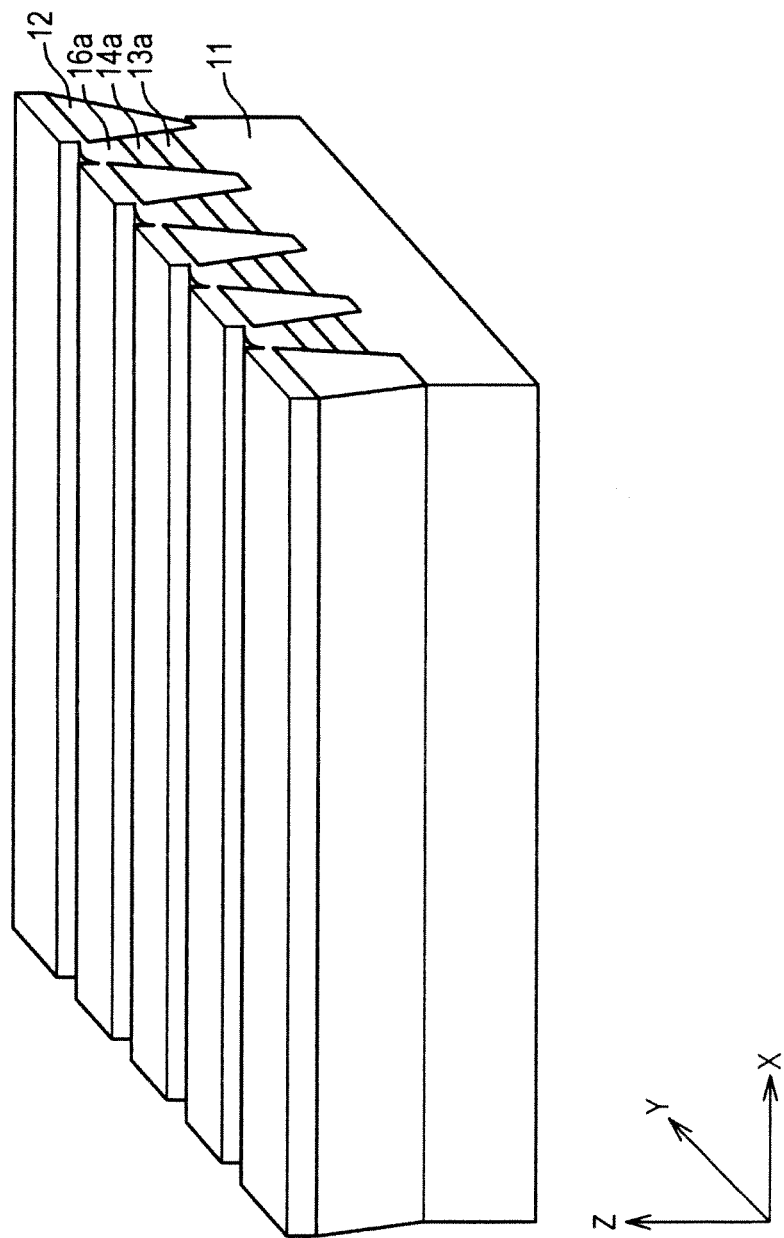

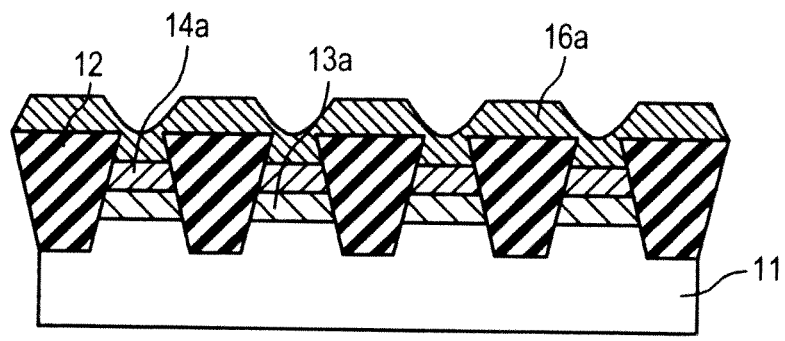
FIG. 7B
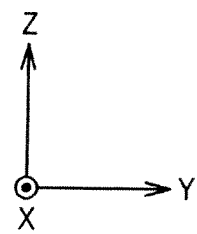
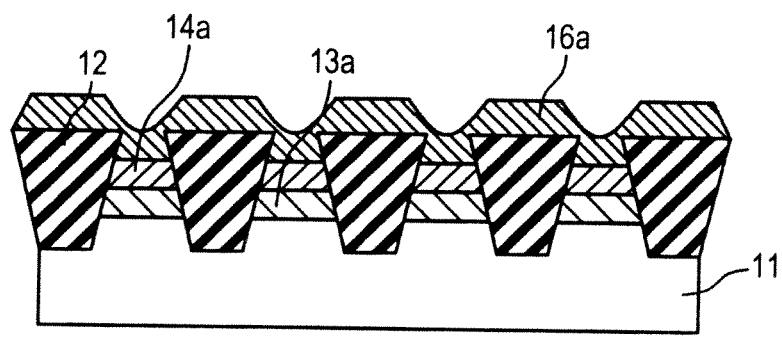
FIG. 7C
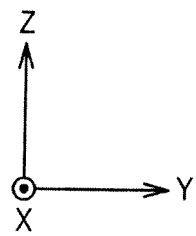

FIG. 8B
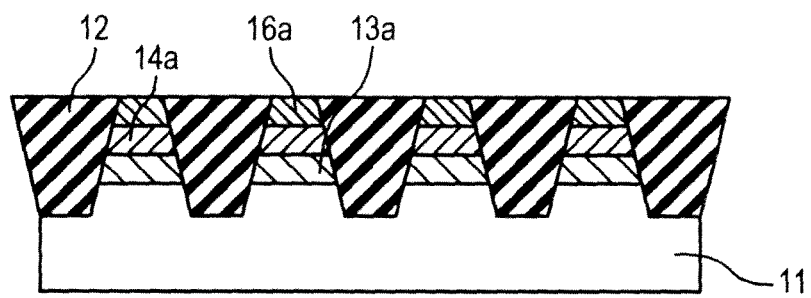
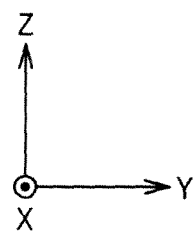
FIG. 8C
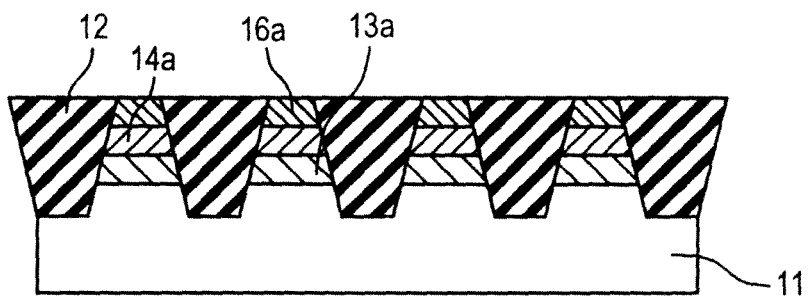
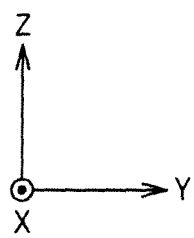

FIG. 8D
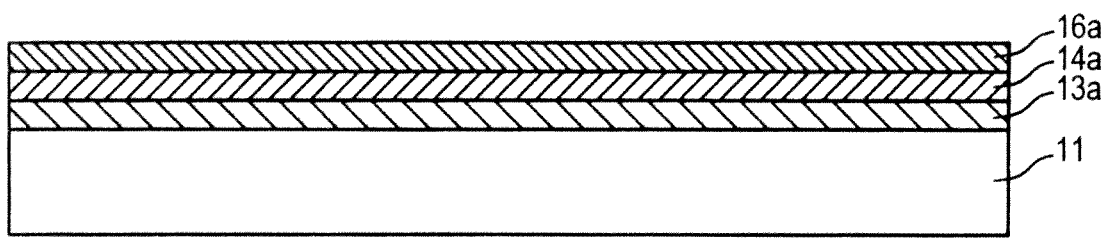
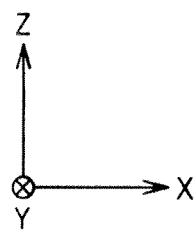
FIG. 8E
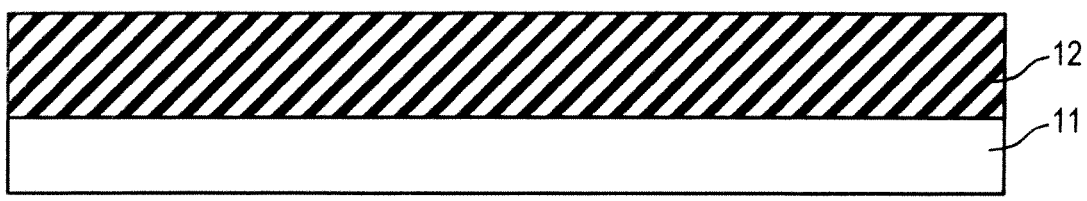
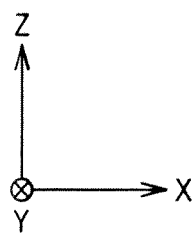

FIG. 9B
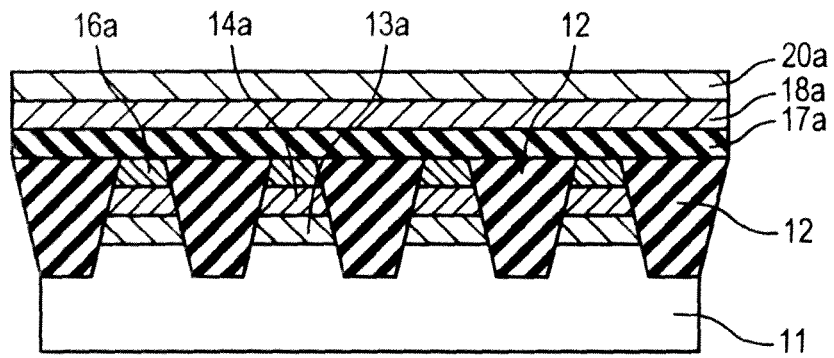
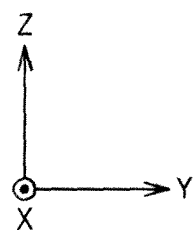
FIG. 9C
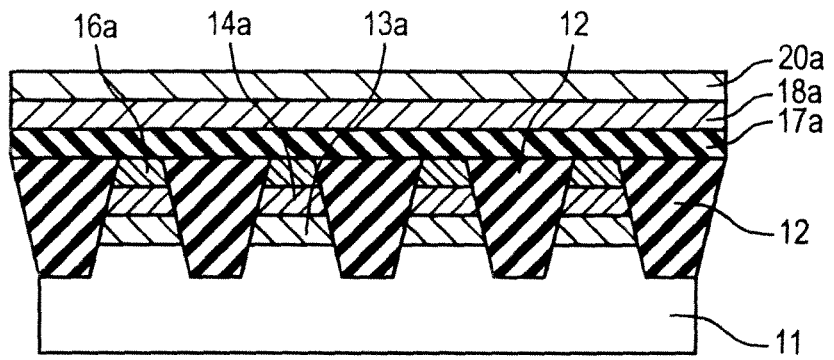
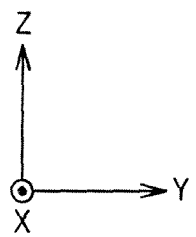

FIG. 9D
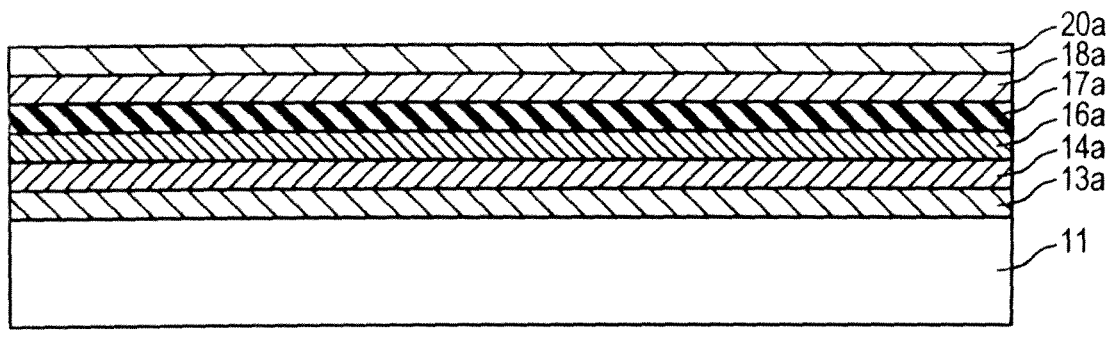
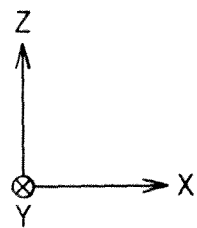
FIG. 9E
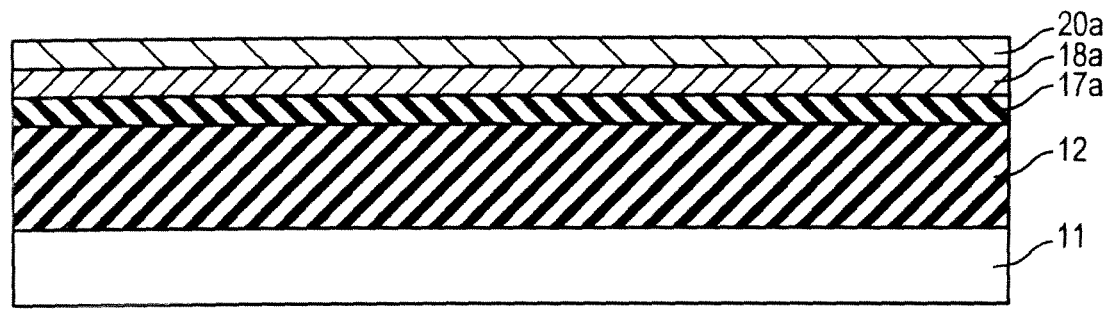
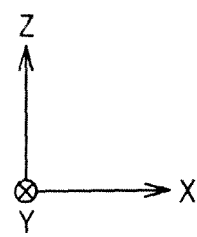

FIG. 10D
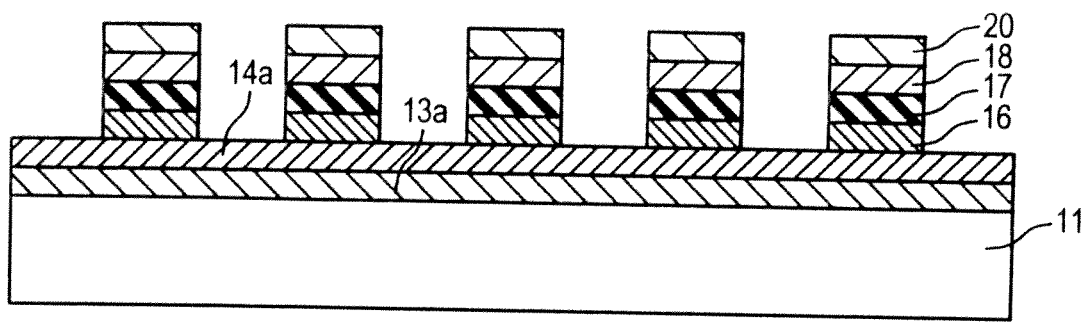
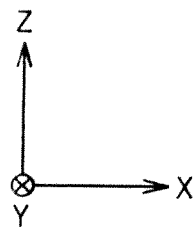
FIG. 10E
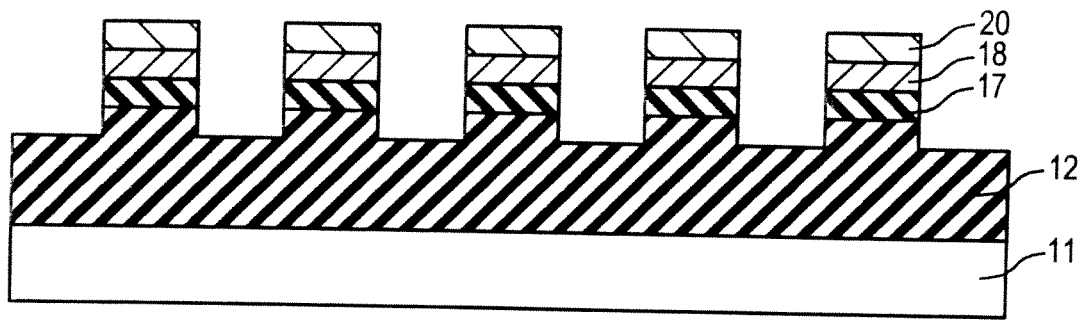
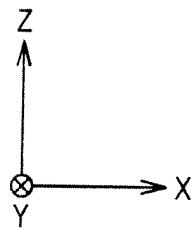

FIG. 11D
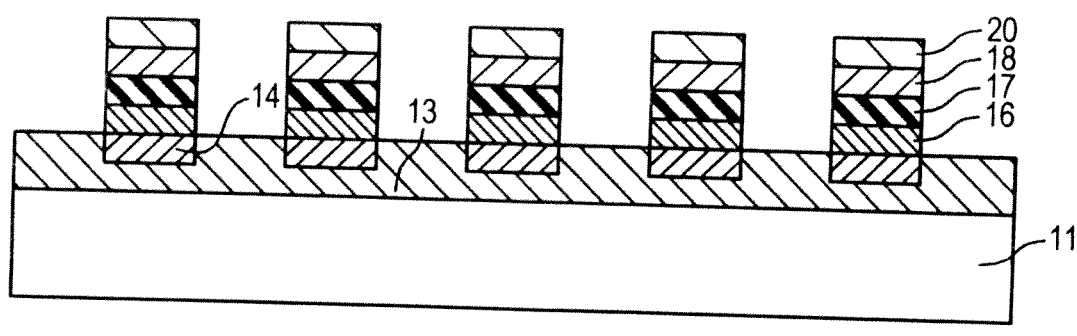
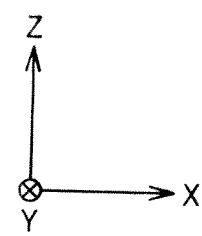
FIG. 11E
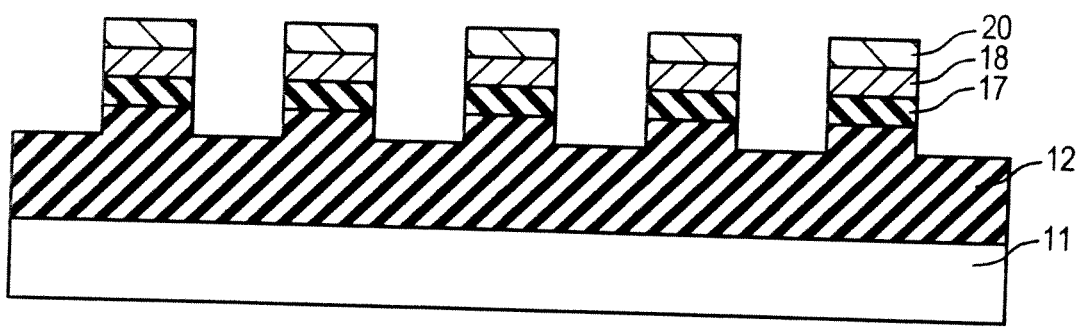
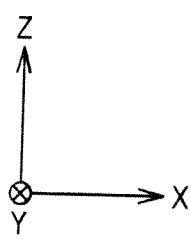

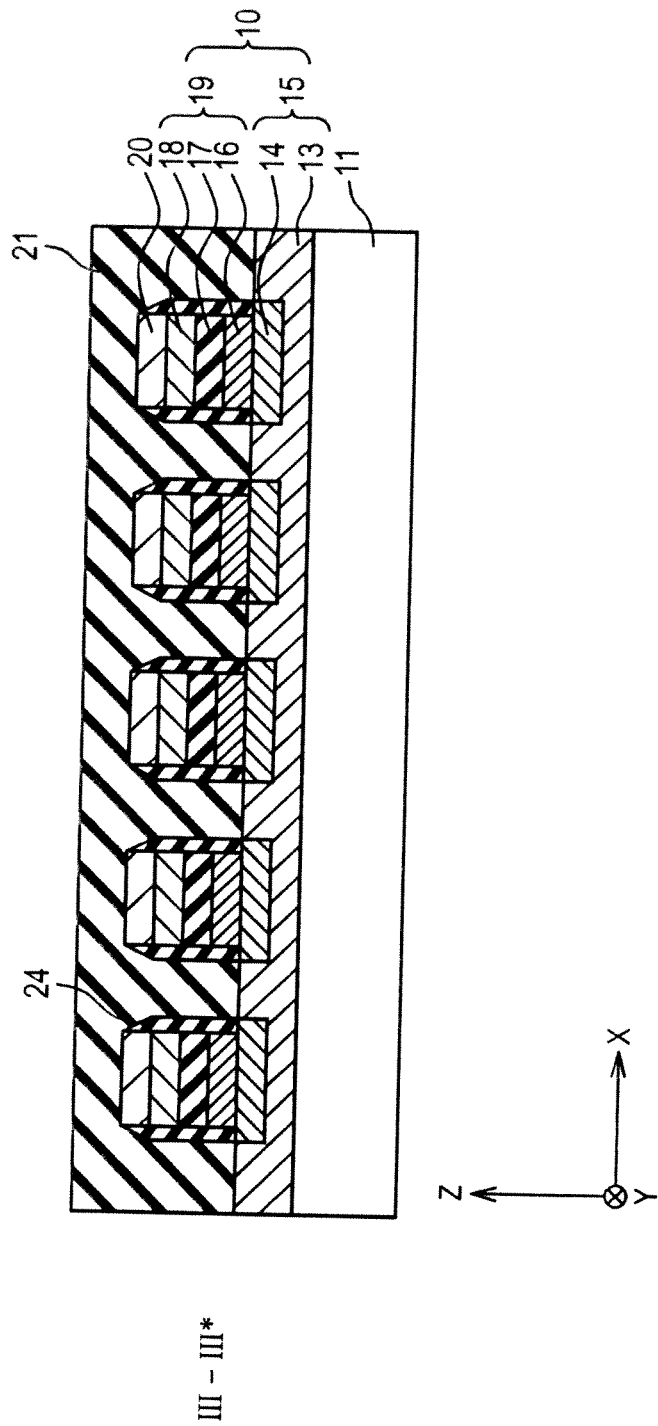

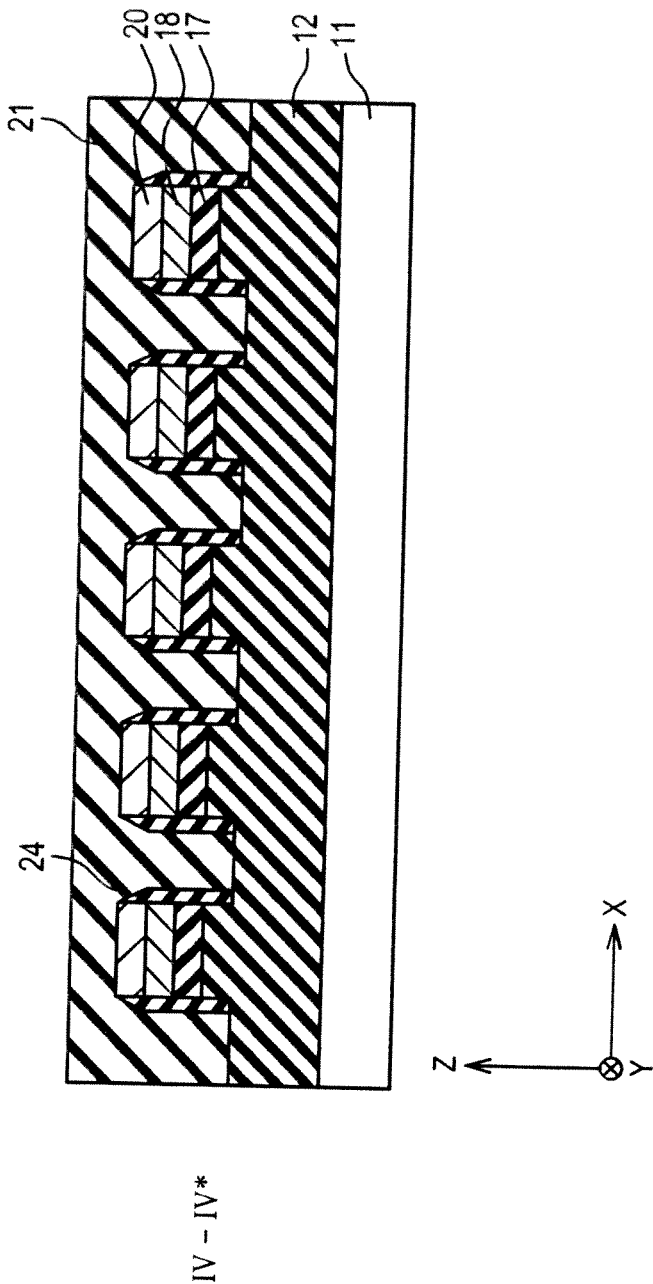

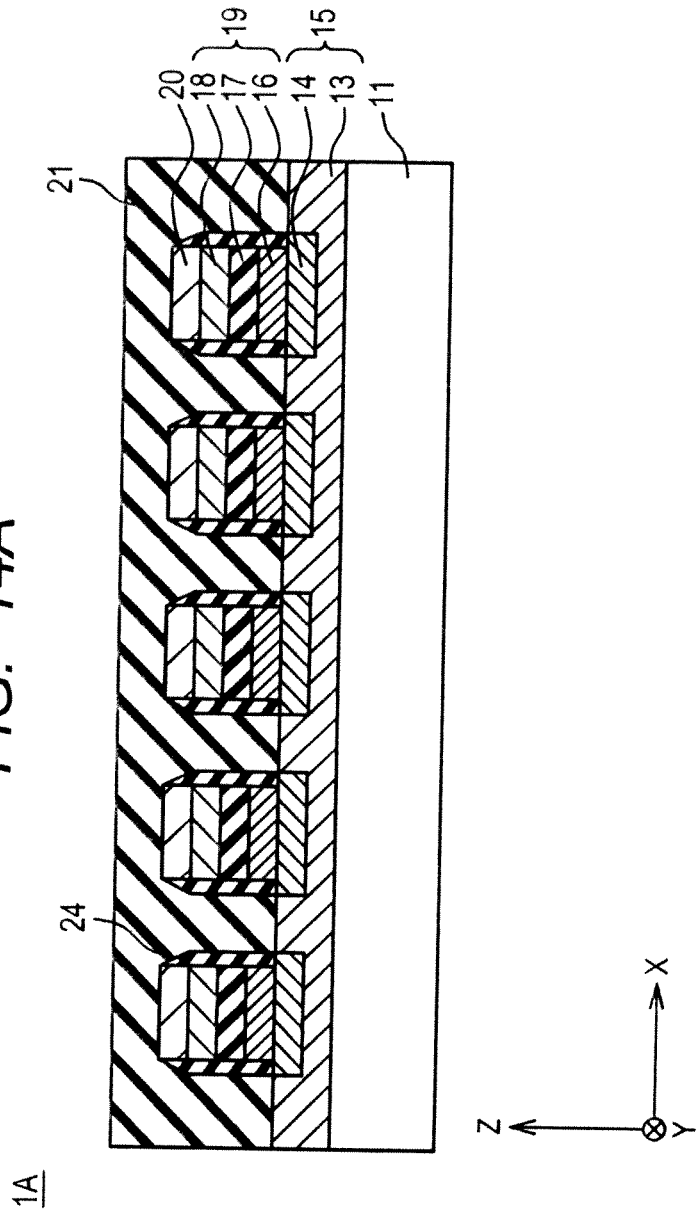

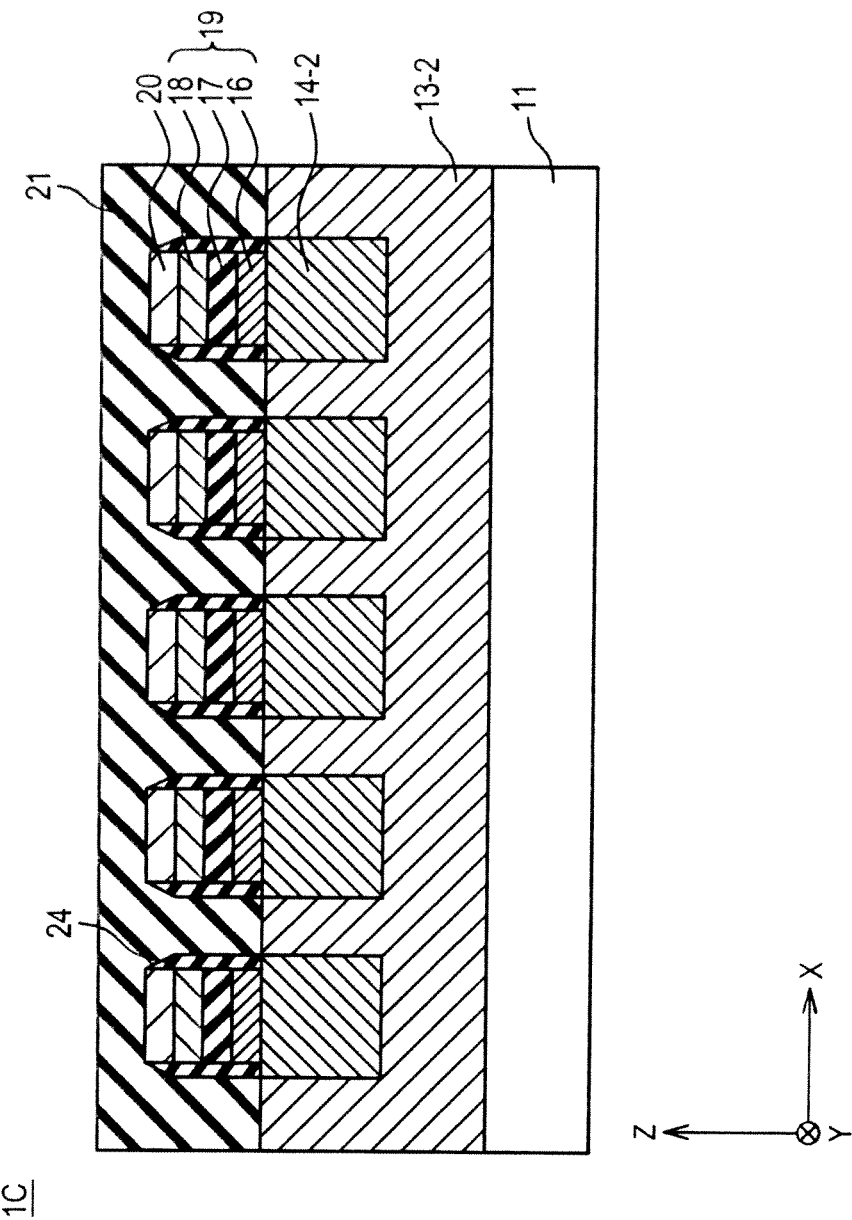

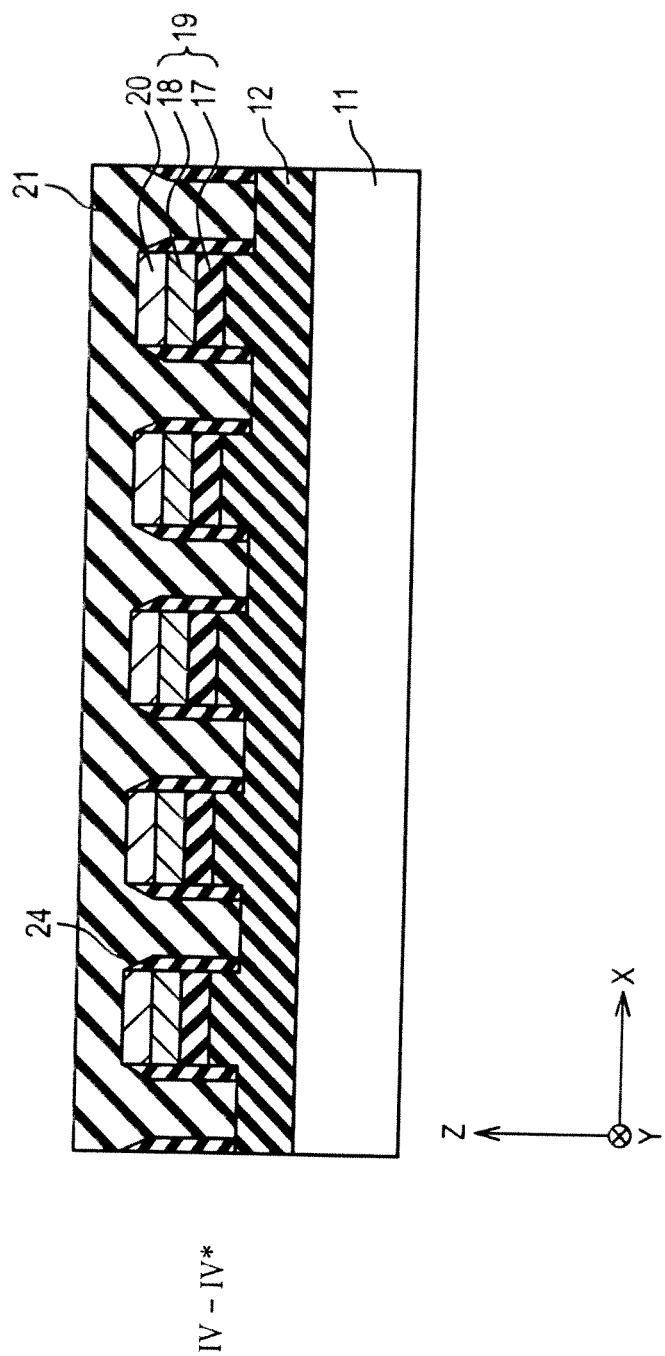

FIG. 18A
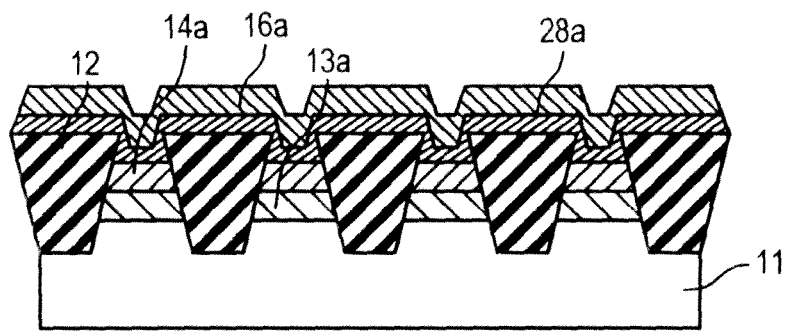
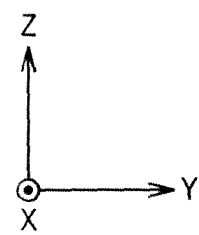
FIG. 18B
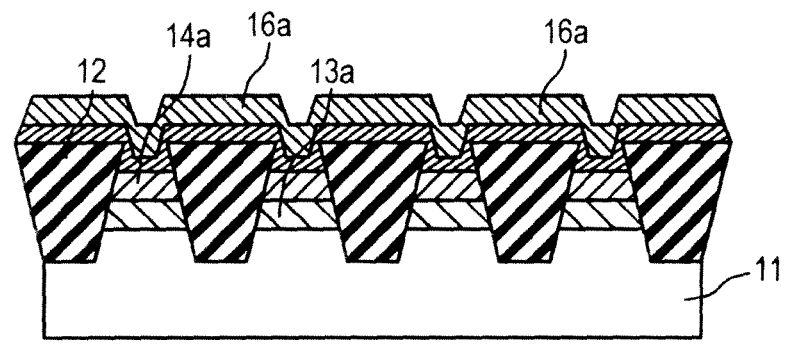
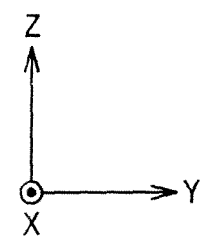

NONVOLATILE SEMICONDUCTOR STORAGE DEVICE AND A MANUFACTURING METHOD THEREOF

CROSS-REFERENCE TO RELATED APPLICATIONS

The disclosure of Japanese Patent Application No. 2011-127506 filed on Jun. 7, 2011 including the specification, drawings and abstract is incorporated herein by reference in its entirety.

BACKGROUND

The present invention relates to a nonvolatile semiconductor storage device, and a manufacturing method thereof. More particularly, it relates to a resistance change type nonvolatile semiconductor storage device, and a manufacturing method thereof.

In the field of a nonvolatile memory, active studies have been made on Flash Memory, FeRAM (Ferroelectric Random Access Memory), MRAM (Magnetic Random Access Memory), OUM (Ovonic Unified Memory), PRAM (Phase change Random Access Memory; Patent Document 1), and the like.

Recently, there has been proposed a resistance change type nonvolatile memory (ReRAM: Resistance Random Access Memory) different from the nonvolatile memories (Non-Patent Document 1). In the resistance change type nonvolatile memory, information is written by changing the resistance value of the resistance change part of the memory cell by application of a voltage pulse. The resistance change type nonvolatile memory is capable of nondestructive reading of written information. In addition, the resistance change type nonvolatile memory is small in element area, and is capable of value multiplexing. For this reason, the resistance change type nonvolatile memory is regarded promising as having a possibility surpassing those of existing nonvolatile memories.

In order to perform the resistance changing operation of the resistance change type nonvolatile memory with good reproduction, it is necessary to control the current and the voltage applied to the resistance change part (Non-Patent Document 5). Thus, there is proposed a structure in which one transistor and one resistance change part are coupled in series (1T1R structure) (Patent Document 3). With this structure, by controlling the resistance of the transistor with the gate voltage, it is possible to control the current and the voltage to be applied to the resistance change part.

On the other hand, in Patent Document 2 and Patent Document 3, cross-point type PRAM and MRAM are proposed, respectively. The cross-point type memory means, for example, in the case of PRAM, a memory array in which resistance change elements (1D1R structures) each including one diode and one resistance change part coupled in series therein are coupled to respective points of intersection between a plurality of X wires and a plurality of Y wires. By implementing such a 1D1R structure, it is possible to avoid the bypass current generated when the resistance change part is sandwiched between simple grid-like wires by the diode. Further, the transistor for controlling the current and the voltage to be applied to the resistance change element may be desirably formed at each end of the memory array. Therefore, the area of the memory cell may be smaller than that of the 1T1R structure.

ReRAMs include two types of a bipolar operation type and a unipolar operation type (Non-Patent Documents 1 and 2). The unipolar operation type is capable of a unipolar operation. Therefore, the unipolar operation type is advantageous for operating the memory cell of the cross-point type memory including a diode coupled in series therein. The resistance change mechanisms are largely classified into two of the electrochemical type and the filament type. The unipolar operation type is the phenomenon observed only in the filament type ReRAM.

[Patent Document 1]
Japanese Unexamined Patent Publication No. 2007-149170
[Patent Document 2]
Published Japanese translation of PCT application No. 2005-522045; US Patent No. 2008/0258129(A1)
[Patent Document 3]
U.S. Pat. No. 5,640,343
[Patent Document 4]
Japanese Unexamined Patent Publication No. 2010-067942; US Patent No. 2010/0038617(A1)
[Non-Patent Document 1]
W. W. Zhuang et al., "Novell Colossal Mangetoresistive Thin Film Nonvolatile Resistance Random Access Memory (RRAM)", Electron Devices Meeting, 2002. IEDM '02. Digest. International, pp. 193-196 (2002).
[Non-Patent Document 2]
Shima et al. "Resistance switching in the metal deficient-type oxides: NiO and CoO", Appl. Phys. Lett. 91, 012901 (2007).
[Non-Patent Document 3]
Tsunoda et al., "Low Power and High Speed Switching of Ti-doped NiO ReRAM under the Unipolar Voltage Source of less than 3V", Electron Devices Meeting, 2007. IEDM 2007. IEEE International, pp. 767-770 (2007).
[Non-Patent Document 4]
Y. Sakotsubo et al., "A New Approach for Improving Operating Margin of Unipolar ReRAM Using Local Minimum of Reset Voltage", 2010 Symposium on VLSI Technology Digest of Technical Papers, pp. 87-88 (2010).
[Non-Patent Document 5]
Y. Sasago et al., "Cross-point phase change memory with 4F2 cell size driven by low-contact-resistivity poly-Si diode", 2009 Symposium on VLSI Technology Digest of Technical Papers, pp. 24-25 (2009).
[Non-Patent Document 6]
J. H. Oh. et al., "Full Integration of Highly Manufacturable 512 Mb PRAM based on 90 nm Technology", Electron Devices Meeting, 2006. IEDM '06. International, pp. 1-4 (2006).

SUMMARY

As described above, in order to implement the cross-point type memory, it is necessary to avoid the bypass current generated when the resistance change part is sandwiched between simple grid-like wires. To this end, the memory cell is required to be configured in a 1D1R structure. In this case, the diode and the resistance change part are coupled in series. For this reason, the current flowing through the resistance change part becomes equal to the current flowing through the diode. Therefore, essential is a diode capable of passing a current required for the resistance change part to perform a resistance changing operation.

Further, when the memory cell of the cross-point type memory is formed, a material forming the diode and a resistance-changing material forming the resistance change part are successively stacked and formed. Then, these are patterned by reactive ion etching. This results in the formation of the memory cell of a vertical structure in which the diode and the resistance change part are stacked in the vertical direction. Such a self-alignment type structure is essential for implementing the high integration of the memory array, namely, for implementing the minimum unit cell area of $(2F)^2=4F^2$, where F represents the minimum processing dimension. However, in this case, miniaturization of the memory cell results in the miniaturization of the diode. This results in the reduction of the junction area in the diode. Accordingly, the current which can be passed through the diode is also reduced.

Further, when polysilicon is used for a diode, in order to ensure the reverse biased leakage resistance of the diode, it is necessary to use a diode having a large film thickness in view of the expansion of the depletion layer, or a diode having an i layer at the pn junction interface as with a pin structure (Non-Patent Document 5). However, when such a structure is used, further, the current which can be passed through the diode is reduced.

On the other hand, the current necessary for achieving a higher resistance of the unipolar operation type resistance change part suitable for the cross-point type memory is not reduced even when the memory cell is miniaturized (Non-Patent Document 2). This is due to the following fact: the low resistance state is equal to that of the very thin conductive filament formed in an insulation film (Non-Patent Document 2). This means that the resistance value of the low resistance state does not depend upon the element area unless the element area becomes as small as the cross-sectional area of the filament.

Thus, the resistance change part has a high scalability. However, the diode has a low scalability. Therefore, the advance of miniaturization of the cross-point type memory cell does not cause a trouble in the resistance change part at all. However, the decrease in element area of the diode may make it impossible for a sufficient current to be passed through the memory cell. Then, the resistance changing operation at the resistance change part does not occur, so that the memory cell ceases to function as a memory cell. Namely, the decrease in element area of the diode with miniaturization of the cross-point type memory cell unfavorably hinders the high integration of the memory array.

Some proposals have ever been made on a diode which is of a vertical type capable of high integration, and has a large ON current and a small OFF current. For example, in Non-Patent Document 6, there is shown a 1D1R type phase change type memory using a pn junction diode formed by selective epitaxial growth. However, a sufficient current cannot be passed therethrough as a high-reliability resistance change type memory use.

The shrinkage of the cell size also has a problem in alignment precision with a structure in which the resistance change part is sandwiched between grid-like wires. When the alignment is required two times, a margin in view of the alignment precision becomes necessary. As a result, the size of the memory cell becomes larger than $4F^2$. In order to implement the minimum unit cell of $4F^2$, it is essential that a memory cell is formed in a self-aligned manner between an X wire and a Y wire.

Below, the means for solving the problem will be described using the numbers and reference numerals and signs utilized in the Detailed Description. These numbers and reference numerals and signs are shown in parentheses in order to clarify the corresponding relation between the description in the appended claims and the Detailed Description. However, these numbers and reference numerals and signs must not be used for understanding the technical scope of the invention described in the appended claims.

A nonvolatile semiconductor storage device of the present invention includes a plurality of first wires (13) extending in a first direction, a plurality of second wires (20) extending in a second direction different from the first direction, and a plurality of memory cells (10) disposed at respective points of intersection of the first wires (13) and the second wires (20). Each of the memory cells (10) includes a diode (15) disposed over the first wire (13), and coupled to the first wire (13) at one end thereof, and a resistance change part (19) disposed over the diode (15), and coupled in series to the diode (15) at one end thereof, and coupled to the second wire (20) at the other end thereof, and for storing information through a change in resistance value. The diode (15) includes a first semiconductor layer (13) of a first conductivity type (n), and a second semiconductor layer (14) of a second conductivity type (p) different from the first conductivity type (n). The second semiconductor layer (14) extends into the inside of the first semiconductor layer (13).

A method for manufacturing a nonvolatile semiconductor storage device of the present invention manufactures the following nonvolatile semiconductor storage device. The nonvolatile semiconductor storage device has a plurality of first wires (13), a plurality of second wires (20), and a plurality of memory cells (10). The memory cell (10) includes a diode (15) and a resistance change part (19). The diode (15) includes a first semiconductor layer (13) of a first conductivity type, and a second semiconductor layer (14) of a second conductivity type. The resistance change part (1) includes a top electrode (18), a resistance change layer (17), and a bottom electrode (16). The first semiconductor layer (13) is included in the first wire (13). The second semiconductor layer (14) extends into the inside of the first semiconductor layer (13). The method for manufacturing a nonvolatile semiconductor storage device includes the steps of: forming a plurality of element isolation insulation layers (12) along a first direction in a semiconductor substrate (11); etching back the tops of a plurality of semiconductor regions (11p) between the element isolation insulation layers (12); ion-implanting each of the semiconductor regions relatively deeply with the first conductivity type (n) impurities, and relatively shallowly with the second conductivity type (p) impurities, and forming a first ion implantation layer (13a) and a second ion implantation layer (14a), respectively; forming a bottom electrode film (16a) in each of the semiconductor regions in such a manner as to fill the top thereof; depositing a resistance change layer film (17a), a top electrode film (18a), and a second wiring film (20a) in this order in such a manner as to cover the element isolation insulation layers (12) and the bottom electrode films (16a); etching the second wiring film (20a), the top electrode film (18a), the resistance change layer film (17a), and the bottom electrode films (16a) with the second ion implantation layers (14a) as an etching stopper so that a plurality of second wires (20) extend in a second direction different from the first direction, and forming the second wires (20), the top electrode (18), the resistance change layer (17), and the bottom electrode (16); and ion-implanting an exposed portion of the second ion implantation layer (14a) with the first conductivity type impurities, and setting the remaining portion of the second ion implantation layer (14a) as the second semiconductor layer (14), and thereby setting the ion-implanted portion of the second ion implantation layer (14a) and the first ion implantation layer (13a) as the first wire (13) including the first semiconductor layer (13).

In accordance with the present invention, it is possible to obtain a resistance change type nonvolatile semiconductor storage device including a diode capable of passing a sufficient current for the resistance changing operation even when the memory cell is miniaturized. It is possible to implement a resistance change type nonvolatile semiconductor storage device having a high-integration cross-point type structure.

BRIEF DESCRIPTION OF THE DRAWINGS

FIG. 2A is a plan view of a configuration example of the nonvolatile semiconductor storage device in accordance with the first embodiment of the present invention;

FIG. 2E is a cross-sectional view along IV-IV* in FIG. 2A;

FIG. 4A is a perspective view schematically showing a method for manufacturing the nonvolatile semiconductor storage device in accordance with the first embodiment of the present invention;

FIG. 5A is a perspective view schematically showing a method for manufacturing the nonvolatile semiconductor storage device in accordance with the first embodiment of the present invention;

FIG. 6B is a cross-sectional view along I-I* in FIG. 6A;
FIG. 6C is a cross-sectional view along II-II* in FIG. 6A.

FIG. 7A is a perspective view schematically showing a method for manufacturing the nonvolatile semiconductor storage device in accordance with the first embodiment of the present invention;

FIG. 7B is a cross-sectional view along I-I* in FIG. 7A;
FIG. 7C is a cross-sectional view along II-II* in FIG. 7A.

FIG. 8B is a cross-sectional view along I-I* in FIG. 8A;
FIG. 8C is a cross-sectional view along II-II* in FIG. 8A;
FIG. 8D is a cross-sectional view along III-III* in FIG. 8A;
FIG. 8E is a cross-sectional view along IV-IV* in FIG. 8A;

FIG. 9B is a cross-sectional view along I-I* in FIG. 9A;
FIG. 9C is a cross-sectional view along II-II* in FIG. 9A;
FIG. 9D is a cross-sectional view along IV-IV* in FIG. 9A;
FIG. 9E is a cross-sectional view along IV-IV* in FIG. 9A;

FIG. 10D is a cross-sectional view along III-III* in FIG. 10A;
FIG. 10E is a cross-sectional view along IV-IV* in FIG. 10A;

FIG. 11D is a cross-sectional view along III-III* in FIG. 11A;
FIG. 11E is a cross-sectional view along IV-IV* in FIG. 11A;

FIG. 13A is a cross-sectional view along III-III* in FIG. 12;
FIG. 13B is a cross-sectional view along IV-IV* in FIG. 12;
FIG. 14A is a cross-sectional view along III-III* of the nonvolatile semiconductor storage device in the second embodiment;

FIG. 14C is a cross-sectional view along III-III* of a nonvolatile semiconductor storage device of a second modified example in the second embodiment;

FIG. 16B is a cross-sectional view along IV-IV* in FIG. 15.

FIG. 18A is a cross-sectional view along I-I* in the method for manufacturing the nonvolatile semiconductor storage device in accordance with the fourth embodiment;

FIG. 18B is a cross-sectional view along II-II* in the method for manufacturing the nonvolatile semiconductor storage device in accordance with the fourth embodiment;

DETAILED DESCRIPTION

Below, a nonvolatile semiconductor storage device and a manufacturing method thereof of the present invention will be described by way of embodiments by reference to the accompanying drawings.

First Embodiment

Figure 1:
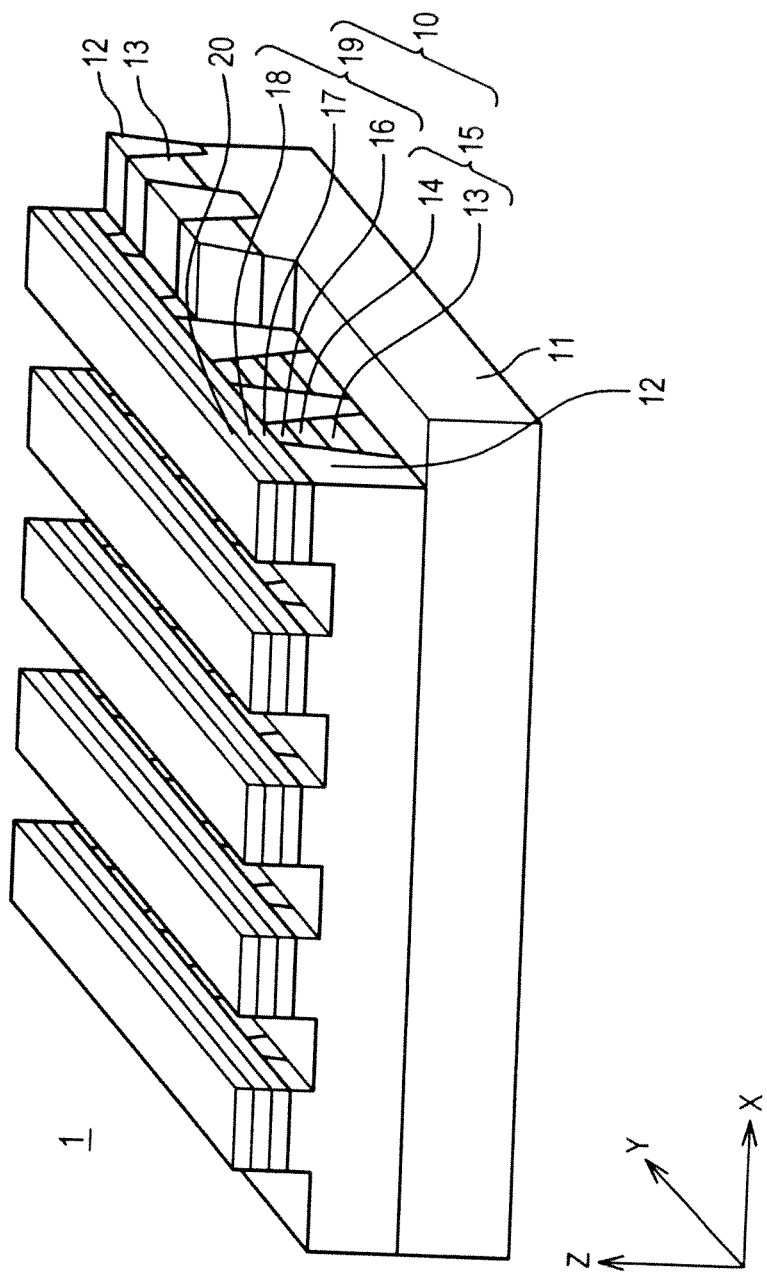
FIG. 1 is a perspective view schematically showing a configuration example of a nonvolatile semiconductor storage device in accordance with a first embodiment of the present invention.

A description will be given to a nonvolatile semiconductor storage device in accordance with a first embodiment of the present invention. FIG. 1 is a perspective view schematically showing the nonvolatile semiconductor storage device in accordance with the first embodiment of the present invention. A nonvolatile semiconductor storage device 1 is a resistance change type nonvolatile memory (ReRAM), and has a plurality of bit lines 13, a plurality of word lines 20, and a plurality of memory cells 10. Incidentally, in this figure, a circuit for supplying and applying a current and a voltage is not shown (the same applies hereinafter).

A plurality of the bit lines (first wires) 13 extend in parallel with one another in the X direction. A plurality of the bit lines 13 are buried in a substrate 11. A plurality of word lines (second wires) 20 extend in parallel with one another in the Y direction perpendicular to the X direction. A plurality of memory cells 10 are disposed at respective points of intersection between a plurality of the bit lines 13 and a plurality of the word lines 20, respectively. Each memory cell 10 is coupled to the bit line 13 at one end thereof, and coupled to the word line 20 at the other end thereof, respectively. The memory cell 10 has a diode 15 and a resistance change part 19 series-coupled to each other. Namely, it is in a 1D1R structure.

The diode 15 has a rectifying function, is disposed over the bit line 13, and includes a first semiconductor layer 13 and a second semiconductor layer 14. The first semiconductor layer 13 is formed in contact with the bit line 13. The second semiconductor layer 14 is buried in the inside of the first semiconductor layer 13, and formed in contact with the resistance change part 19. One of the first semiconductor layer 13 and the second semiconductor layer 14 is an anode, and the other is a cathode.

The resistance change part 19 stores information by a change in resistance value, is disposed over the diode 15, and includes a top electrode 18, a bottom electrode 16, and a resistance change layer 17. The top electrode 18 is coupled with the word line 20. The bottom electrode 16 is coupled with the diode 15. The resistance change layer 17 is disposed between the top electrode 18 and the bottom electrode 16, and is changed in resistance value by the voltage (current) applied to both the electrodes. The bottom electrode 16, the resistance change layer 17, the top electrode 18, and the word line 20 are stacked in this order.

Then, a description will be given to the details of the nonvolatile semiconductor storage device 1. FIG. 2A is a plan view of a configuration example of the nonvolatile semiconductor storage device in accordance with the first embodiment of the present invention (FIG. 1A). The memory cell 10 is a region shown by a broken line. The widths of the region in the X direction and the Y direction are each 2F, where F represents the minimum processing dimension of either width of the word line 20 and the bit line 13. Namely, the area of the memory cell 10 is: $(2F)^2=4F^2$, and the minimum unit cell area. Thus, the memory cell 10 has a 1D1R structure, which enables the minimum unit cell area.

Figure 2B:
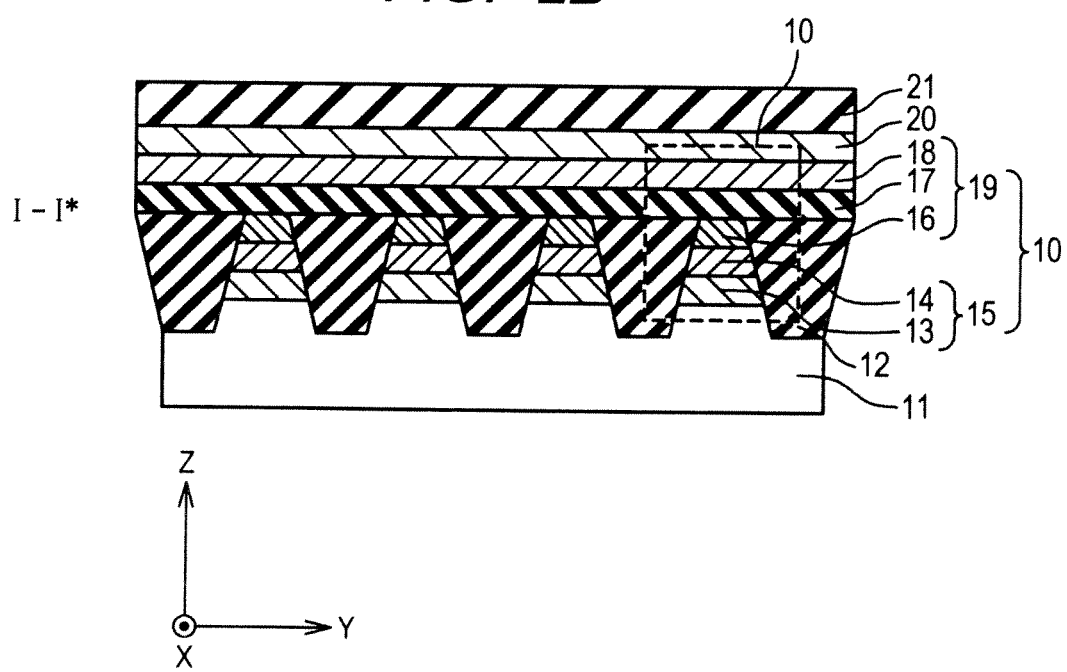
FIG. 2B is a cross-sectional view along I-I* in FIG. 2A.

FIGS. 2B to 2E are a cross-sectional view along I-I*, a cross-sectional view along II-II*, a cross-sectional view along III-III*, and a cross-sectional view along IV-IV* in FIG. 2A, respectively. However, the I-I* cross section is a yz cross section including the word line 20. The II-II* cross section is a yz cross section not including the word line 20. The cross section along III-III* is an xz cross section including the bit line 13. The IV-IV* cross section is a xz cross section not including the bit line 13.

The substrate 11 is a second conductivity type semiconductor substrate, and is exemplified by a p type Si (silicon) substrate. The substrate 11 includes a plurality of element isolation insulation layers 12 (Shallow Trench Insulator; STI). A plurality of the element isolation insulation layers 12 extend in parallel with one another in the X direction. However, the bottom surface (−z-side surface) of the element isolation insulation layer 12 is flat. On the other hand, the top surface (+z-side surface) of the element isolation insulation layer 12 is partially removed at the top thereof, and is reduced in thickness (FIG. 2C) at portions except for immediately under the word line 20 (FIG. 2B). Namely, the element isolation insulation layer 12 alternates between small film thickness portions and large film thickness portions corresponding to the period of the arrangement of the word lines 20 (FIG. 2E). The element isolation insulation layer is exemplified by SiO$_2$ (silicon oxide). In the Y direction, a plurality of the bit lines 13 are isolated by a plurality of the element isolation insulation layers 12.

Figure 2C:
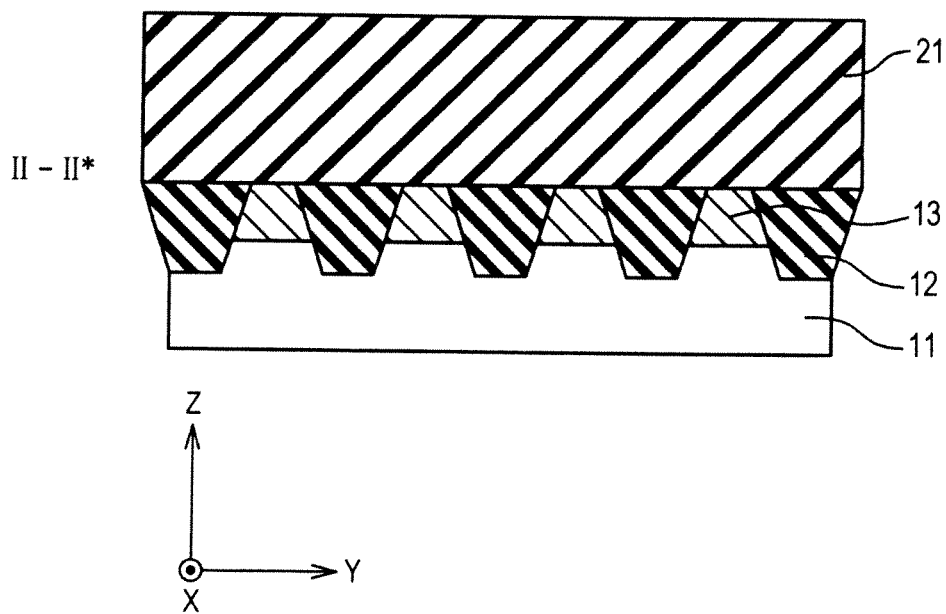
FIG. 2C is a cross-sectional view along II-II* in FIG. 2A.
Figure 2D:
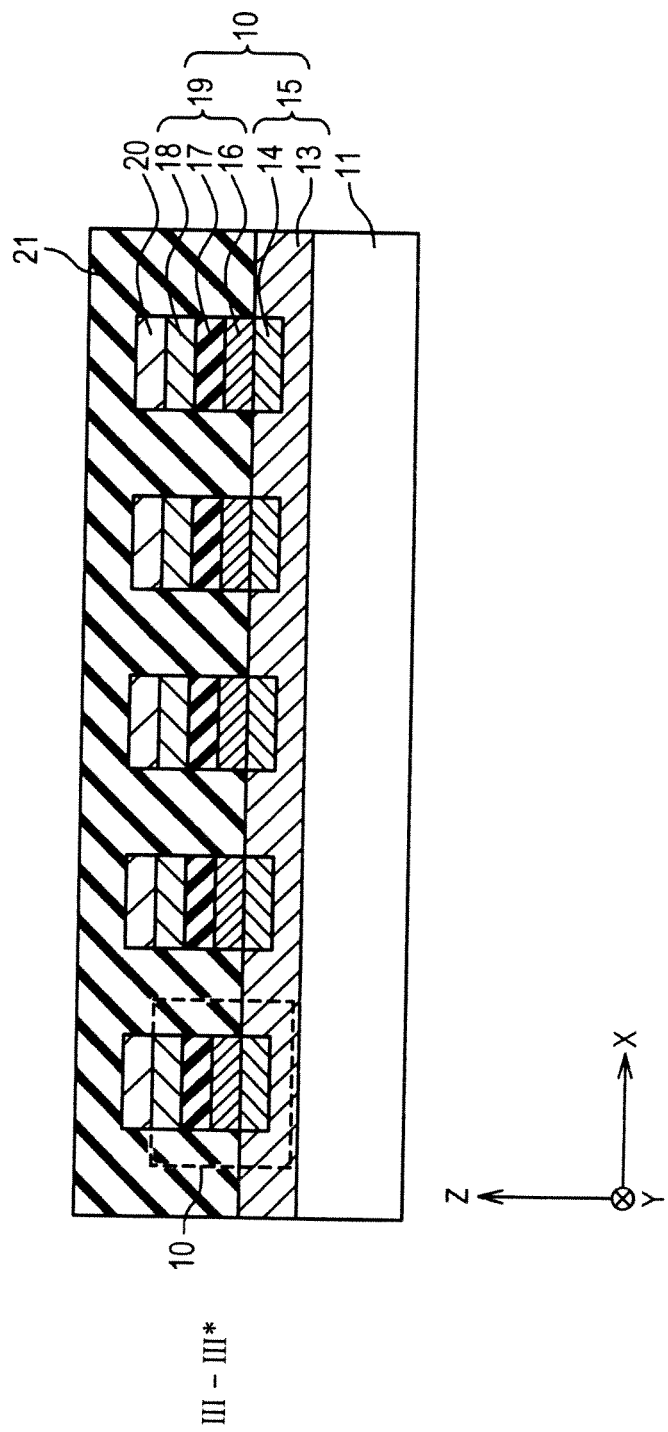
FIG. 2D is a cross-sectional view along III-III* in FIG. 2A.
Figure 3A:
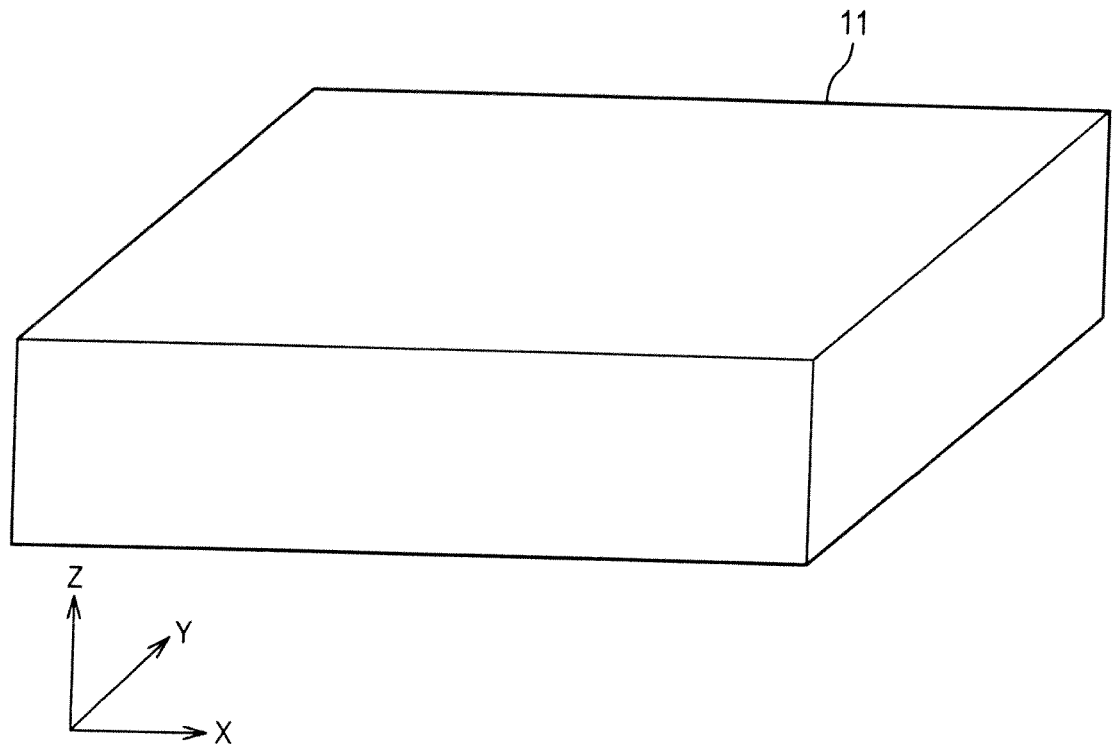
FIG. 3A is a perspective view schematically showing a method for manufacturing the nonvolatile semiconductor storage device in accordance with the first embodiment of the present invention.
Figure 3B:
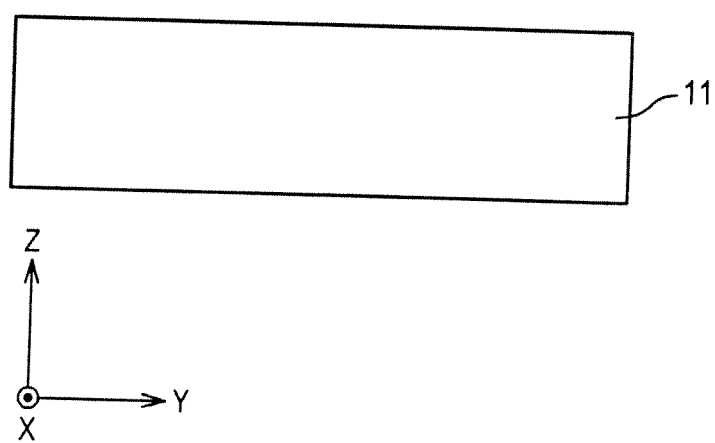
FIG. 3B is a cross-sectional view along I-I* in FIG. 3A.
Figure 3C:
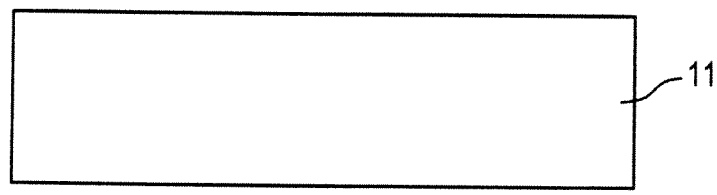
FIG. 3C is a cross-sectional view along II-II* in FIG. 3A.
Figure 3D:
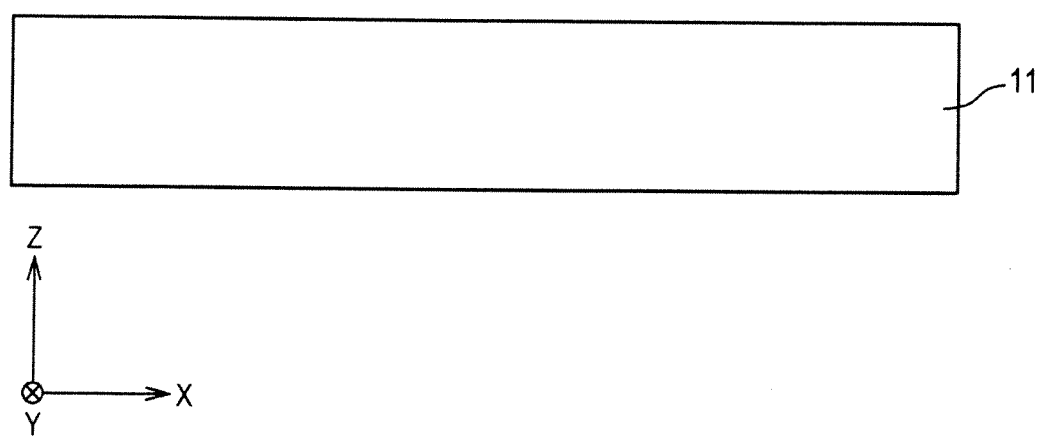
FIG. 3D is a cross-sectional view along III-III* in FIG. 3A.
Figure 3E:
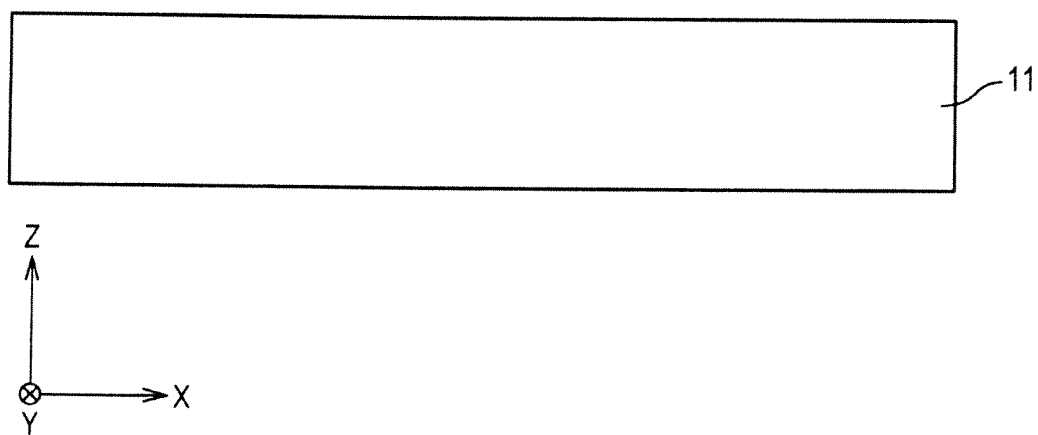
FIG. 3E is a cross-sectional view along IV-IV* in FIG. 3A.
Figure 4B:
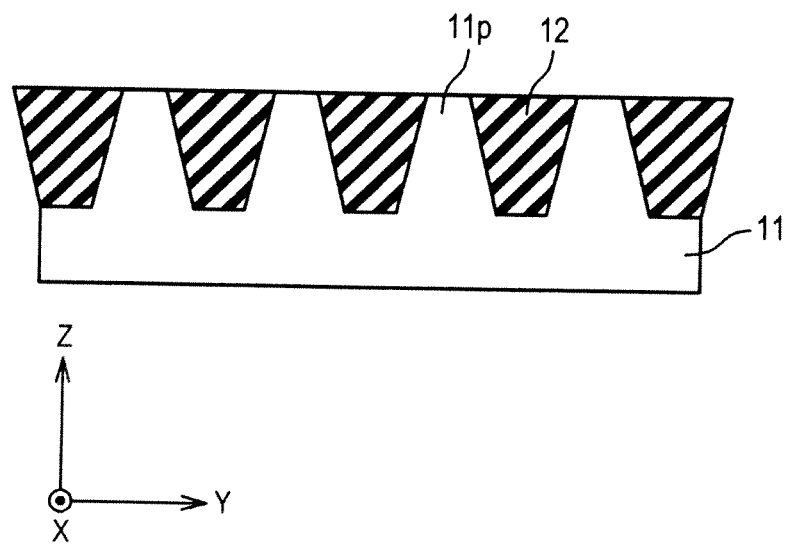
FIG. 4B is a cross-sectional view along I-I* in FIG. 4A.
Figure 4C:
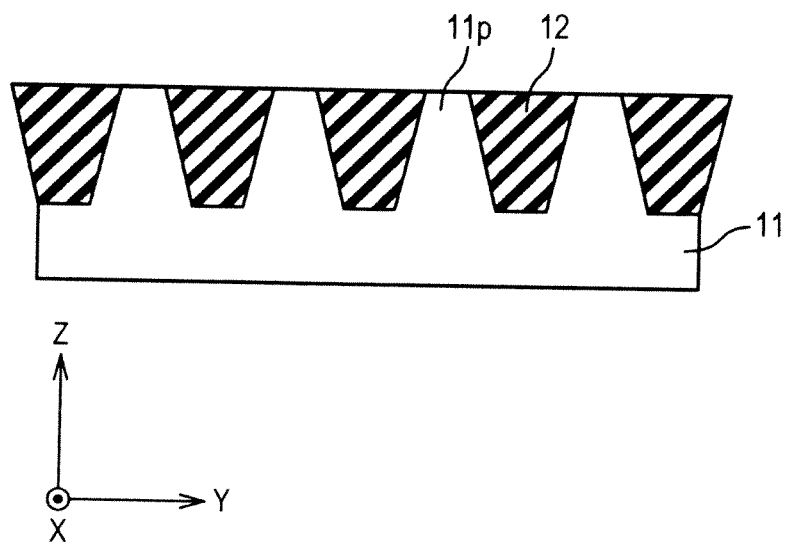
FIG. 4C is a cross-sectional view along II-II* in FIG. 4A.
Figure 4D:
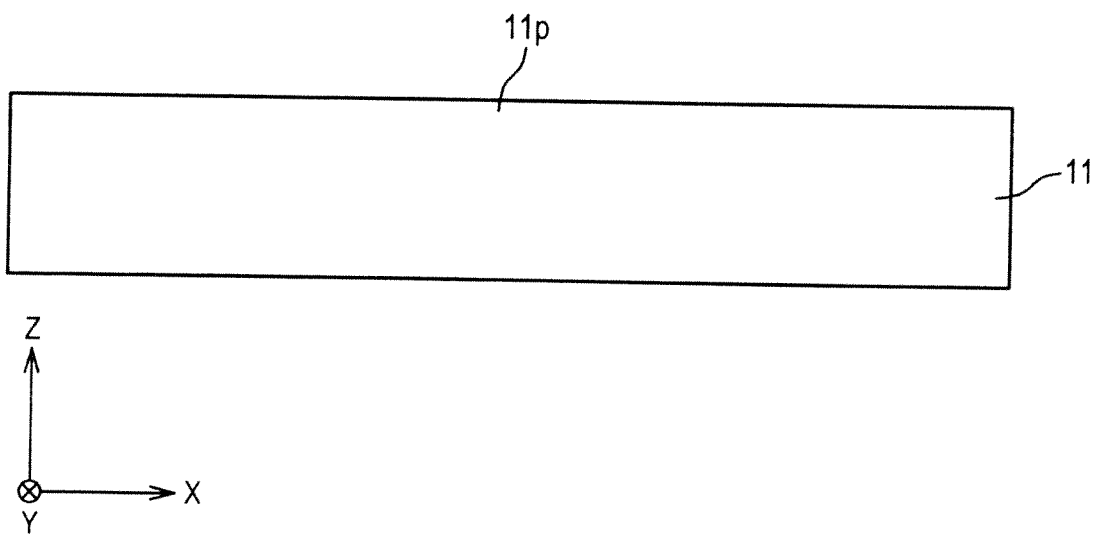
FIG. 4D is a cross-sectional view along III-III* in FIG. 4A.
Figure 4E:
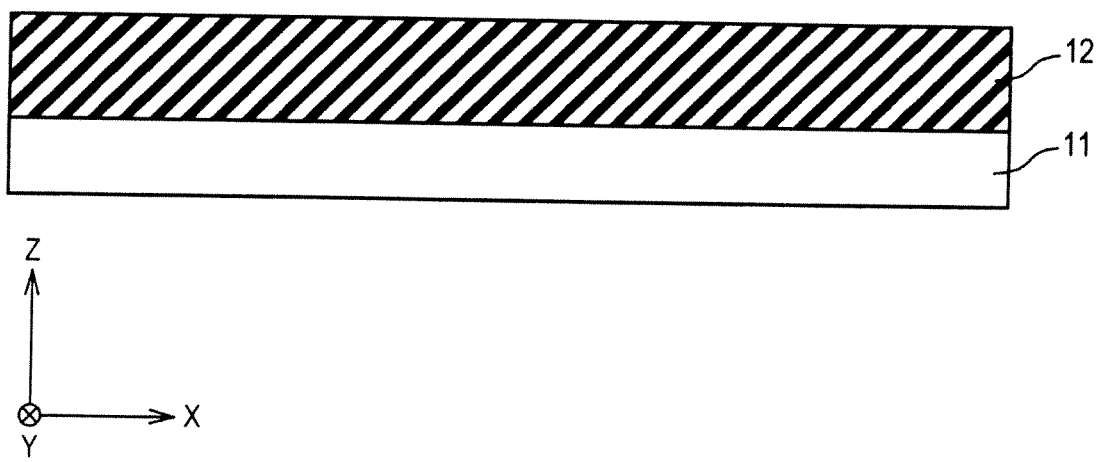
FIG. 4E is a cross-sectional view along IV-IV* in FIG. 4A.
Figure 5B:
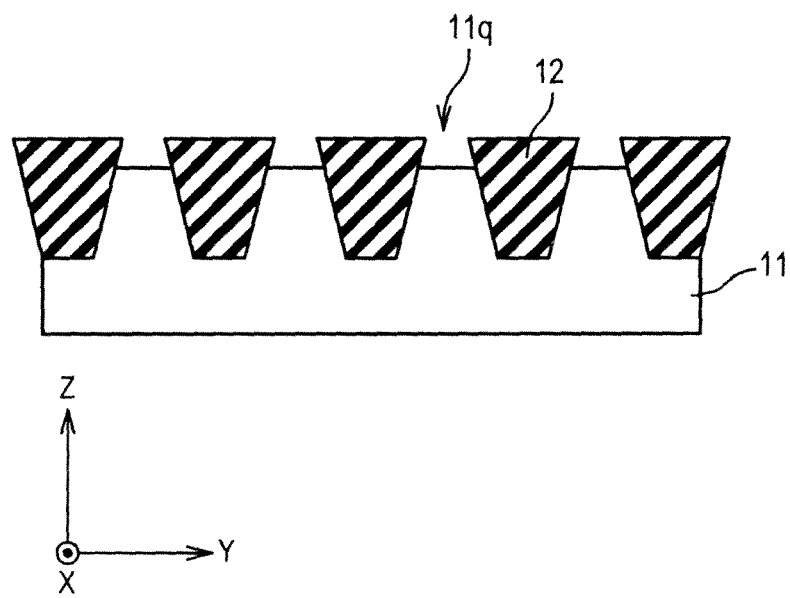
FIG. 5B is a cross-sectional view along I-I* in FIG. 5A.
Figure 5C:
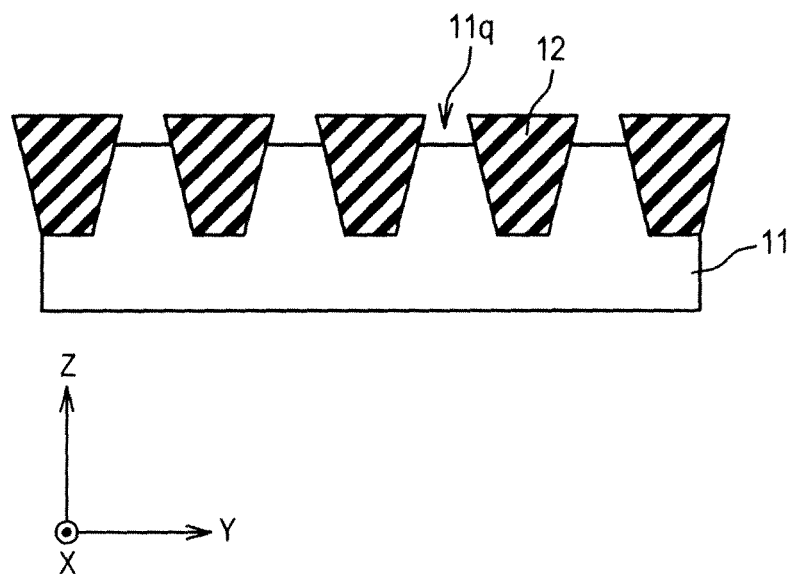
FIG. 5C is a cross-sectional view along II-II* in FIG. 5A.
Figure 5D:
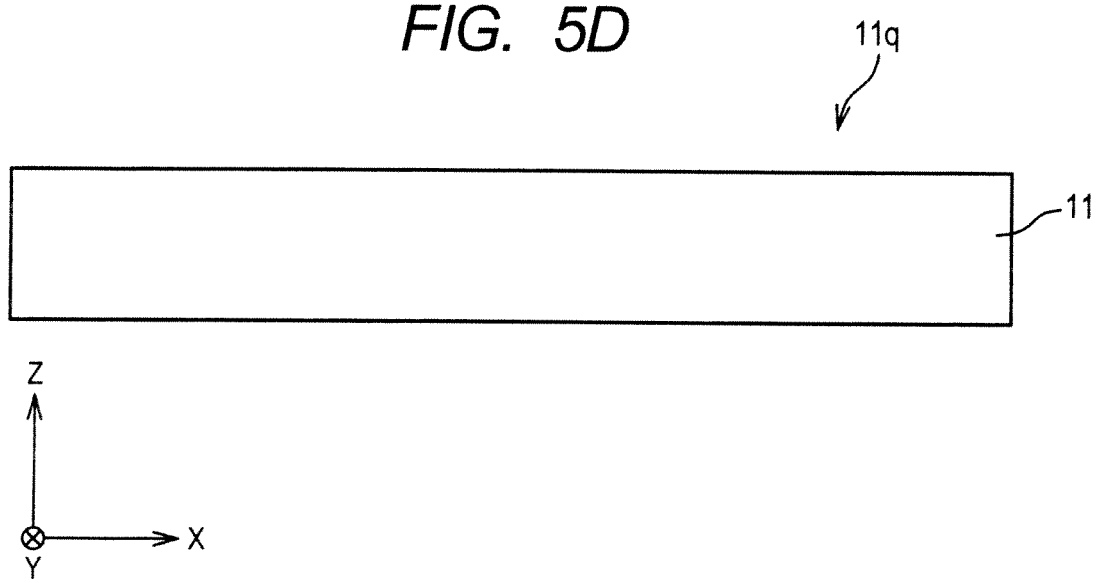
FIG. 5D is a cross-sectional view along III-III* in FIG. 5A.
Figure 5E:
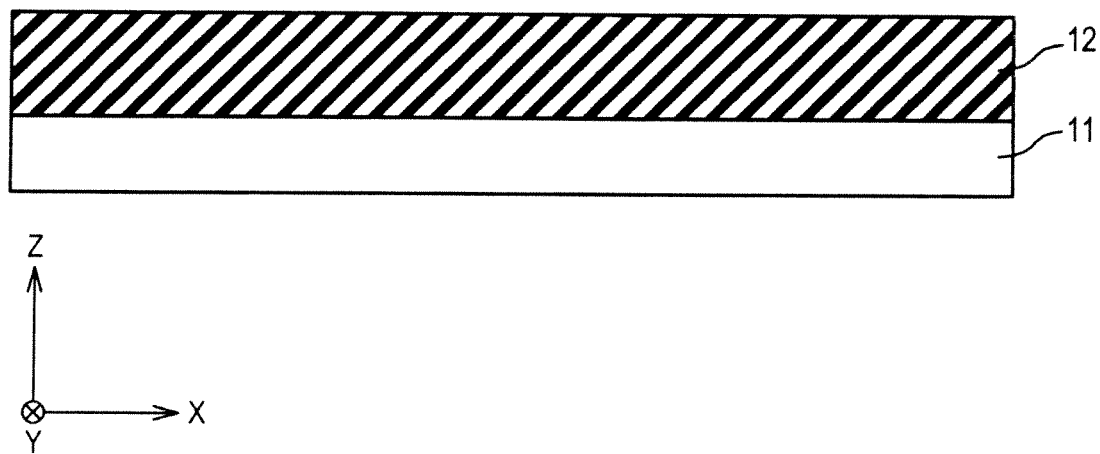
FIG. 5E is a cross-sectional view along IV-IV* in FIG. 5A.
Figure 6A:
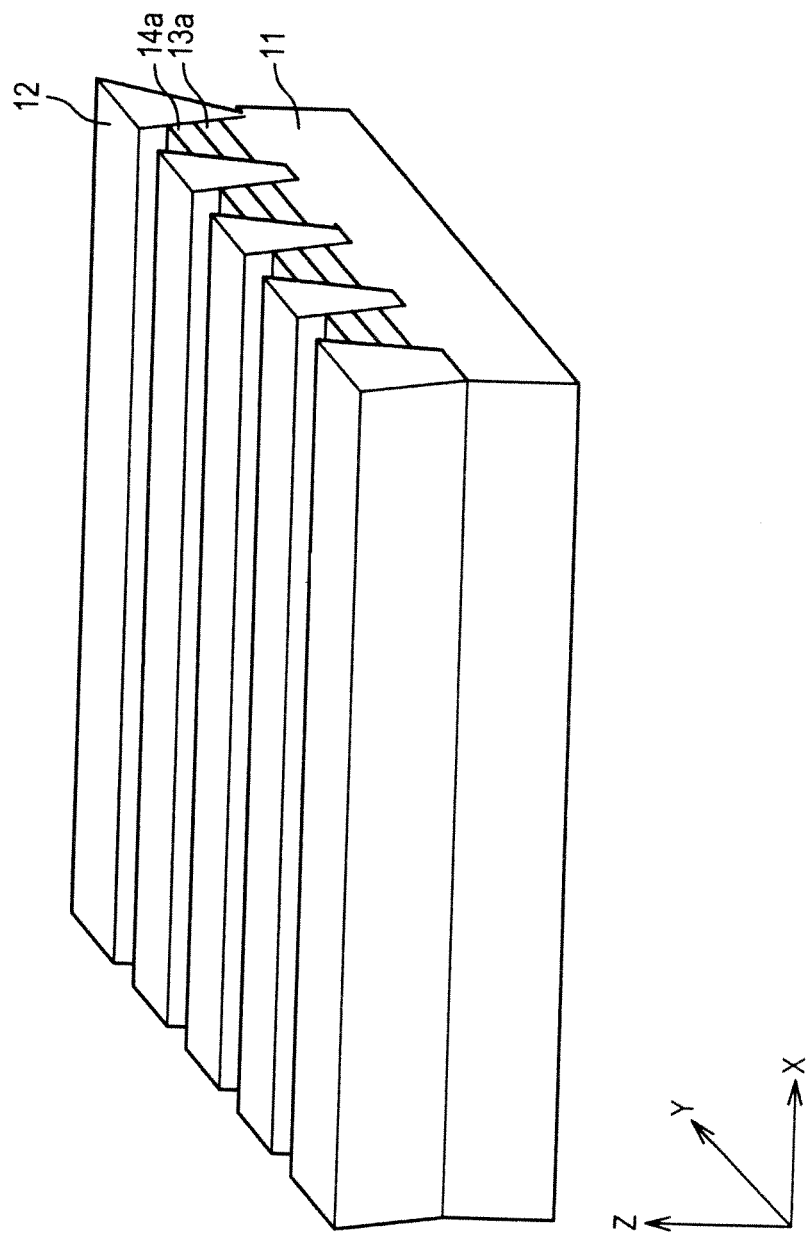
FIG. 6A is a perspective view schematically showing a method for manufacturing the nonvolatile semiconductor storage device in accordance with the first embodiment of the present invention.
Figure 6D:
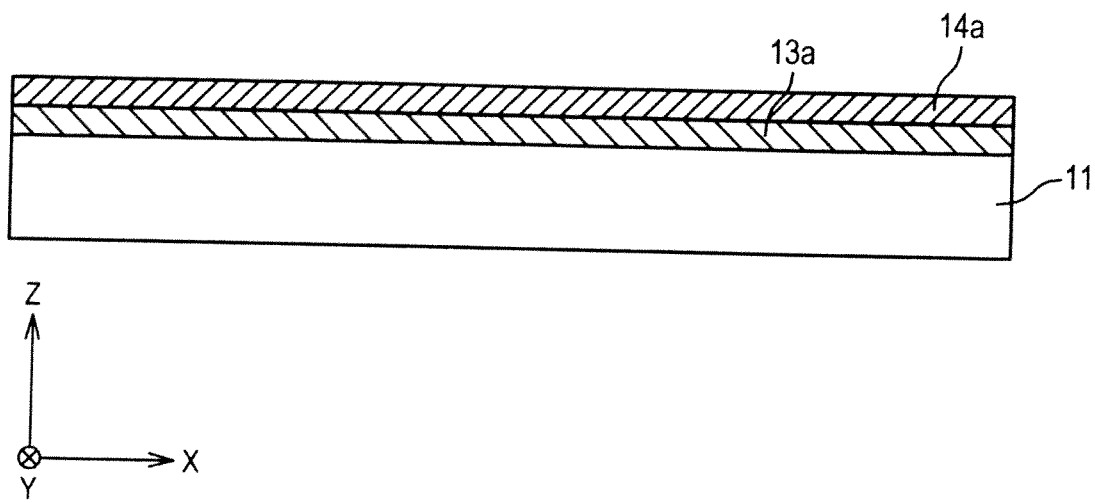
FIG. 6D is a cross-sectional view along III-III* in FIG. 6A.
Figure 6E:
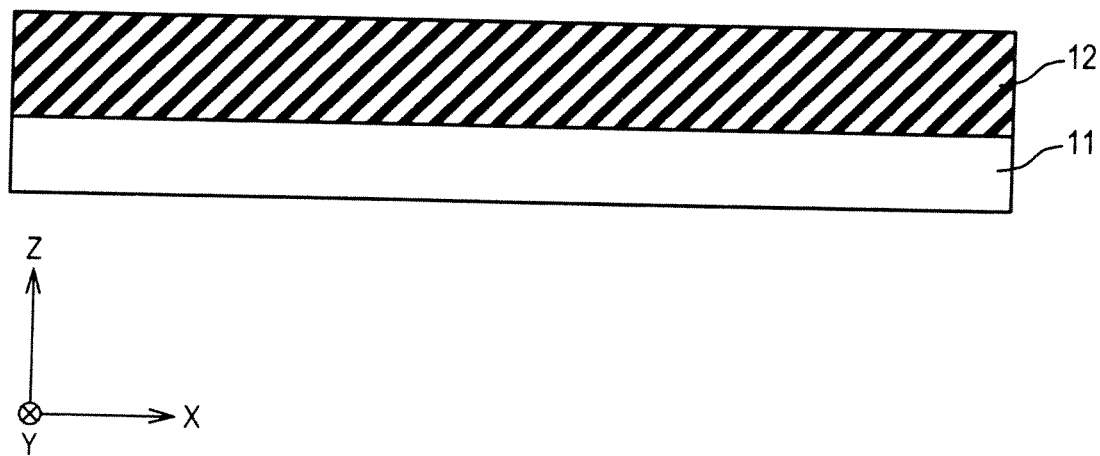
FIG. 6E is a cross-sectional view along IV-IV* in FIG. 6A.
Figure 7D:
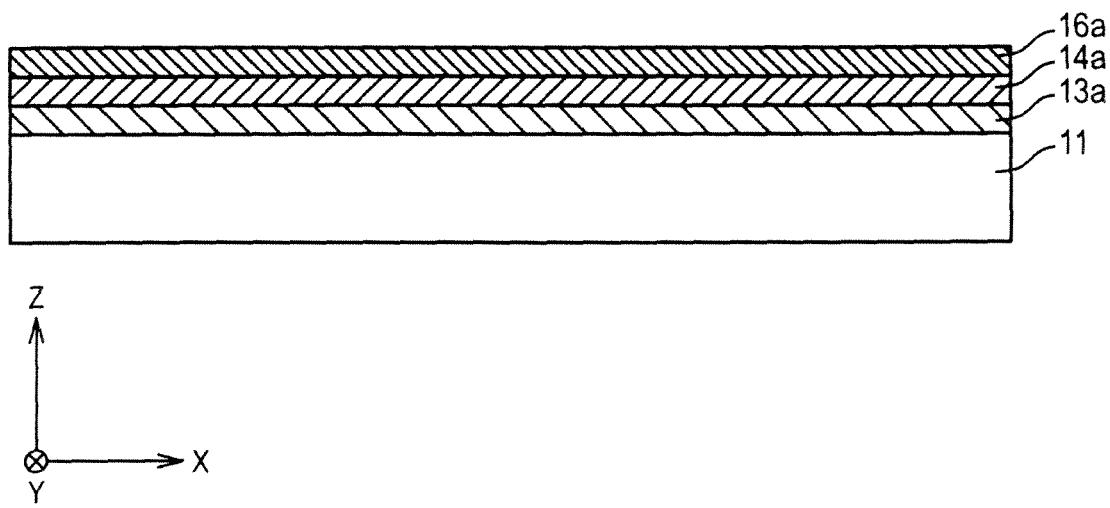
FIG. 7D is a cross-sectional view along III-III* in FIG. 7A.
Figure 7E:
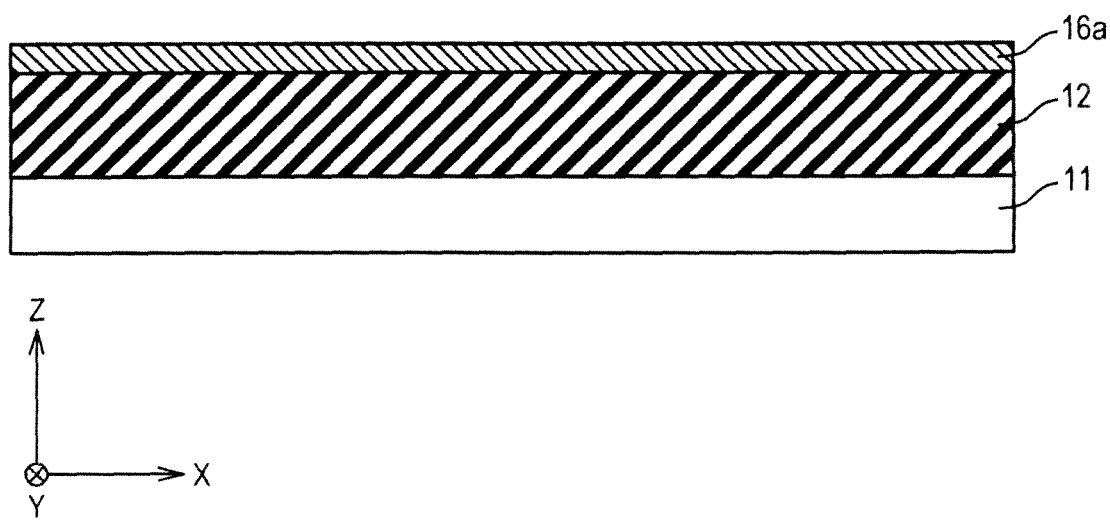
FIG. 7E is a cross-sectional view along IV-IV* in FIG. 7A.
Figure 8A:
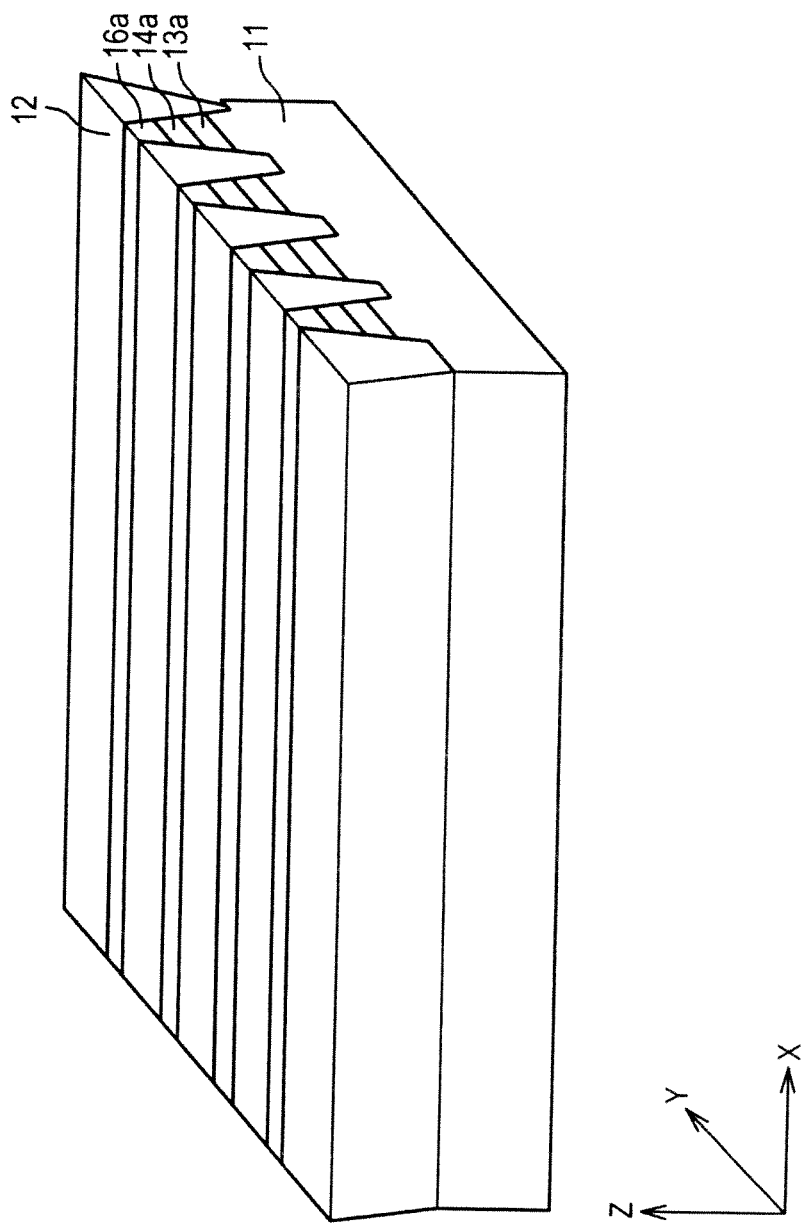
FIG. 8A is a perspective view schematically showing a method for manufacturing the nonvolatile semiconductor storage device in accordance with the first embodiment of the present invention.
Figure 9A:
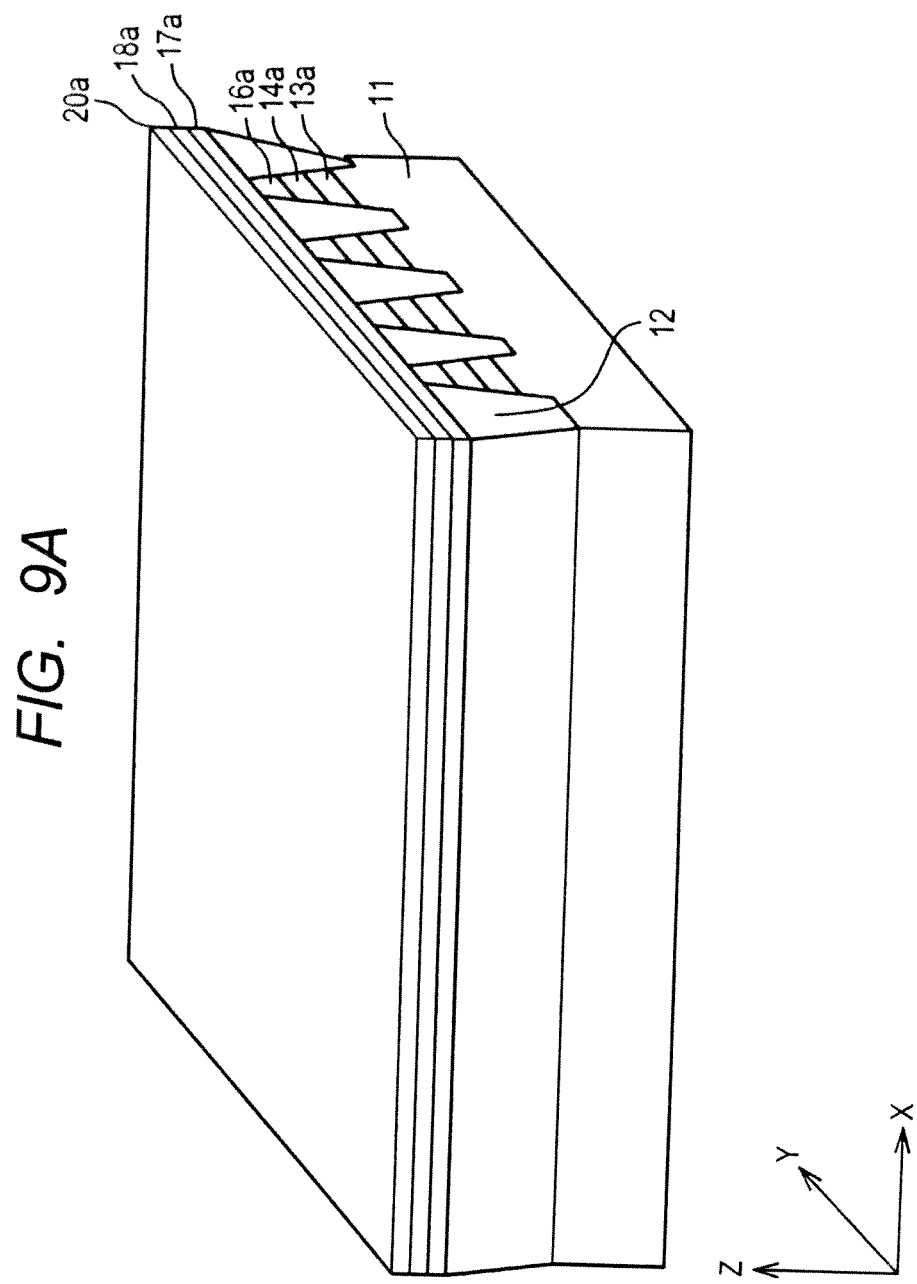
FIG. 9A is a perspective view schematically showing a method for manufacturing the nonvolatile semiconductor storage device in accordance with the first embodiment of the present invention.
Figure 10A:
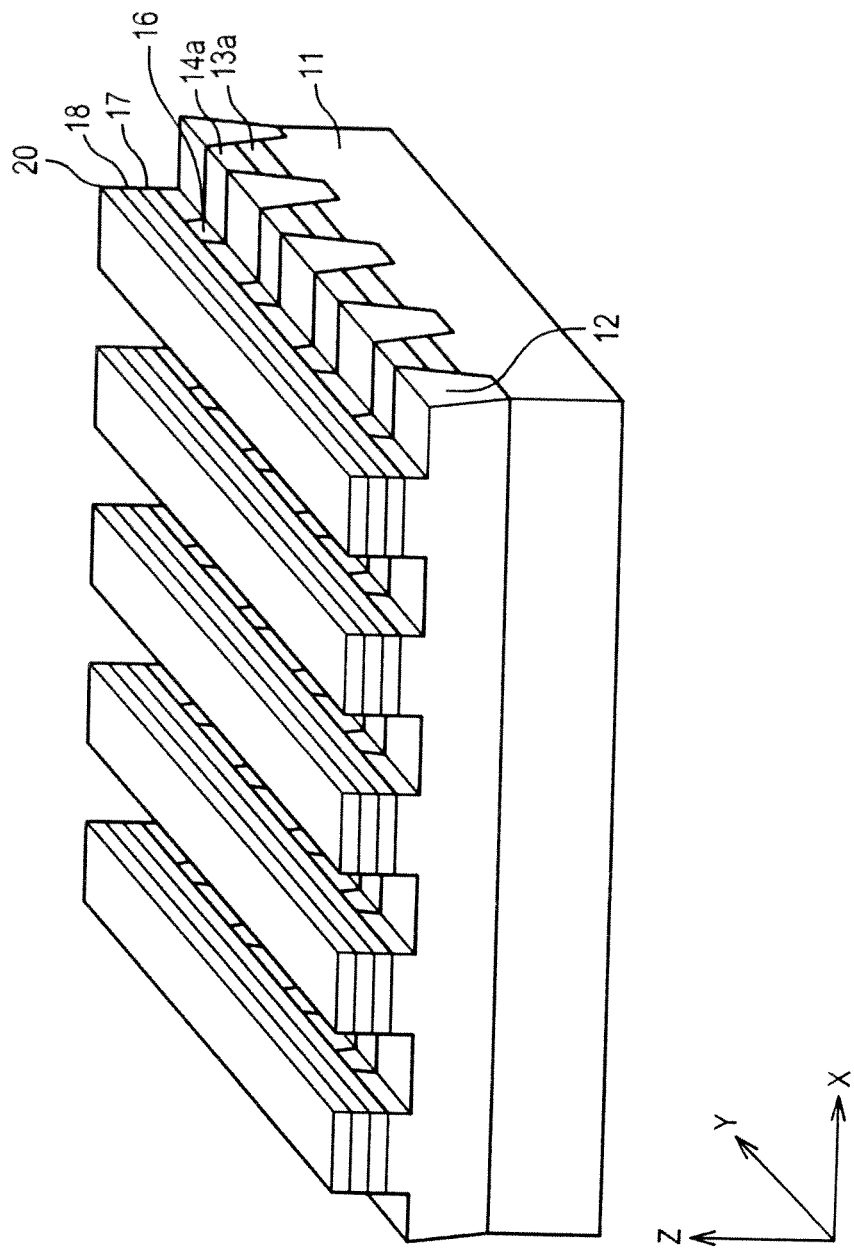
FIG. 10A is a perspective view schematically showing a method for manufacturing the nonvolatile semiconductor storage device in accordance with the first embodiment of the present invention.
Figure 10B:
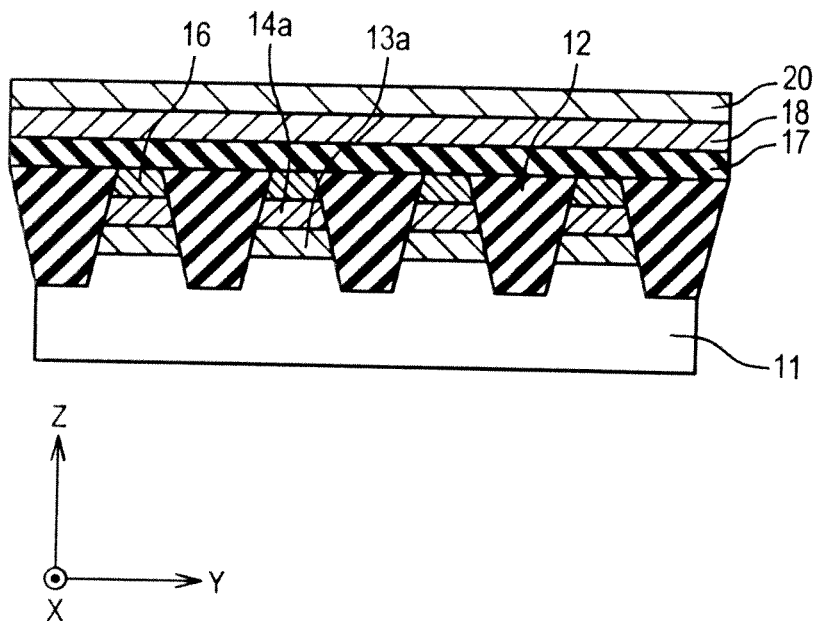
FIG. 10B is a cross-sectional view along I-I* in FIG. 10A.
Figure 10C:
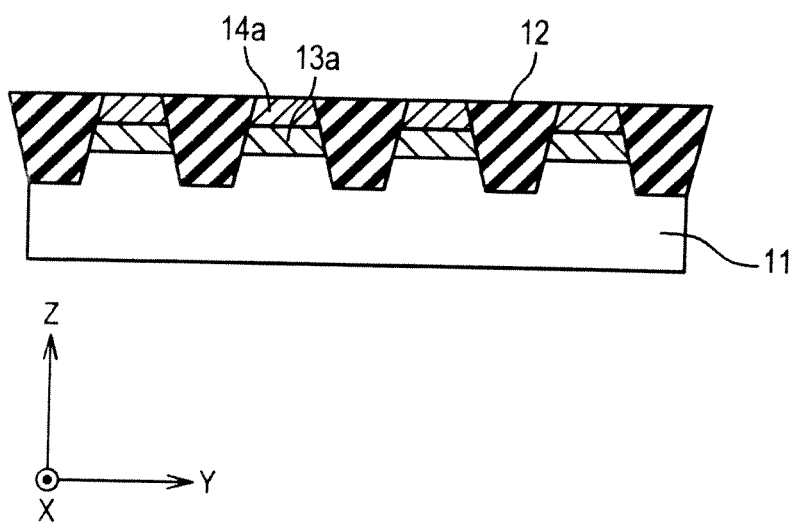
FIG. 10C is a cross-sectional view along II-II* in FIG. 10A.
Figure 11A:
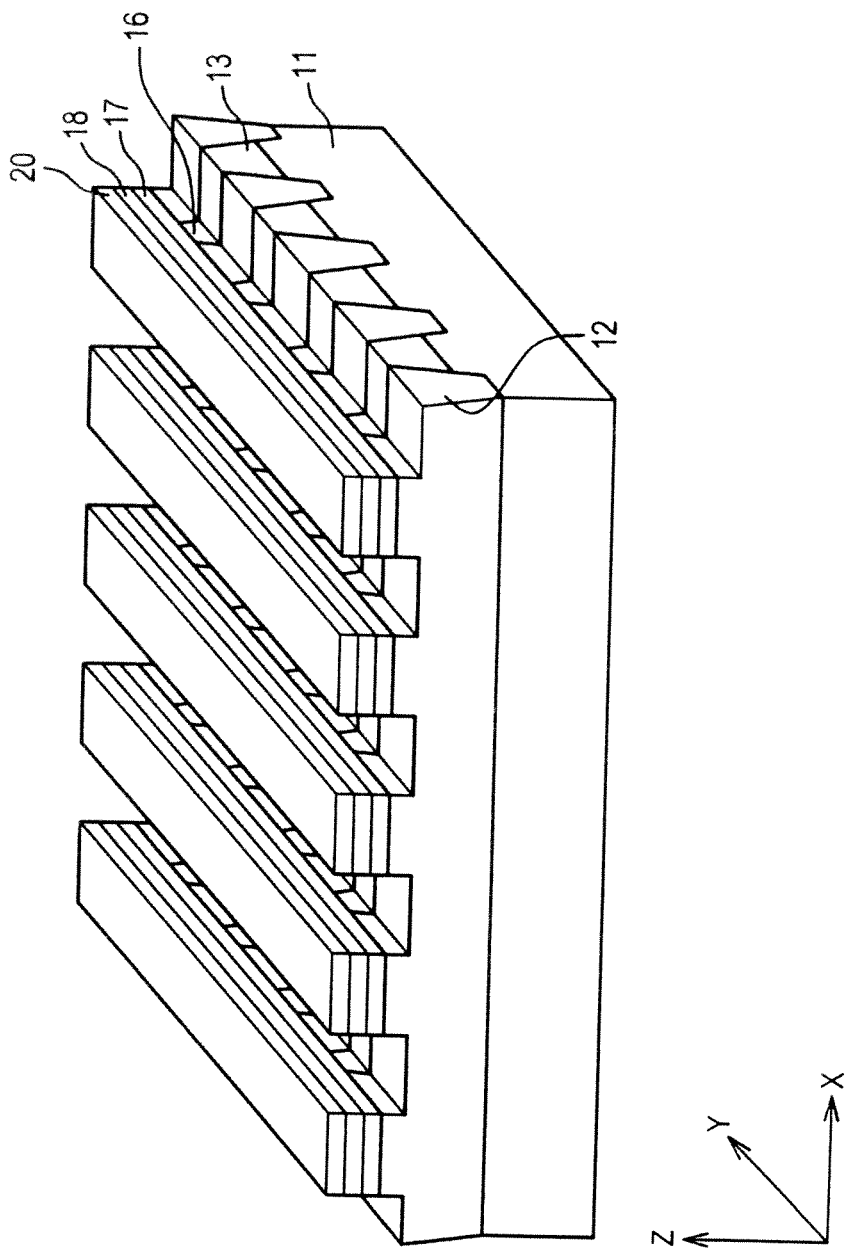
FIG. 11A is a perspective view schematically showing a method for manufacturing the nonvolatile semiconductor storage device in accordance with the first embodiment of the present invention.
Figure 11B:
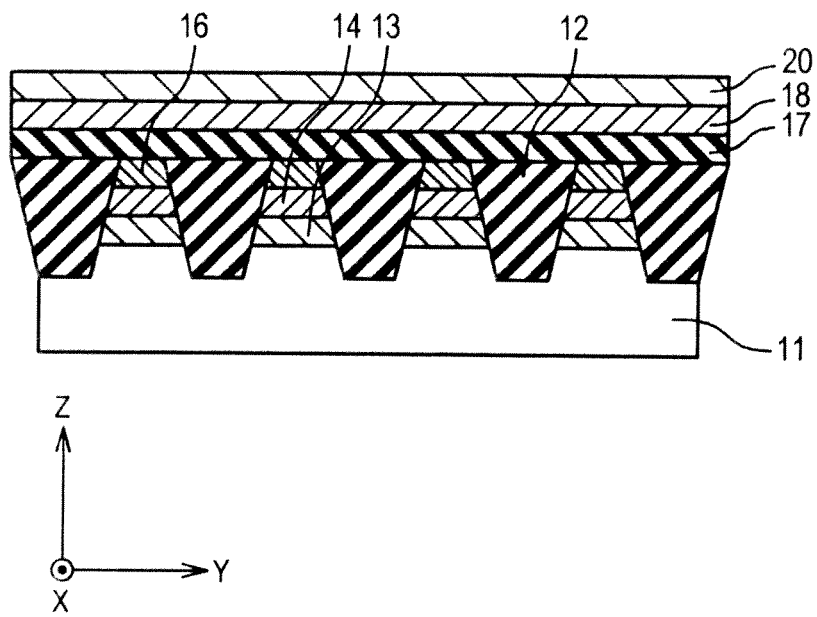
FIG. 11B is a cross-sectional view along I-I* in FIG. 11A.
Figure 11C:
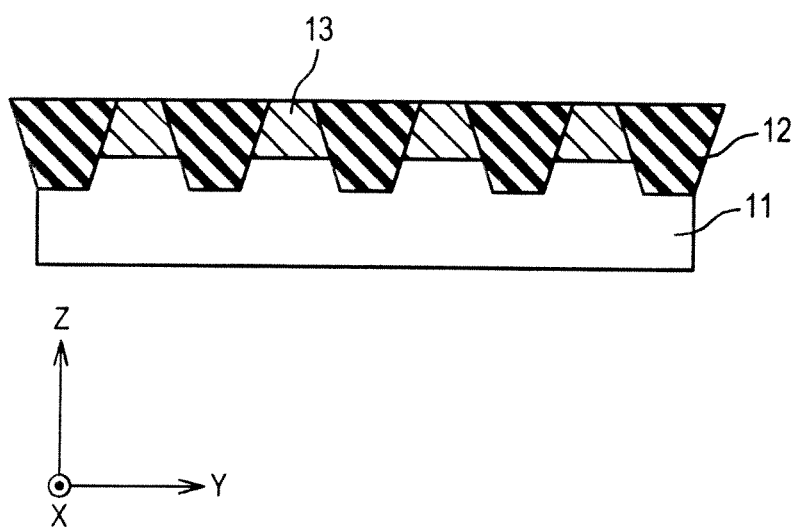
FIG. 11C is a cross-sectional view along II-II* in FIG. 11A.

A plurality of the bit lines 13 are formed in contact with the substrate 11. The bottom surface (−z-side surface) of the bit line 13 is flat. On the other hand, the top surface (+z-side surface) of the bit line 13 is at the same plane of the top surface (the surface of the element isolation insulation layer 12) of the substrate 11 at each portion without the memory cell 10 (FIG. 2C). However, at each portion with the memory cell 10, each bit line 13 is dented (is reduced in thickness; FIG. 2B) by (the second semiconductor layer 14) of the diode 1. Namely, the bit line 13 alternates between small film thickness portions and large film thickness portions corresponding to the period of the arrangement of the memory cells 10 (FIG. 2D). The bit line 13 is a first conductivity type semiconductor wire distinct from the substrate 11, and is exemplified by the n+ type Si (silicon) wires. Use of a high-concentration doped semiconductor (e.g., n+ type silicon) can reduce the resistance of the bit line 13. The first conductivity type concentration in the direction of the film thickness of the bit line 13 is not necessarily required to be uniform, and may desirably fall within a prescribed concentration range.

The first semiconductor layer 13 of the diode 15 is included in the bit line 13, and is a region including the memory cell 10 in the bit line 13 (FIG. 2D). The first semiconductor layer 13 is substantially the same as at least the top of the bit line 13 in the region. Namely, (at least the top of) the bit line 13 also serves as the first semiconductor layer 13 in the region. The first semiconductor layer 13 is of the first conductivity type as with the bit line 13, and is exemplified by an n+ type Si (silicon). The first conductivity type concentration in the direction of film thickness of the first semiconductor layer 13 is not necessarily required to be uniform, and may desirably fall within a prescribed concentration range.

The second semiconductor layer 14 of the diode 15 extends from the top of the bit line 13 (first semiconductor layer 13) to the midpoint of the inside thereof (FIG. 2D). The second semiconductor layer 14 can also be regarded as being buried in the recessed portion (or dent) of the bit line 13 (first semiconductor layer 13). Namely, the second semiconductor layer 14 is formed in such a manner as to fill the recessed portion (or dent) of the first semiconductor layer 13 having a recessed shape (or having a dent) (FIG. 2D). Incidentally, in the example of FIG. 2D, the shape of the recessed portion of the first semiconductor layer 13 (or the second semiconductor layer 14) is generally a rectangular prism shape. However, the present embodiment is not limited to this example. Namely, the shape of the recessed portion (or the second semiconductor layer 14) may have such other shape as to increase the contact area (junction area) with the first semiconductor layer 13. The number thereof may be plural. The second semiconductor layer 14 is formed in such a manner as to fill the recessed portion (or dent) thereof. The second semiconductor layer 14 is of a second conductivity type different from the first conductivity type, and is exemplified by p+ type Si (silicon). The first conductivity type concentration and the second conductivity type concentration in the direction of film thickness of the second semiconductor layer 14 are not necessarily required to be uniform, and may desirably fall within a prescribed concentration range.

The first semiconductor layer 13 and the second semiconductor layer 14 are preferably manufactured by using the semiconductor of the substrate 11 as it is as described later. This is because the current which can be passed through the diode 15 may be limited as already described in the case of polysilicon or selectively epitaxially grown silicon.

The diode 15 has such a configuration. As a result, the second semiconductor layer 14 can be in contact with the first semiconductor layer 13 not only at the bottom surface in the −Z direction thereof, but also at both the side surfaces in the X direction thereof. Therefore, it is possible to increase the contact area between the first semiconductor layer 13 and the second semiconductor layer 14 as compared with the case where the first semiconductor layer and the second semiconductor layer are simply stacked to be in contact with each other at a plane. The contact area corresponds to the junction area in the diode 15. Therefore, the configuration enables an increase in junction area in the diode 15. This can increase the current which can be passed through the diode 15.

The bottom electrode 16 of the resistance change part 19 is at the same plane as the top surface of the substrate 11 (the surface of the element isolation insulation layer 12) at a portion with the memory cell 10 (FIG. 2B). The resistance change layer 17 and the top electrode 18 are stacked in this order, and extend in the Y direction (FIG. 2B). The resistance change layer 17 is a transition metal oxide, and has, for example, a film thickness of about 10 nm. The transition metal oxide is exemplified by ZrO$_2$ (zirconium oxide), TiO$_2$ (titanium oxide), Al$_2$O$_3$ (aluminum oxide), HfO$_2$ (hafnium oxide), and Ta$_2$O$_5$ (tantalum oxide), and nitrides and silicates thereof, or laminations of the materials. The top electrode 18 and the bottom electrode 16 are conductors, and has, for example, a film thickness of about 20 nm. The top electrode 18 and the bottom electrode 16 are exemplified by Ag (silver), Cu (copper), Au (gold), Al (aluminum), Mg (magnesium), W (tungsten), Co (cobalt), Zn (zinc), Ni (nickel), K (potassium), Li (lithium), Fe (iron), Pt (platinum), Ru (ruthenium), Sn (tin), Cr (chromium), Pb (lead), and Ti (titanium), or alloys thereof or oxides, nitrides, fluorides, carbides, and silcides thereof. Alternatively, laminations of the materials are also acceptable.

The word line 20 is stacked over the resistance change layer 17 and the top electrode 18, and extends in the Y direction (FIG. 2B). The word line 20 is a conductor, and is exemplified by W (tungsten), Al (aluminum), Cu (copper), and Cu/TaN (copper/tantalum nitride).

An interlayer insulation layer 21 is formed in such a manner as to cover the word line 20, the bit line 13, and the memory cell 10. The top of the interlayer insulation layer 21 is planarized.

Thus, the nonvolatile semiconductor storage device 1 of the present embodiment has the following configuration. In the substrate 11 (e.g., p type silicon substrate), the first semiconductor layer (e.g., n type silicon layer) 13 which is an n type region defined by the element isolation insulation layer 12, and the second semiconductor layer (e.g., p type silicon layer) 14 which is the top thereof are buried in the surface region thereof. This forms a buried pn junction diode 15. The n type region is a component of the diode 15, and also serves as the bit line 13. Namely, the n type region forms the buried bit line. In the substrate 11, further, a bottom electrode layer 16 is buried over the second semiconductor layer 14. Over the substrate 11 in which the bottom electrode 16 is buried evenly, the resistance change layer 17, the top electrode 18, and the word line 20 are formed in this order. The bottom electrode layer 16, the resistance change layer 17, and the top electrode 18 form the resistance change part 19. The side on which the word line 20 is formed is evenly covered with an interlayer insulation film 21.

Thus, the memory cell 10 has a 1D1R structure, and can be formed of the minimum unit cell area $4F^2$. As a result it is possible to achieve high integration. Further, the buried bit line 13 uses a high-concentration doped semiconductor, and hence can be reduced in resistance. Consequently, it is possible to improve the operation speed. Further, it is possible to increase the contact area between the first semiconductor layer 13 and the second semiconductor layer 14. This enables an increase in junction area in the diode 15, which can increase the current which can be passed through the diode 15.

Then, a description will be given to a method for manufacturing the nonvolatile semiconductor storage device in accordance with the first embodiment of the present invention. FIGS. 3A to 11A are each a perspective view schematically showing a method for manufacturing the nonvolatile semiconductor storage device in accordance with the first embodiment of the present invention. FIGS. 3B to 11B are cross-sectional views along I-I* in FIGS. 3A to 11A, respectively. FIGS. 3C to 11C are cross-sectional views along II-II* in FIGS. 3A to 11A, respectively. FIGS. 3D to 11D are cross-sectional views along III-III* in FIGS. 3A to 11A, respectively. FIGS. 3E to 11E are cross-sectional views along IV-IV* in FIGS. 3A to 11A, respectively. Incidentally, the definitions of the cross-sectional view along I-I*, the cross-sectional view along II-II*, the cross-sectional view along II-II* and the cross-sectional view along IV-IV* are the same as those in the case of FIG. 2A.

First, as shown in FIGS. 3A to 3E, as the substrate 11, a p type Si (silicon) substrate is prepared as a second conductivity type semiconductor substrate.

Then, as shown in FIGS. 4A to 4E, in the substrate 11, there are formed a plurality of element isolation insulation layers 12 (e.g., $SiO_2$ (silicon oxide)) extending in parallel with one another in the X direction. This results in the formation of a plurality of semiconductor regions 11p each in a thin rectangular form between a plurality of the element isolation insulation layers 12. The semiconductor regions 11p are regions of p type silicon exposed between the element isolation insulation layers 12. A plurality of the semiconductor regions 11p extend in parallel with one another in the X direction.

Subsequently, as shown in FIGS. 5A to 5E, the tops of the semiconductor regions 11p are etched back. This results in the formation of a plurality of recessed structures 11q each in a thin rectangular form between a plurality of the element isolation insulation layers 12. In each recessed structure 11q, the bottom surface corresponds to the top surface of the semiconductor region 11p, and the side surface corresponds to the side surface of the element isolation insulation layer 12. A plurality of the recessed structures 11q mutually extend in the X direction.

Then, as shown in FIGS. 6A to 6E, a plurality of the semiconductor regions 11p are ion-implanted with a first conductivity type impurities relatively deeply. This results in the formation of a first ion implantation layer 13a in the deep part of the semiconductor region 11p. For example, ion species including P (phosphorus) ions of n type impurities are ion-implanted relatively deeply, so that the deep part is made into the n+ type Si (silicon) layer as the first ion implantation layer 13a. Subsequently, a plurality of the semiconductor regions 11p are ion-implanted with a second conductivity type impurities relatively shallowly. This results in the formation of a second conductivity type second ion implantation layer 14a in the shallow part of the semiconductor region 11p. For example, ion species including B (boron) ions of p type impurities are ion-implanted relatively shallowly, so that the shallow part is made into a p+ type Si (silicon) layer as the second ion implantation layer 14a. As a result, there is formed a pn junction structure to be the diode 15 in a step at a subsequent stage. The first ion implantation layer 13a becomes the bit line 13 in a step at a subsequent stage.

Then, as shown in FIGS. 7A to FIG. 7E, a bottom electrode film 16a is deposited in such a manner as to cover the entire surface of the substrate 11. A metal film such as Ru (ruthenium) is deposited. As a result, a plurality of the element isolation insulation layers 12 and a plurality of the recessed structures 11q (the second ion implantation layers 14a of the semiconductor region 11p) are covered with the bottom electrode film 16a.

Subsequently, as shown in FIGS. 8A to 8E, with a plurality of the element isolation insulation layers 12 as a stopper, a planarization treatment is performed by CMP (CMP: Chemical Mechanical Polishing). As a result, a plurality of buried structures of the bottom electrode films 16a are formed in such a manner as to fill the tops (recessed structures 11q) of a plurality of the semiconductor regions 11p.

Then, as shown in FIGS. 9A to 9E, a resistance change layer film 17a, a top electrode film 18a, and a word line film 20a are deposited in this order in such a manner as to cover a plurality of the element isolation insulation layers 12 and a plurality of the buried bottom electrode films 16a. For example, a transition metal oxide such as $ZrO_2$ (zirconium oxide), a metal film such as Ru (ruthenium), and a metal film such as Cu (copper) are deposited in this order.

Then, as shown in FIGS. 10A to 10E, with a plurality of the second ion implantation layers 14a as an etching stopper, a word line film 20a, a top electrode film 18a, a resistance change layer film 17a, a plurality of bottom electrode films 16a, and a plurality of element isolation insulation layers 12 are etched so that a plurality of word lines 20 extend in the Y direction. Accordingly, there are formed the word line 20, and thereunder, the top electrode 18, the resistance change layer 17, and the bottom electrode 16. As a result, the buried bottom electrode 16, the resistance change layer 17, and the top electrode 18 under the word line 20 become a resistance change part 19.

Subsequently, as shown in FIGS. 11A to 11E, the exposed portion of the second ion implantation layer 14a is ion-implanted with first conductivity type impurities. As a result, the exposed portion of the second ion implantation layer 14a becomes of the first conductivity type. The unexposed portion (the portion covered with the bottom electrode 16) of the second ion implantation layer 14a remains of the second conductivity type. For example, ion species including P (phosphorus) ions of n type impurities are ion-implanted into the exposed portion of the second ion implantation layer 14a. As a result, the exposed portion of the second ion implantation layer 14a is changed into an n+ type Si (silicon) layer.

The unexposed portion of the second ion implantation layer 14a remains the p+ type Si (silicon) layer. Consequently, the ion-implanted portion of the second ion implantation layer 14a, and the first ion implantation layer 13a become the first conductivity type first semiconductor layer 13 of the diode 15. The first semiconductor layer 13 also serves as the bit line 13. On the other hand, the unexposed portion of the second ion implantation layer 14a becomes the second conductivity type second semiconductor layer 14 of the diode 15.

Then, an interlayer insulation film (not shown) such as silicon oxide is formed in such a manner as to cover the entire surface of the substrate 11. Then, a planarization treatment is performed by CMP. As a result, it is possible to manufacture the nonvolatile semiconductor storage device 1 as shown in FIGS. 2A to 2E.

As described above, in the present embodiment, the portions of the second ion implantation layer 14a except for a portion of the second ion implantation layer 14a (second conductivity type) immediately under the bottom electrode 16 and on the opposite sides thereof are changed into the first conductivity type first ion implantation layer 13a by ion implantation (FIGS. 11A to 11E). As a result, the second semiconductor layer 14 of the diode 15 is buried in the recessed portion (or dent) of the first semiconductor layer 13 (bit line 13). By manufacturing the diode 15 in this manner, it is possible to set larger the contact area between the first semiconductor layer 13 and the second semiconductor layer 14 as compared with the case where the first semiconductor layer 13 and the second semiconductor layer 14 are simply stacked one on another. Namely, it is possible to increase the junction area in the diode 15, which enables an increase in current which can be passed through the diode 15. Further, the portions of the second ion implantation layer 14a except for a portion immediately under the bottom electrode 16 is set to be of a high-concentration doped first conductivity type. As a result, it also becomes possible to reduce the resistance of the buried bit line 13.

With the manufacturing method, the alignment in the structure in which the resistance change part is sandwiched between the grid-like wires requires only one cycle of the steps of FIGS. 10A to 10E. This eliminates the necessity of the margin in view of the alignment precision. Namely, it becomes possible to form the memory cell 10 in a self-aligned manner between the bit line 13 and the word line 20. As a result, it is possible to implement the size of the memory cell in terms of a minimum unit cell of $4F^2$.

As described up to this point, in accordance with the present embodiment, it is possible to set the pn junction area in the diode 15 relatively large irrespective of the miniaturization of the memory cell 10. As a result, it is possible to pass a sufficient current through the memory cell 10 even when the memory cell 10 is miniaturized. This enables the resistance changing operation. Further, the structure of the cross-point type memory cell 10 can be formed in a self-aligned manner, and the minimum unit cell can be implemented as the memory cell. Still further, use of a high-concentration doped semiconductor can reduce the resistance of the bit line 13.

Second Embodiment

Figure 12:
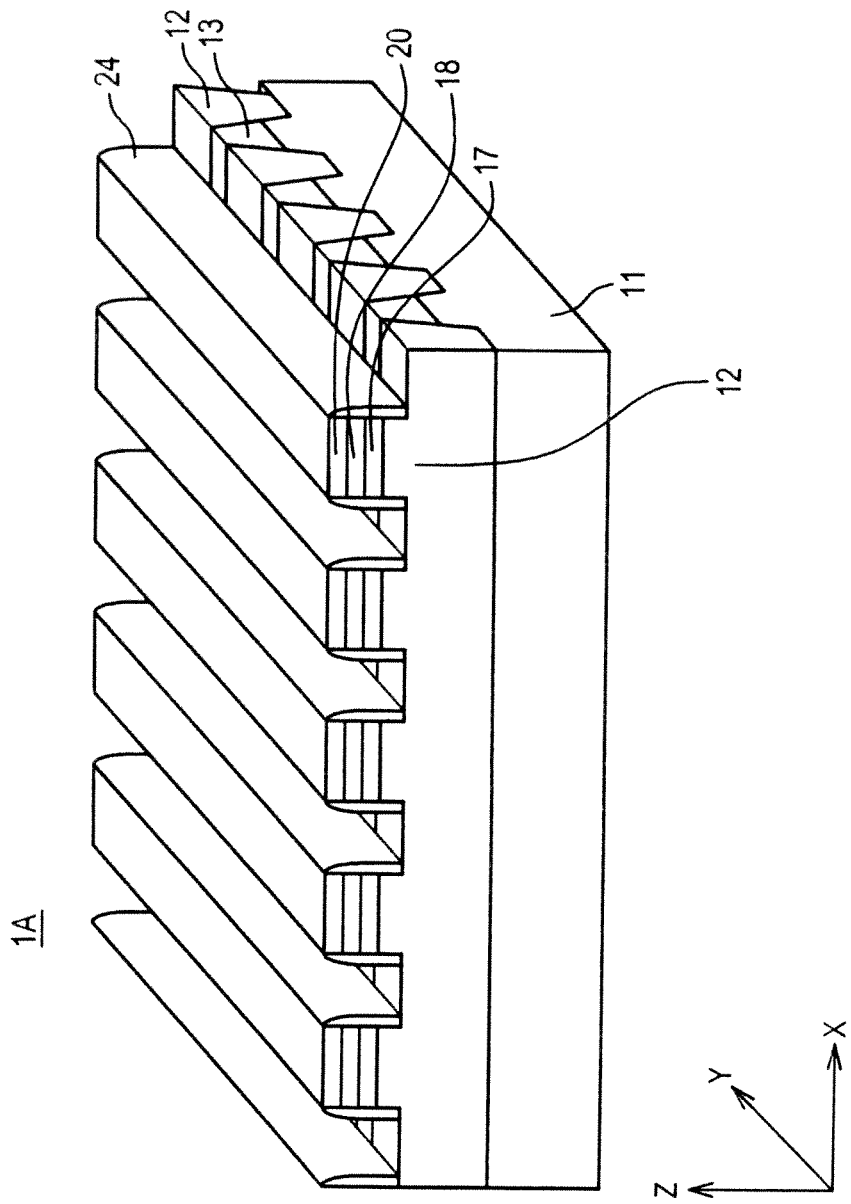
FIG. 12 is a perspective view schematically showing a configuration example of a nonvolatile semiconductor storage device in accordance with a second embodiment of the present invention.

A description will be given to a nonvolatile semiconductor storage device in accordance with a second embodiment of the present invention. FIG. 12 is a perspective view schematically showing a configuration example of the nonvolatile semiconductor storage device in accordance with the second embodiment of the present invention. A nonvolatile semiconductor storage device 1A of the present embodiment is different from the nonvolatile semiconductor storage device 1 of the first embodiment in that a sidewall 24 is provided at the side surface of the resistance change part 19. Below, the differences will be mainly described.

The resistance change part 19 includes sidewalls 24 on both sides opposing in the X direction, which may be disposed to both side surfaces of the word line 20. The sidewalls 24 extend in the Y direction along the resistance change layer 17, the top electrode 18, and the word line 20 extending in the Y direction. The sidewalls 24 are formed of an insulator such as $SiO_2$ (silicon oxide).

FIGS. 13A and 13B are a cross-sectional view along III-III* and a cross-sectional view along IV-IV* in FIG. 12, respectively. However, the definitions of the cross section along III-III* and the cross section along IV-IV* are the same as those in the first embodiment. Namely, the cross section along III-III* is an xz cross section including the bit line 13. The IV-IV* cross section is an xz cross section not including the bit line 13.

The second semiconductor layer 14 of the diode 15 is provided not only under the bottom electrode 16 but also under the sidewalls 24. Namely, the width in the x direction of the second semiconductor layer 14 is generally the total length of the width in the x direction of the bottom electrode 16 and the widths in the x direction of the two sidewalls 24. Thus, the provision of the sidewalls 24 can more increase the contact area between the first semiconductor layer 13 and the second semiconductor layer 14, i.e., the junction area in the diode 15. In addition, the provision of the sidewalls 24 results in that the sidewalls 24 and the second semiconductor layer 14 are sandwiched between the bottom electrode 16 and the first semiconductor layer 13. Therefore, it is possible to prevent the direct contact between the bottom electrode 16 and the first semiconductor layer 14, i.e., the short circuit of the diode 15.

Then, a description will be given to a method for manufacturing the nonvolatile semiconductor storage device in accordance with the second embodiment of the present invention. The method for manufacturing the nonvolatile semiconductor storage device 1A is the same as the case of the method for manufacturing the nonvolatile semiconductor storage device 1 of the first embodiment, except that the following steps are included between the steps of FIGS. 10A to 10E and the steps of FIGS. 11A to 11E.

The following step is carried out between the steps of FIGS. 10A to 10E and the steps of FIGS. 11A to 11E. An interlayer insulation film such as silicon oxide is formed in such a manner as to cover the entire surface of the substrate 11. Then, the interlayer insulation film is etched back. As a result, the sidewalls 24 can be formed on both side surfaces of the resistance change part 19 and the word line 20 extending in the Y direction.

Also in the case of the present embodiment, it is possible to obtain the same effects as those in the first embodiment. In addition, the junction area in the diode 15 can be increased. As a result, a larger current can be passed through the diode 15. Further, it is possible to prevent the direct contact between the bottom electrode 16 and the first semiconductor layer 14, namely, the short circuit of the diode 15.

Figure 14B:
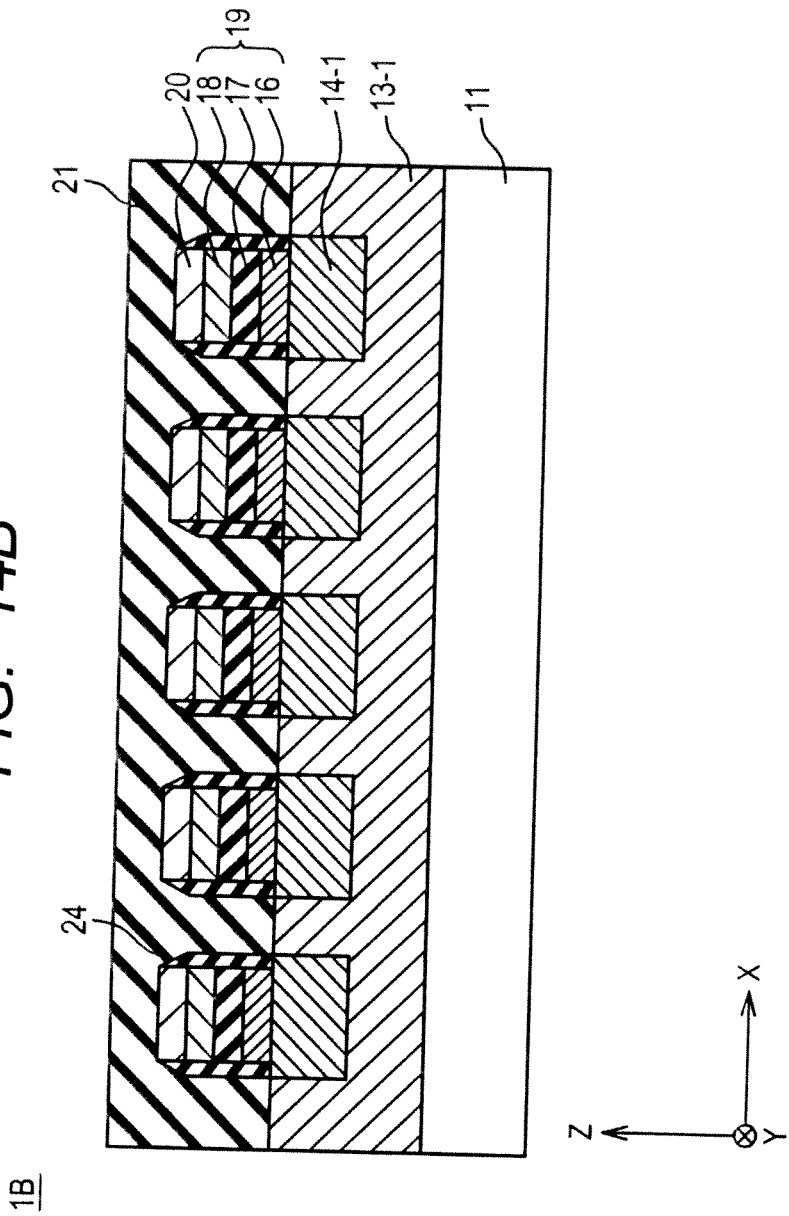
FIG. 14B is a cross-sectional view along III-III* of a nonvolatile semiconductor storage device of a first modified example in the second embodiment.

Then, a description will be given to a modified example of the present embodiment. FIG. 14A is a cross-sectional view along III-III* of the nonvolatile semiconductor storage device 1A in the present embodiment (the same as FIG. 13A). FIG. 14B is a cross-sectional view along III-III* of a nonvolatile semiconductor storage device 1B of a first modified example in the present embodiment. FIG. 14C is a cross-sectional view along III-III* of a nonvolatile semiconductor storage device 1C in a second modified example in the present embodiment.

As compared with the case of the nonvolatile semiconductor storage device 1A of FIG. 14A, in the case of the nonvolatile semiconductor storage device 1B of FIG. 14B, the depths of the first semiconductor layer 13-1 and the second semiconductor layer 14-1 are set larger, respectively. This can increase the junction area in the diode 15 (the contact area between the first semiconductor layer 13-1 and the second semiconductor layer 14-1). In the case of the nonvolatile semiconductor storage device 1C of FIG. 14C, the depths of the first semiconductor layer 13-2 and the second semiconductor layer 14-2 are set further larger, respectively. This can further increase the junction area in the diode 15 (the contact area between the first semiconductor layer 13-2 and the second semiconductor layer 14-2).

The methods for manufacturing the nonvolatile semiconductor storage device 1B and the nonvolatile semiconductor storage device 1C are the same as the case of the method for manufacturing the nonvolatile semiconductor storage device 1 of the first embodiment, except that the energy for ion implantation in the steps of FIG. 6A to FIG. 6E in the first embodiment is increased by a prescribed amount.

Also in the present modified embodiment, it is possible to obtain the same effects as those of the nonvolatile semiconductor storage device 1A. In addition, the junction area in the diode 15 can be more increased. As a result, it is possible to pass a further larger current through the diode 15.

Third Embodiment

Figure 15:
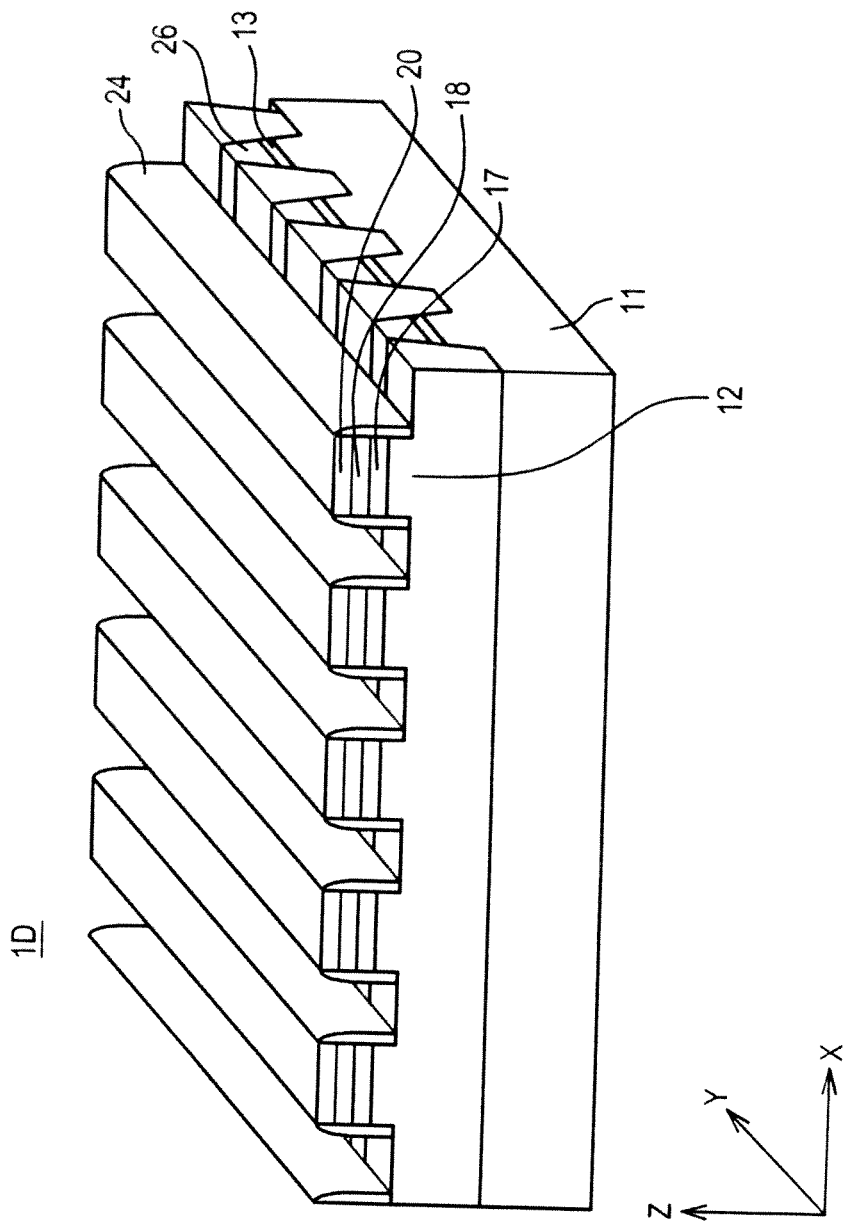
FIG. 15 is a perspective view schematically showing a configuration example of a nonvolatile semiconductor storage device in accordance with a third embodiment of the present invention.

A description will be given to a nonvolatile semiconductor storage device in accordance with a third embodiment of the present invention. FIG. 15 is a perspective view schematically showing the nonvolatile semiconductor storage device in accordance with the third embodiment of the present invention. A nonvolatile semiconductor storage device 1D of the present embodiment is different from the nonvolatile semiconductor storage device 1A of the second embodiment in that at least the top of the bit line 13 between the sidewalls 24 is silicidized. Below, the difference will be mainly described.

The bit line 13 includes a silicide layer 26 disposed between the sidewalls 24 in a portion coupling the memory cells 10 adjacent to each other in the X direction. The silicide layer 26 may be only the top of the bit line 13 at the portion, or may be almost all of the bit line 13 in the direction of film thickness at the portion. The silicide layer 26 is exemplified by WSi (tungsten silicide), CoSi (cobalt silicide), NiSi (nickel silicide), and TiSi (titanium silicide).

Figure 16A:
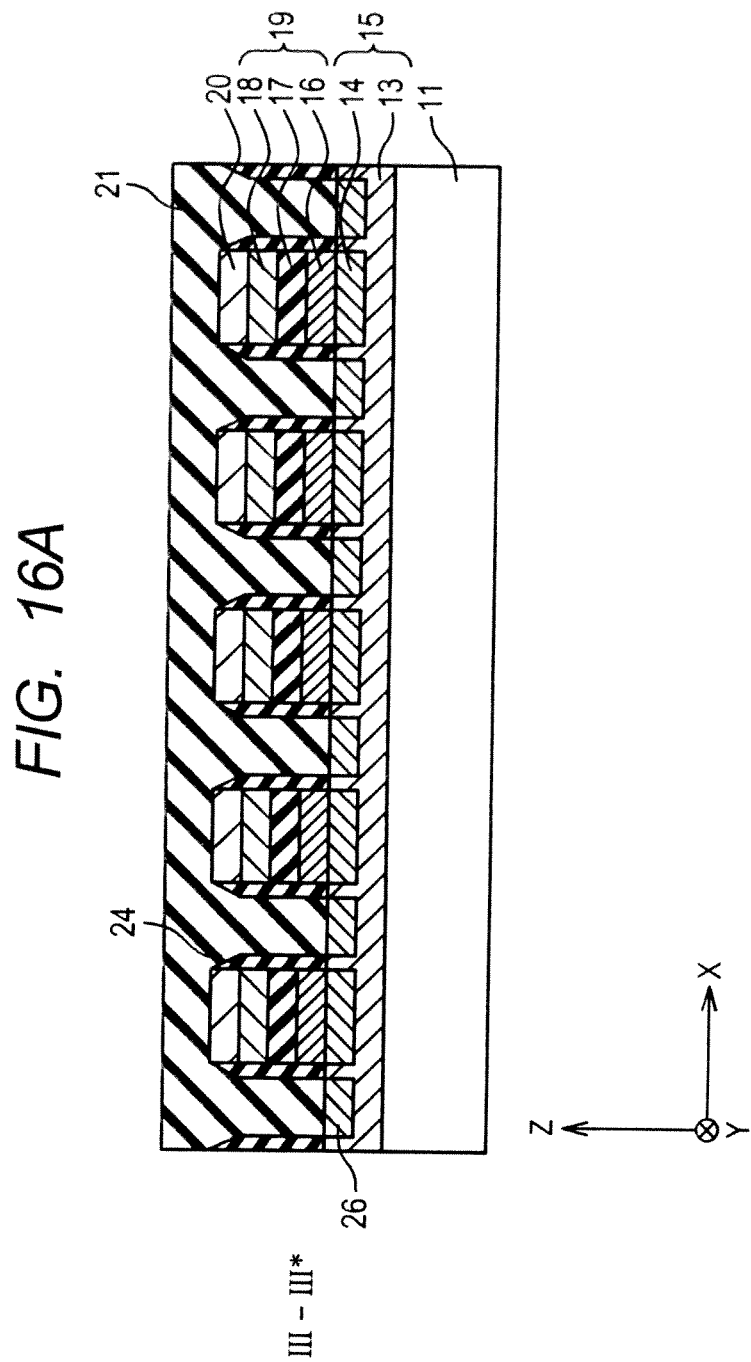
FIG. 16A is a cross-sectional view along III-III* in FIG. 15.

FIGS. 16A and 16B are a cross-sectional view along III-III* and a cross-sectional view along IV-IV* in FIG. 15, respectively. However, the definitions of the III-III* cross section and the IV-IV* cross section are the same as those in the first embodiment. Namely, the III-III* cross section is an xz cross section including the bit line 13. The IV-IV* cross section is an xz cross section not including the bit line 13.

The silicide layer 26 is disposed in the upper part of the bit line 13 between the opposing sidewalls 24, and is not present immediately under the sidewalls 24. For this reason, the silicide layer 26 is not in contact with the second semiconductor layer 14 and the bottom electrode 16. Namely, the diode 15 will not be short-circuited. Silicidation of a part of the bit line 13 can further reduce the resistance of the bit line 13.

Then, a description will be given to a method for manufacturing the nonvolatile semiconductor storage device in accordance with the third embodiment of the present invention. The method for manufacturing the nonvolatile semiconductor storage device 1D is the same as the case of the method for manufacturing the nonvolatile semiconductor storage device 1A of the second embodiment, except that the following steps are included between the steps of FIGS. 11A to 11E and the steps of forming the interlayer insulation layer 21.

Between the steps of FIGS. 11A to 11E and the step of forming the interlayer insulation layer 21, the following steps are carried out. First, a metal film such as tungsten is deposited in such a manner as to cover the entire surface of the substrate 11. Then, the substrate 11 is annealed at an appropriate temperature. As a result, a portion of the metal film in contact with the exposed portion of the bit line 13, namely, a portion in contact with a portion of n+ type Si (silicon), and the top of the bit line 13 react with each other to be silicidized. Then, the metal film is removed by etching. As a result, the silicide layer 26 can be formed.

Also in the case of the present embodiment, it is possible to obtain the same effects as those with the second embodiment. In addition, it is possible to further reduce the resistance of the bit line 13.

Fourth Embodiment

Figure 17A:
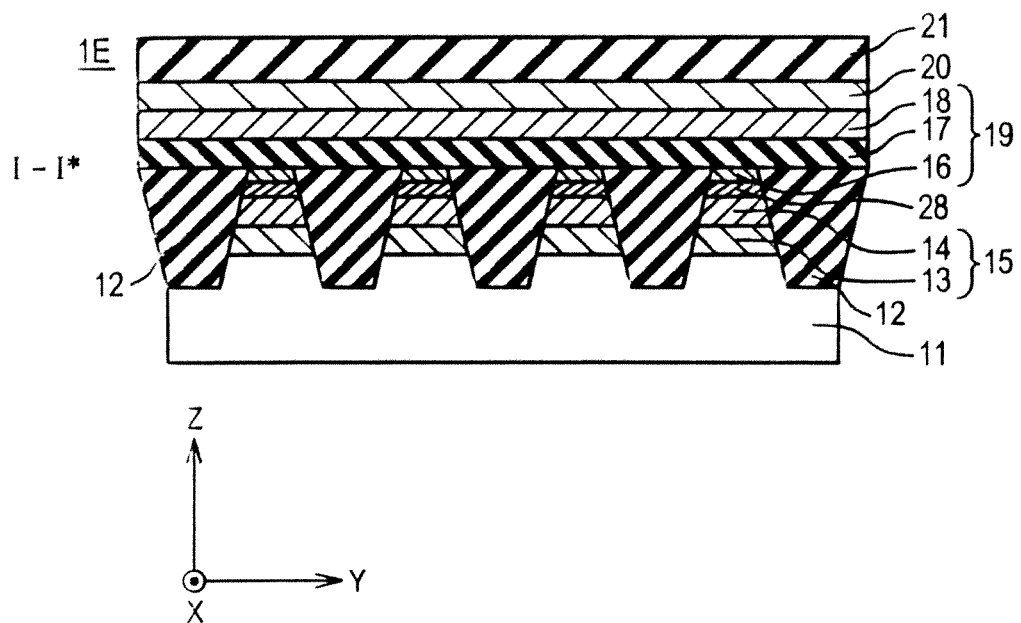
FIG. 17A is a cross-sectional view along I-I* in a configuration example of a nonvolatile semiconductor storage device in accordance with a fourth embodiment of the present invention.
Figure 17B:
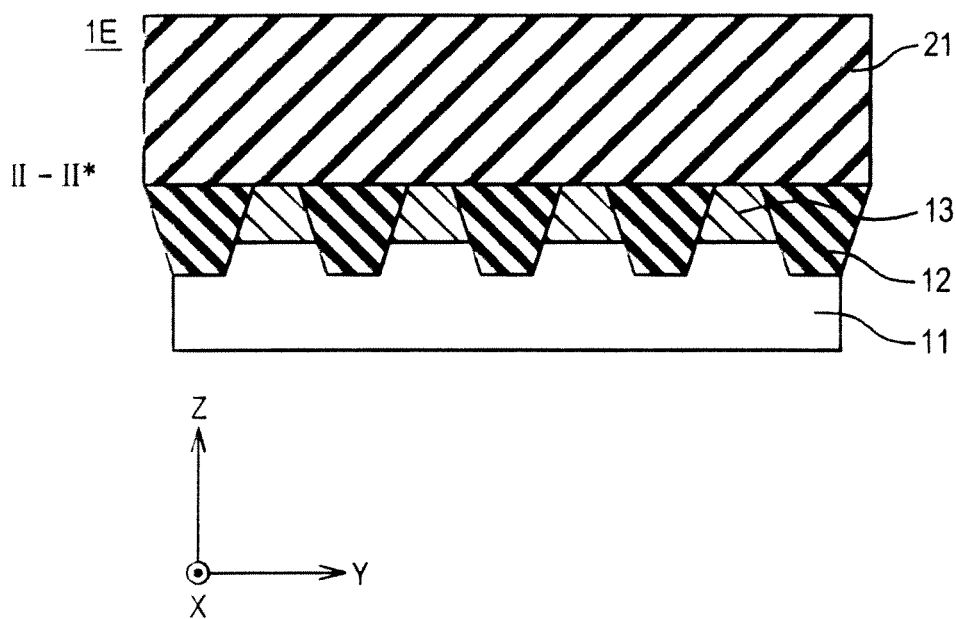
FIG. 17B is a cross-sectional view along II-II* in the configuration example of the nonvolatile semiconductor storage device in accordance with the fourth embodiment of the present invention.

A description will be given to a nonvolatile semiconductor storage device in accordance with a fourth embodiment of the present invention. FIG. 17A and FIG. 17B are a cross-sectional view along I-I* and a cross-sectional view along II-II* in a configuration example of the nonvolatile semiconductor storage device in accordance with the fourth embodiment of the present invention. However, the definitions of the I-I* cross section and the II-II* cross section are the same as those in the first embodiment. Namely, the I-I* cross section is a yz cross section including the word line 20. The II-II* cross section is a yz cross section not including the word line 20. A nonvolatile semiconductor storage device 1E of the present embodiment is different from the nonvolatile semiconductor storage device 1 of the first embodiment in that the contact portion between the bottom electrode 16 and the diode 15 is silicidized. Below, the difference will be mainly described.

The memory cell 10 further includes a silicide layer 28. The silicide layer 28 is disposed between the second semiconductor layer 14 of the diode 15 and the resistance change part 19. Therefore, the silicide layer 28 extends in the X direction over the second semiconductor layer 14. The silicide layer 28 is exemplified by WSi (tungsten silicide). The provision of the silicide layer 28 between the diode 15 and the resistance change part 19 can reduce the contact resistance.

Then, a description will be given to the method for manufacturing the nonvolatile semiconductor storage device in accordance with the fourth embodiment of the present invention. As for the method for manufacturing a nonvolatile semiconductor storage device 1E, the steps from FIGS. 3A to 3E to FIGS. 6A to 6E are the same as those of the method for manufacturing the nonvolatile semiconductor storage device 1 of the first embodiment. FIGS. 18A to 23A are each a cross-sectional view along I-I* in the method for manufacturing the nonvolatile semiconductor storage device in accordance with the fourth embodiment. FIGS. 18B to FIG. 23B are each a cross-sectional view along II-II*, the method for manufacturing the nonvolatile semiconductor storage device in accordance with the fourth embodiment.

First, the steps from FIGS. 3A to 3E to FIGS. 6A to 6E are carried out.

Then, as shown in FIGS. 18A and 18B, there is deposited a metal film 28 which can be silicidized in such a manner as to cover the entire surface of the substrate 11. Examples thereof include a W (tungsten) film. Further, a bottom electrode film 16a is deposited in such a manner as to cover the metal film 28a. Examples thereof include a Ru (ruthenium) film. As a result, a plurality of the element isolation insulation layers 12 and a plurality of the recessed structures 11q (the second ion implantation layers 14a in the semiconductor regions 11p) are each covered with the bottom electrode film 16a and the metal film 28a.

Figure 19A:
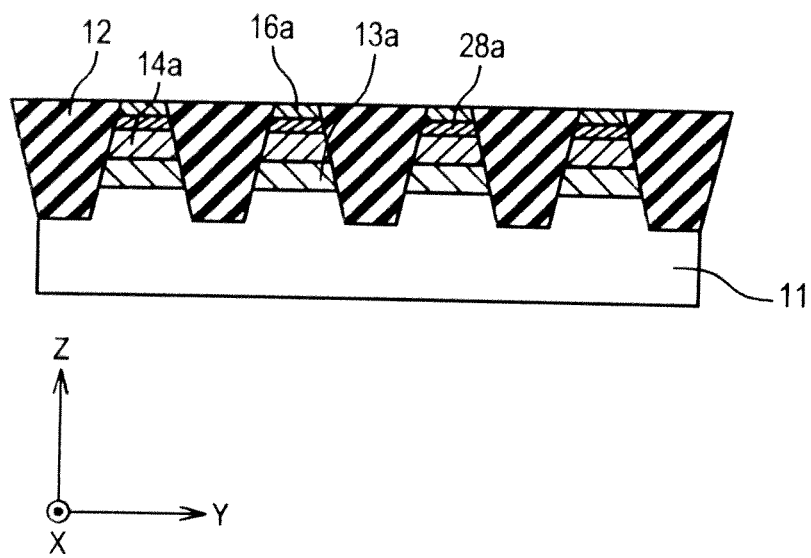
FIG. 19A is a cross-sectional view along I-I* in the method for manufacturing the nonvolatile semiconductor storage device in accordance with the fourth embodiment.
Figure 19B:
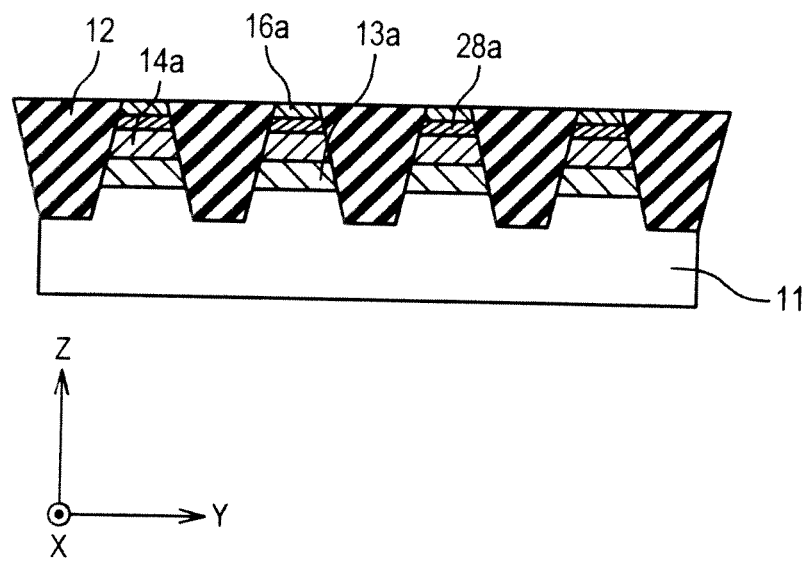
FIG. 19B is a cross-sectional view along II-II* in the method for manufacturing the nonvolatile semiconductor storage device in accordance with the fourth embodiment.

Subsequently, as shown in FIGS. 19A and 19B, with a plurality of the element isolation insulation layers 12 as a stopper, a planarization treatment is performed by CMP (CMP: Chemical Mechanical Polishing). As a result, a buried structure of a plurality of the metal films 28a and a plurality of the bottom electrode films 16a is formed in such a manner as to fill the tops (recessed structures 11q) of a plurality of the semiconductor regions 11p.

Figure 20A:
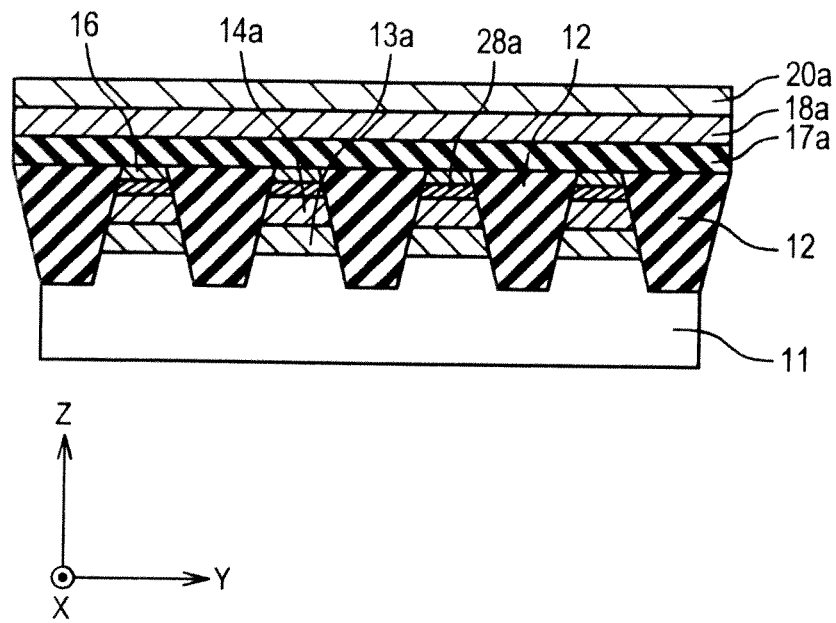
FIG. 20A is a cross-sectional view along I-I* in the method for manufacturing the nonvolatile semiconductor storage device in accordance with the fourth embodiment.
Figure 20B:
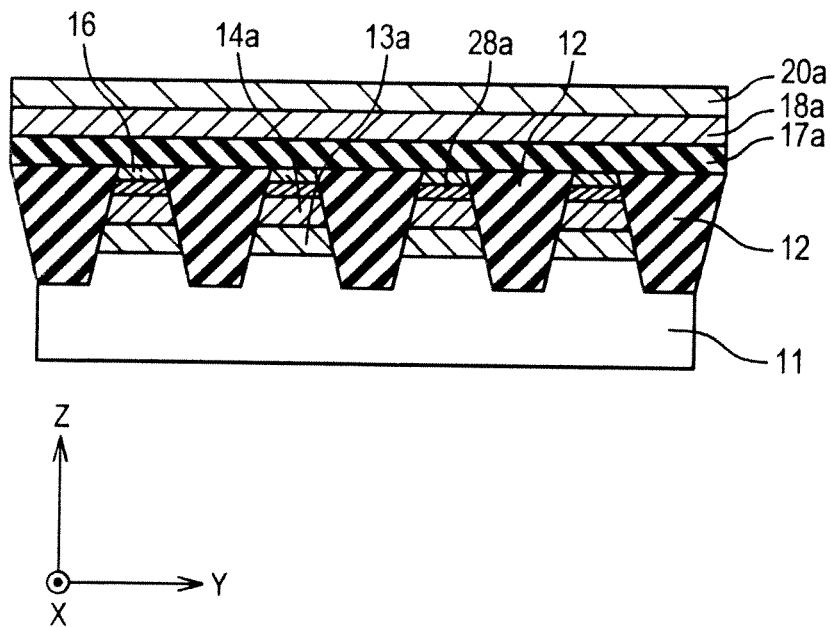
FIG. 20B is a cross-sectional view along II-II* in the method for manufacturing the nonvolatile semiconductor storage device in accordance with the fourth embodiment.

Then, as shown in FIGS. 20A to 20B, a resistance change layer film 17a, a top electrode film 18a, and a word line film 20a are deposited in this order in such a manner as to cover a plurality of element isolation insulation layers 12, a plurality of buried metal films 28a and a plurality of bottom electrode films 16a. For example, a transition metal oxide such as $ZrO_2$ (zirconium oxide), a metal film such as Ru (ruthenium), and a metal film such as Cu (copper) are deposited in this order.

Figure 21A:
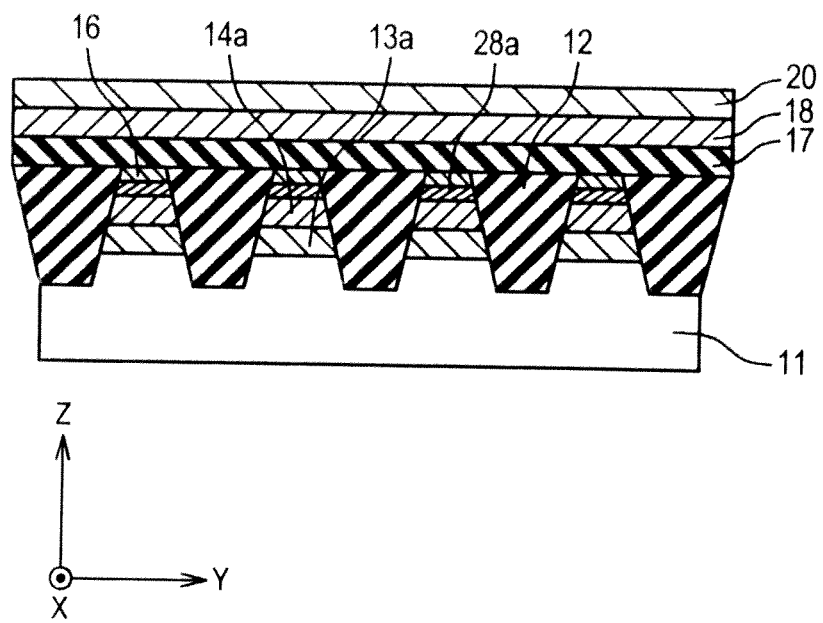
FIG. 21A is a cross-sectional view along I-I* in the method for manufacturing the nonvolatile semiconductor storage device in accordance with the fourth embodiment.
Figure 21B:
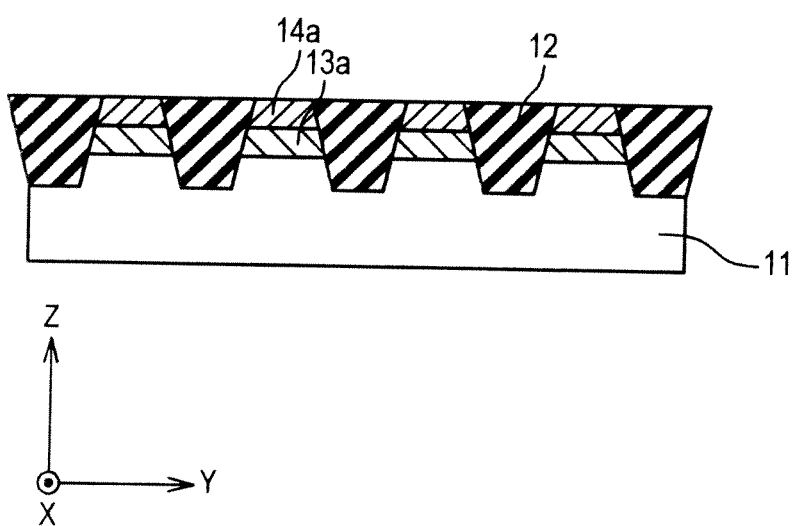
FIG. 21B is a cross-sectional view along II-II* in the method for manufacturing the nonvolatile semiconductor storage device in accordance with the fourth embodiment.

Then, as shown in FIGS. 21A and 21B, with a plurality of the second ion implantation layers 14a as an etching stopper, the word line film 20a, the top electrode film 18a, the resistance change layer film 17a, a plurality of the bottom electrode films 16a, and a plurality of the metal films 28a are etched so that a plurality of the word lines 20 extend in the Y direction. This results in the formation of the word line 20, thereunder, the top electrode 18, the resistance change layer 17, the bottom electrode 16, and the metal film 28a. As a result, the top electrode 18, the resistance change layer 17, and the buried bottom electrode 16 under the word line 20 become the resistance change part 19.

Figure 22A:
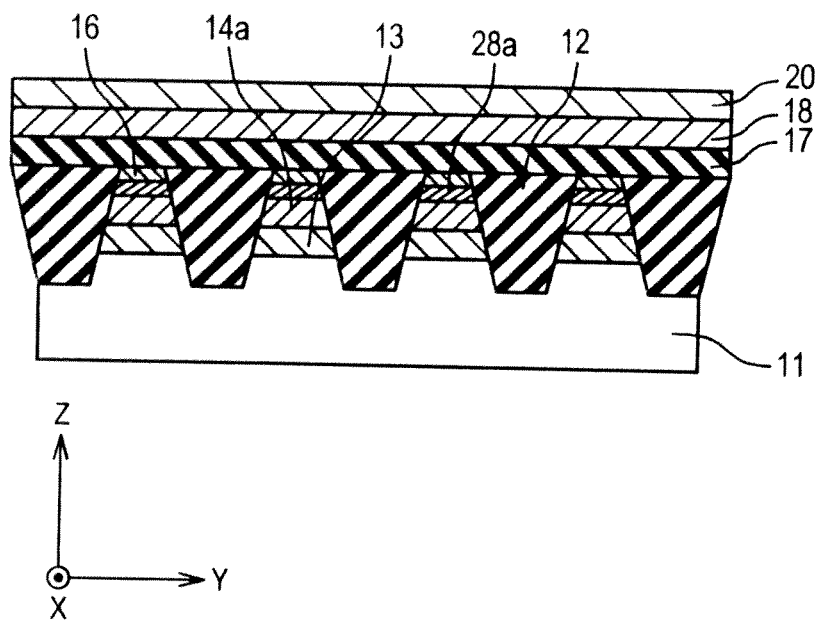
FIG. 22A is a cross-sectional view along I-I* in the method for manufacturing the nonvolatile semiconductor storage device in accordance with the fourth embodiment.
Figure 22B:
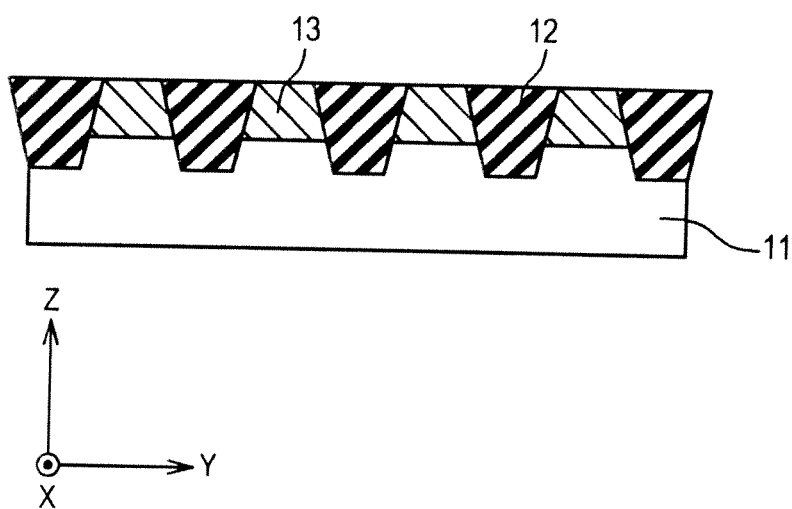
FIG. 22B is a cross-sectional view along II-II* in the method for manufacturing the nonvolatile semiconductor storage device in accordance with the fourth embodiment.

Subsequently, as shown in FIGS. 22A and 22B, the exposed portion of the second ion implantation layer 14a is ion-implanted with first conductivity type impurities. As a result, the exposed portion of the second ion implantation layer 14a becomes of the first conductivity type, and the unexposed portion of the second ion implantation layer 14a (the portion covered with the bottom electrode 16) remains of the second conductivity type. For example, ion species including P (phosphorus) ions of p type impurities are ion-implanted into the exposed portion of the second ion implantation layer 14a. As a result, the exposed portion of the second ion implantation layer 14a is changed into an n+ type Si (silicon) layer. The unexposed portion of the second ion implantation layer 14a remains the p+ type Si (silicon) layer. Consequently, the ion-implanted portion of the second ion implantation layer 14a, and the first ion implantation layer 13a become the first conductivity type first semiconductor layer 13 of the diode 15. The first semiconductor layer 13 also serves as the bit line 13. On the other hand, the unexposed portion of the second ion implantation layer 14a becomes the second conductivity type second semiconductor layer 14 of the diode 15.

Figure 23A:
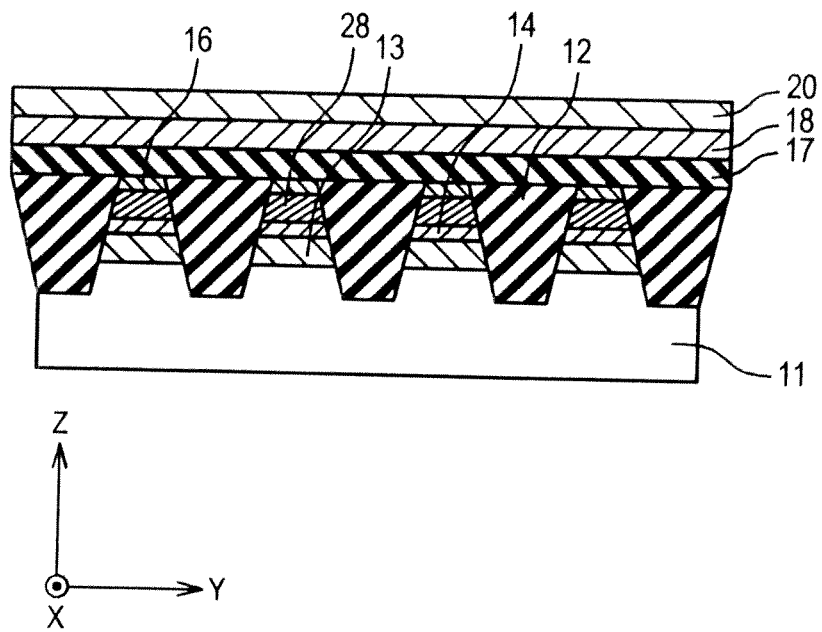
FIG. 23A is a cross-sectional view along I-I* in the method for manufacturing the nonvolatile semiconductor storage device in accordance with the fourth embodiment.
Figure 23B:
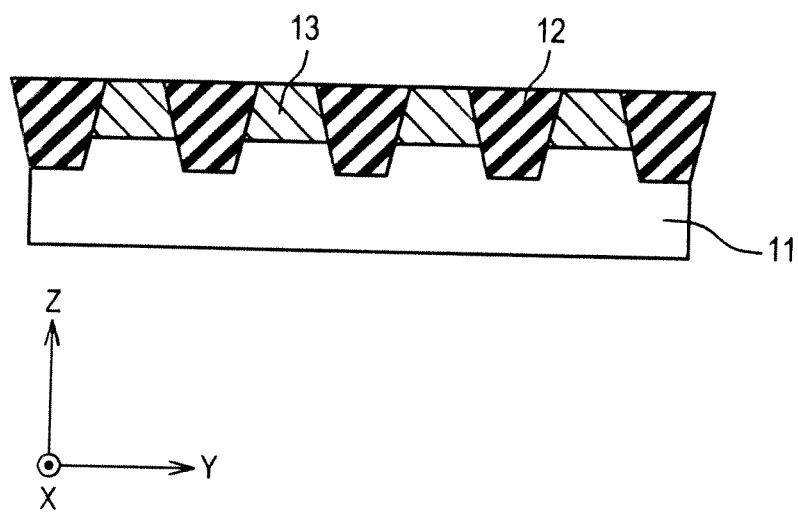
FIG. 23B is a cross-sectional view along II-II* in the method for manufacturing the nonvolatile semiconductor storage device in accordance with the fourth embodiment.

Then, as shown in FIGS. 23A and 23B, the substrate 11 is annealed at an appropriate temperature, so that the metal film 28a and the top of the second semiconductor layer 14 react with each other to be silicidized. As a result, the silicide layer 28 can be formed. Incidentally, the formation of silicide may be performed before the deposition of the bottom electrode film 16a in the case of FIGS. 18A and 18B. In this case, after annealing of the substrate 11, the excess portion of the metal film is removed by etching. Then, the bottom electrode film 16a is deposited.

Then, an interlayer insulation film such as silicon oxide is formed in such a manner as to cover the entire surface of the substrate 11. Then, a planarization treatment is performed by CMP. As a result, it is possible to manufacture the nonvolatile semiconductor storage device 1 as shown in FIGS. 17A and 17B.

Also in the case of the present embodiment, it is possible to obtain the same effects as those with the first embodiment. In addition, the provision of the silicide layer 28 between the diode 15 and the resistance change part 19 can reduce the contact resistance between the diode 15 and the resistance change part 19.

Fifth Embodiment

Figure 24:
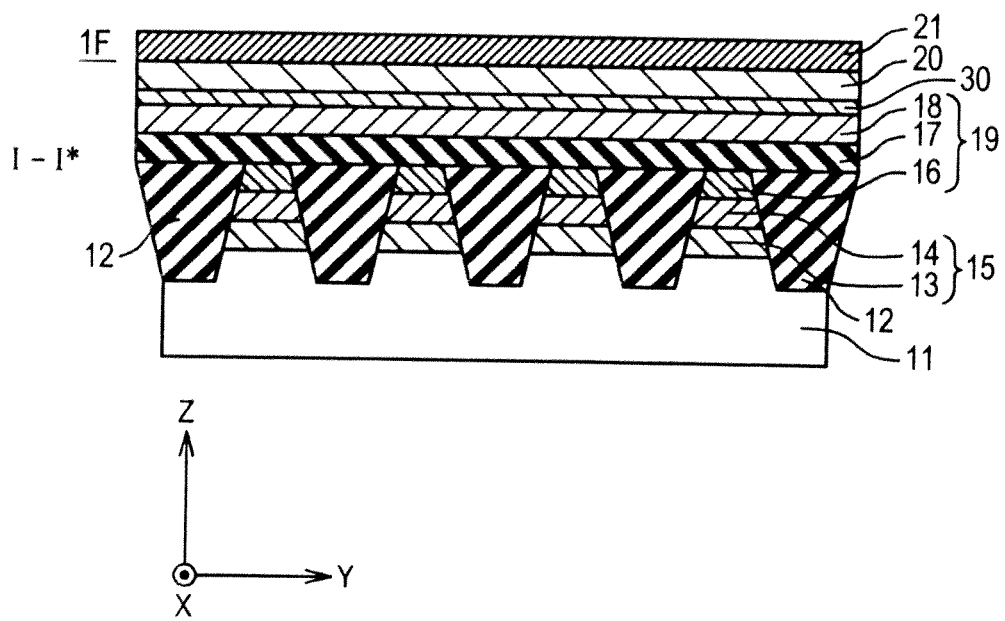
FIG. 24 is a cross-sectional view along I-I* in a configuration example of a nonvolatile semiconductor storage device in accordance with a fifth embodiment of the present invention.

A description will be given to a nonvolatile semiconductor storage device in accordance with a fifth embodiment of the present invention. FIG. 24 is a cross-sectional view along I-I* in a configuration example of the fifth embodiment of the present invention. However, the definition of the I-I* cross section is the same as that of the first embodiment. Namely, the I-I* cross section is a yz cross section including the word line 20. A nonvolatile semiconductor storage device 1F of the present embodiment is different from the nonvolatile semiconductor storage device 1 of the first embodiment in having a barrier layer 30 as a part of the word line 20 between the top electrode 18 and the word line 20. Below, the difference will be mainly described.

The barrier layer 30 is disposed as a part of the word line 20 between the top electrode 18 and the word line 20. The barrier layer 30 prevents a metal such as Cu (copper) forming the word line 20 from being diffused through the top electrode 18, and being diffused into the resistance change layer 17. The barrier layer 30 is exemplified by TiN (titanium nitride) and TaN (tantalum nitride). Thus, the insertion of the barrier layer 30 prevents the metal diffusion, which can improve the reliability of the nonvolatile semiconductor storage device.

Then, a description will be given to a method for manufacturing the nonvolatile semiconductor storage device in accordance with the fifth embodiment of the present invention. A method for manufacturing a nonvolatile semiconductor storage device 1F is the same as the case of the method for manufacturing the nonvolatile semiconductor storage device 1 of the first embodiment, except that a barrier layer film is further deposited between the top electrode film 18a and the word line film 20a in the steps of FIGS. 9A to 9E.

Namely, in the steps of FIGS. 9A to 9E, the resistance change layer film 17a, the top electrode film 18a, the barrier layer film (not shown), and the word line film 20a are deposited in this order in such a manner as to cover a plurality of the element isolation insulation layers 12, and a plurality of the buried bottom electrode films 16a. For example, a transition metal oxide such as $ZrO_2$ (zirconium oxide), a metal film such as Ru (ruthenium), a metal film such as TiN (titanium nitride), and a metal film such as Cu (copper) are deposited in this order.

Also in the case of the present embodiment, it is possible to obtain the same effect as that with the first embodiment. In addition, the provision of the barrier layer 30 between the top electrode 18 and the word line 20 prevents the metal diffusion. This can improve the reliability of the nonvolatile semiconductor storage device.

Sixth Embodiment

Figure 25:
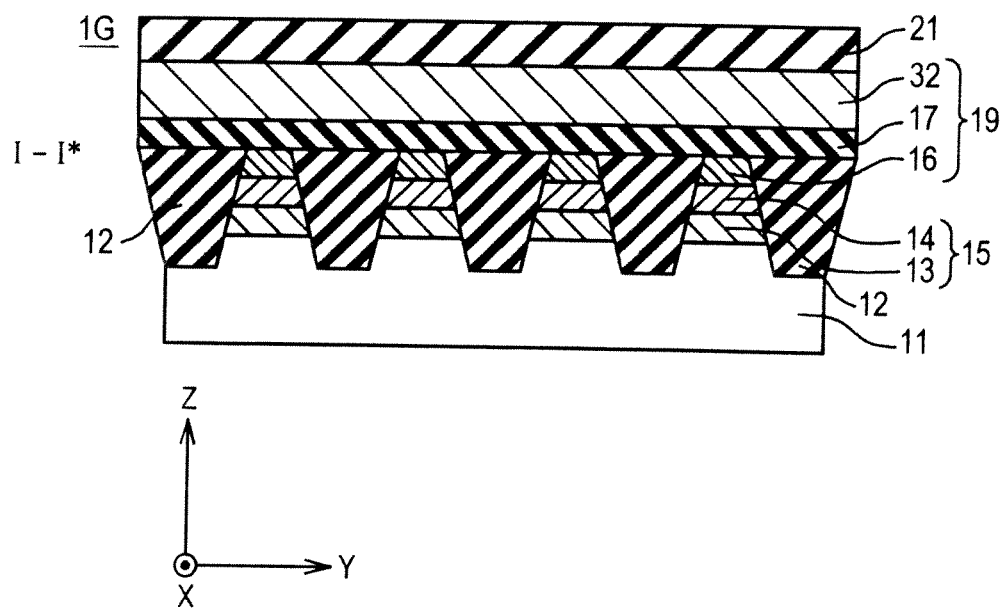
FIG. 25 is a cross-sectional view along I-I* in a configuration example of a nonvolatile semiconductor storage device in accordance with a sixth embodiment of the present invention.

A description will be given to a nonvolatile semiconductor storage device in accordance with a sixth embodiment of the present invention. FIG. 25 is a cross-sectional view along I-I* in a configuration example of the nonvolatile semiconductor storage device in accordance with the sixth embodiment of the present invention. However, the definition of the I-I* cross section is the same as that in the first embodiment. Namely, the I-I* cross section is a yz cross section including the word line 20. A nonvolatile semiconductor storage device 1G of the present embodiment is different from the nonvolatile semiconductor storage device 1 of the first embodiment in having an electrode wiring layer 32 including the top electrode 18 and the word line 20 integrally formed. Below, the difference will be mainly described.

The electrode wiring layer 32 is obtained by integrating the top electrode 18 and the word line 20. The electrode wiring layer 32 has the function of the top electrode 18 and the function of the word line 20. For this reason, the electrode wiring layer 32 is preferably formed with a larger film thickness than that of a general top electrode 18 alone, or the film thickness of the word line 20 alone. The electrode wiring layer 32 is exemplified by thick-film W (tungsten), Al (aluminum), and Cu (copper).

Then, a description will be given to a method for manufacturing the nonvolatile semiconductor storage device in accordance with the sixth embodiment of the present invention. The method for manufacturing a nonvolatile semiconductor storage device 1G is the same as the case of the method for manufacturing the nonvolatile semiconductor storage device 1 of the first embodiment, except that an electrode wiring layer film is deposited in place of the top electrode film 18a and the word line film 20a in the steps of FIGS. 9A to 9E.

Namely, in the steps of FIGS. 9A to 9E, a resistance change layer film 17a and an electrode wiring layer film (not shown) are deposited in this order in such a manner as to cover a plurality of the element isolation insulation layers 12, and a plurality of the buried bottom electrode films 16a. For example, a transition metal oxide such as $ZrO_2$ (zirconium oxide), and a thick film of a metal film such as W (tungsten) are deposited in this order.

Also in the case of the present embodiment, it is possible to obtain the same effect as that of the first embodiment. In addition, one electrode wiring layer film is used in place of the top electrode film 18a and the word line film 20a. This can simplify the manufacturing process, can reduce the manufacturing cost, and can shorten the manufacturing period.

Seventh Embodiment

Figure 26:
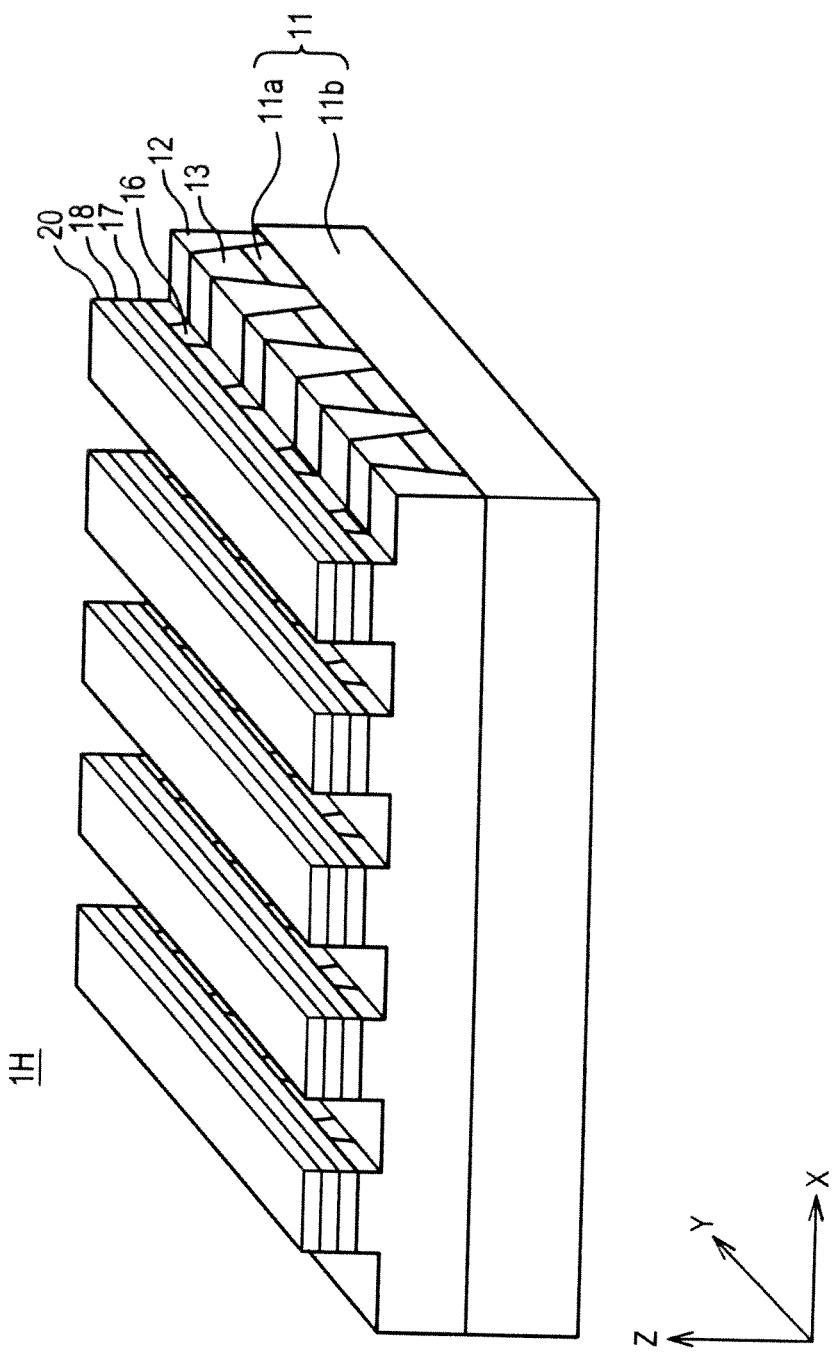
FIG. 26 is a perspective view schematically showing a configuration example of a nonvolatile semiconductor storage device in accordance with a seventh embodiment of the present invention.

A description will be given to a nonvolatile semiconductor storage device in accordance with a seventh embodiment of the present invention. FIG. 26 is a perspective view schematically showing a configuration example of the nonvolatile semiconductor storage device in accordance with the seventh embodiment of the present invention. A nonvolatile semiconductor storage device 1H of the present embodiment is different from the nonvolatile semiconductor storage device 1 of the first embodiment in that the substrate is a SOI (Silicon on Insulator) substrate. Below, the difference will be mainly described.

Figure 27A:
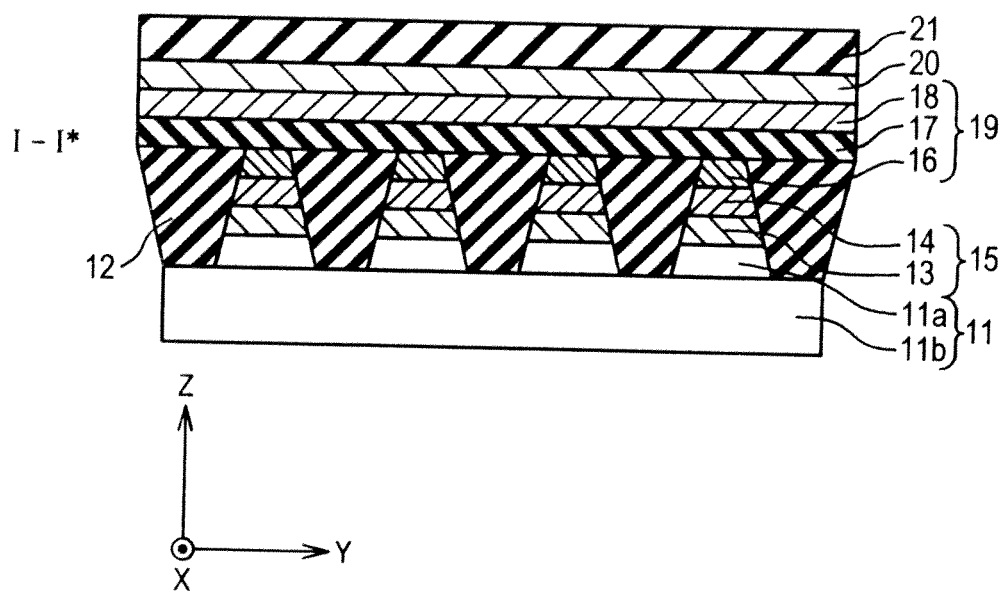
FIG. 27A is a cross-sectional view along I-I* in FIG. 26.
Figure 27B:
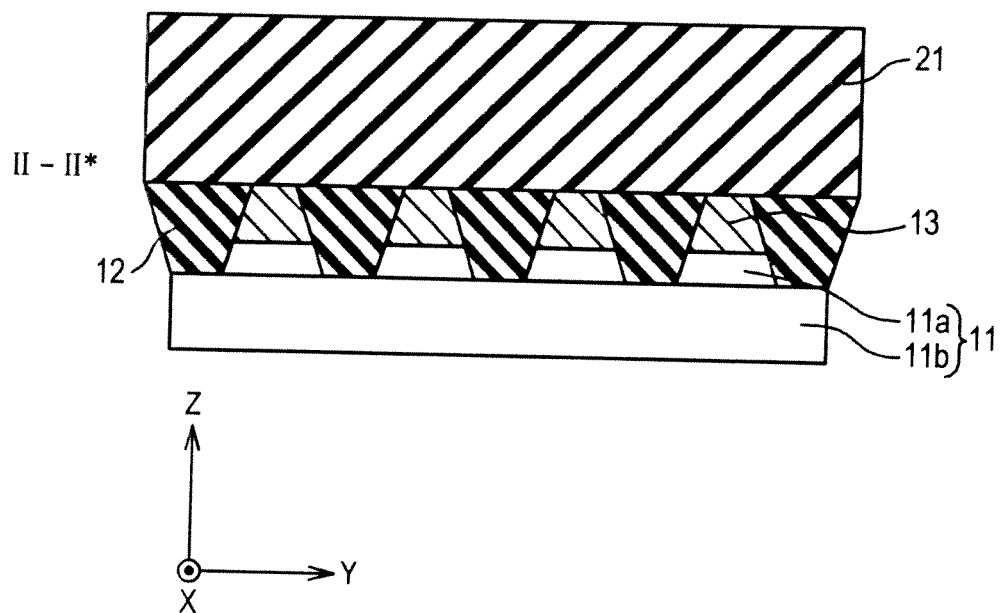
FIG. 27B a cross-sectional view along II-II* in FIG. 26.

FIGS. 27A and 27B are a cross-sectional view along I-I* and a cross-sectional view along II-II* in FIG. 26, respectively. However, the definitions of the I-I* cross section and the II-II* cross section are the same as those in the first embodiment. Namely, the I-I* cross section is a yz cross section including the word line 20. The II-II* cross section is a yz cross section not including the word line 20.

The substrate 11 includes an insulation layer 11b, and a silicon layer 11a disposed over the insulation layer 11b. It is preferable that the thickness of the silicon layer 11a is generally the same as the thickness of the element isolation insulation layer. In that case, the bottom surface of the element isolation insulation layer 12 is in contact with the insulation layer 11b. Accordingly, the silicon layer 11a in contact with the bottom surface of the bit line 13 (first semiconductor layer 13) is separated from the silicon layer 11a in contact with the bottom surface of the adjacent bit line 13 (first semiconductor layer 13). As a result, it is possible to prevent the leakage current between the bit lines 13.

Then, a description will be given to a method for manufacturing the nonvolatile semiconductor storage device in accordance with the seventh embodiment of the present invention. A method for manufacturing a nonvolatile semiconductor storage device 1H is the same as the case of the method for manufacturing the nonvolatile semiconductor storage device 1 of the first embodiment, except that a SOI substrate is used as the substrate 11.

Also in the case of the present embodiment, it is possible to obtain the same effect as that with the first embodiment. In addition, the SOI substrate is used as the substrate 11, and hence, it is possible to prevent the leakage current between the bit lines 13.

Eighth Embodiment

Figure 28:
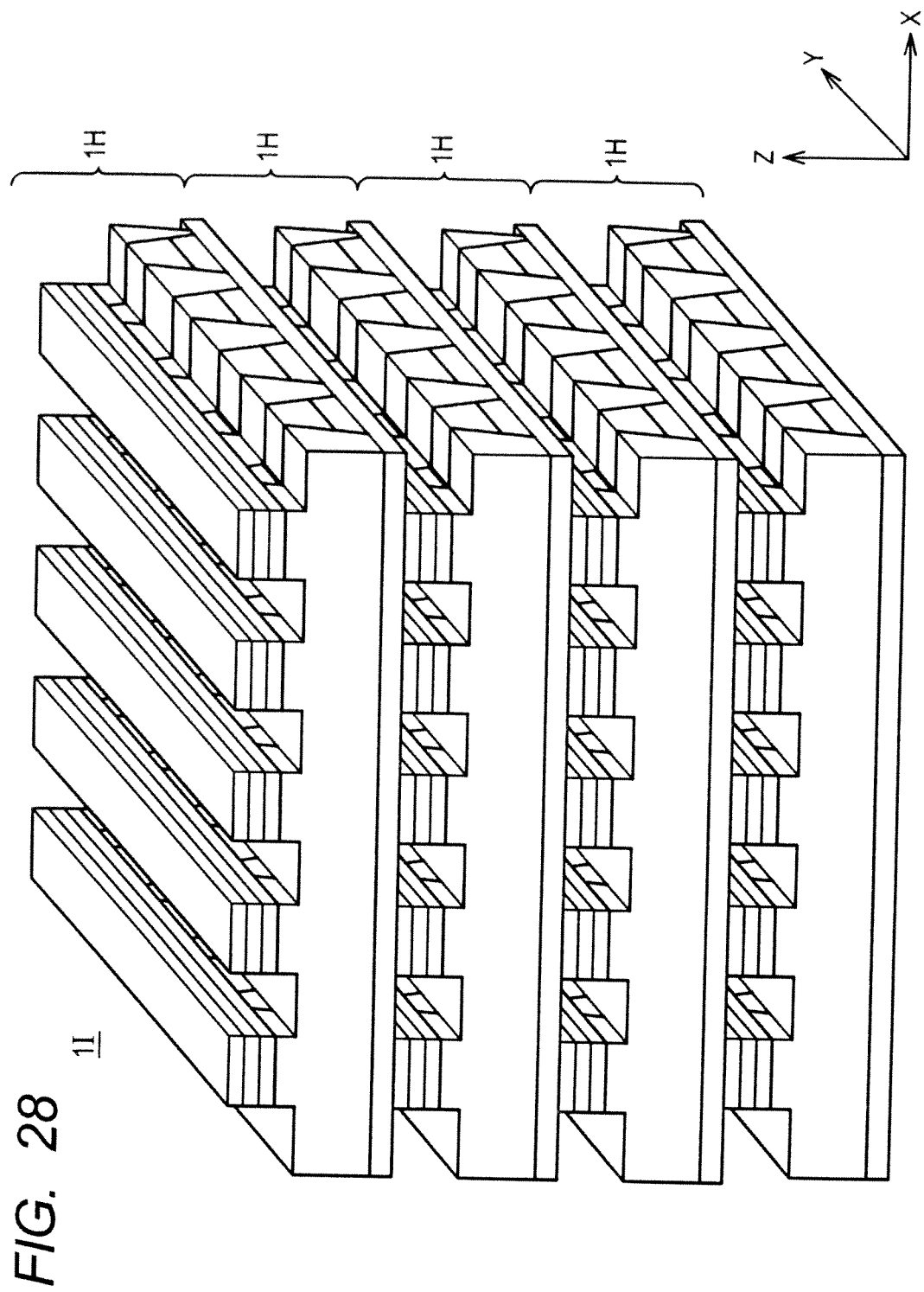
FIG. 28 is a perspective view schematically showing a configuration example of a nonvolatile semiconductor storage device in accordance with an eighth embodiment of the present invention.

A description will be given to a nonvolatile semiconductor storage device in accordance with an eighth embodiment of the present invention. FIG. 28 is a perspective view schematically showing a configuration example of the nonvolatile semiconductor storage device in accordance with the eighth embodiment of the present invention. A nonvolatile semiconductor storage device 1I of the present embodiment is different from the nonvolatile semiconductor storage device 1H of the seventh embodiment in that the structures of the nonvolatile semiconductor storage device 1H are stacked. Below, the difference will be mainly described.

The nonvolatile semiconductor storage device 1I has a configuration in which the structures of the nonvolatile semiconductor storage device 1H are stacked. The configuration for one layer is the same as that of the nonvolatile semiconductor storage device 1H. By thus stacking a plurality of layers of the nonvolatile semiconductor storage devices 1H, it is possible to improve the integration degree of the cell array.

Then, a description will be given to a method for manufacturing the nonvolatile semiconductor storage device in accordance with the eighth embodiment of the present invention. First, a plurality of the nonvolatile semiconductor storage devices 1H are manufactured. The method for manufacturing the nonvolatile semiconductor storage device 1H is as described in the seventh embodiment. Then, an insulation layer lib on the back surface side of each nonvolatile semiconductor storage device 1H is polished to a prescribed thickness. The prescribed thickness is preferably, for example, a thickness of such a degree that the nonvolatile semiconductor storage devices 1H do not electrically/magnetically affect one another. Then, they are bonded to one another, thereby to manufacture the nonvolatile semiconductor storage device 1I.

Also in the case of the present embodiment, it is possible to obtain the same effects as those of the seventh embodiment. In addition, the nonvolatile semiconductor storage devices 1H are stacked, which can improve the integration degree of the cell array.

Ninth Embodiment

Figure 29:
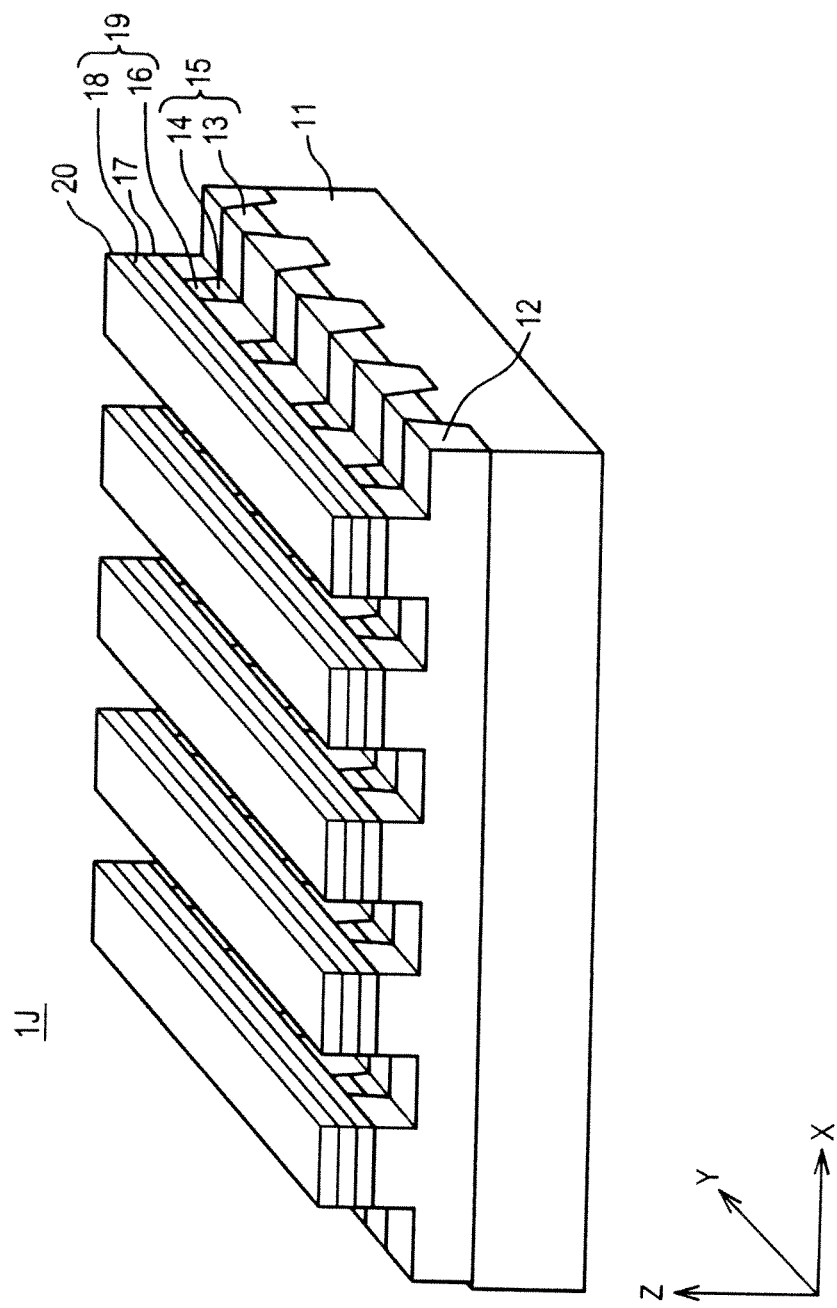
FIG. 29 is a perspective view schematically showing a configuration example of a nonvolatile semiconductor storage device in accordance with a ninth embodiment of the present invention.

A description will be given to a nonvolatile semiconductor storage device in accordance with a ninth embodiment of the present invention. FIG. 29 is a perspective view schematically showing a configuration example of the nonvolatile semiconductor storage device in accordance with the ninth embodiment of the present invention. A nonvolatile semiconductor storage device 1J of the present embodiment is different from the nonvolatile semiconductor storage device 1 of the first embodiment in that the bit line 13 is formed thin. Below, the difference will be mainly described.

Figure 30A:
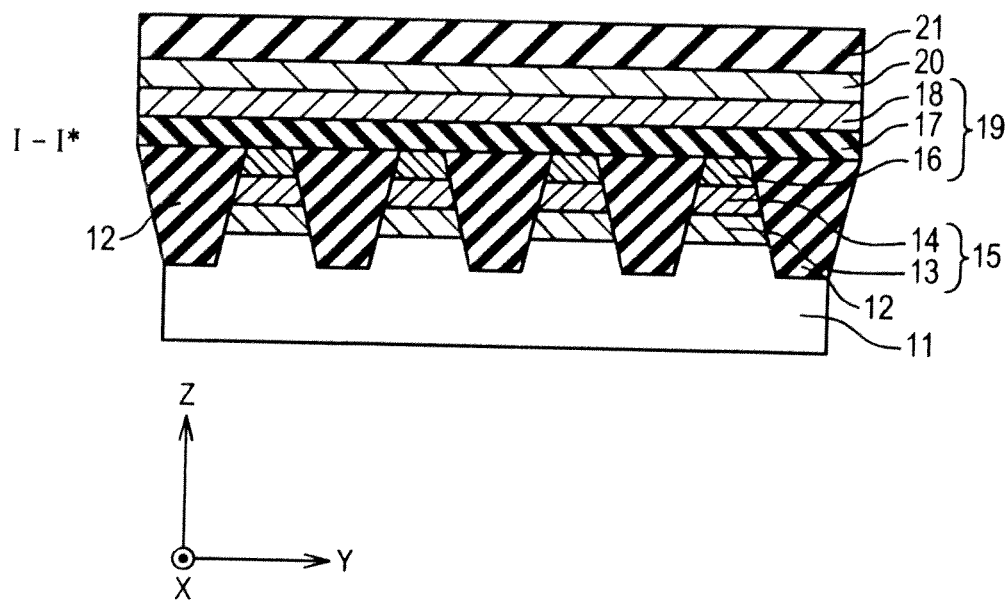
FIG. 30A is a cross-sectional view along I-I* in FIG. 29.
Figure 30B:
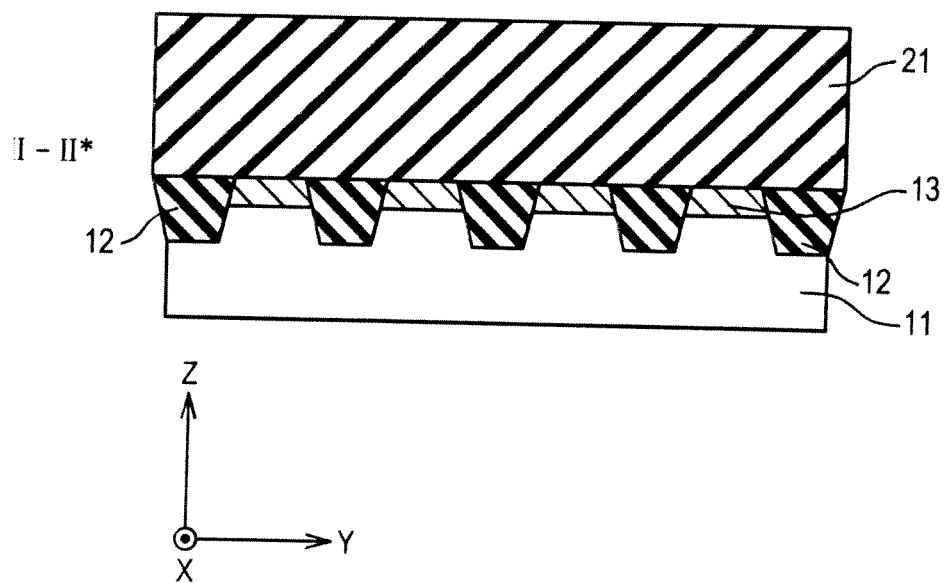
FIG. 30B is a cross-sectional view along II-II* in FIG. 29.

FIGS. 30A and 30B are a cross-sectional view along I-I* and a cross-sectional view along II-II* in FIG. 29, respectively. However, the definitions of the I-I* cross section and the II-II* cross section are the same as those in the first embodiment. Namely, the I-I* cross section is a yz cross section including the word line 20. The II-II* cross section is a yz cross section not including the word line 20.

In the bit line 13, the portion coupling the memory cells 10 adjacent in the X direction is formed thinner than that of the nonvolatile semiconductor storage device 1. As a result, the word line 13 (first semiconductor layer 13) under the second semiconductor layer 14 and the word line 13 at portions coupling the adjacent memory cells 10 have the same film thickness.

Then, a description will be given to a method for manufacturing the nonvolatile semiconductor storage device in accordance with the ninth embodiment of the present invention. A method for manufacturing a nonvolatile semiconductor storage device 1J is the same as the case of the method for manufacturing the nonvolatile semiconductor storage device 1 of the first embodiment, except that the steps of FIGS. 10A to 10E are different, and that the steps of FIGS. 11A to 11E are not performed.

In the steps of FIGS. 10A to 10E, with a plurality of the second ion implantation layers 14a as an etching stopper, the word line film 20a, the top electrode film 18a, the resistance change layer film 17a, and a plurality of the bottom electrode films 16a are etched so that a plurality of the word lines 20 extend in the Y direction. This results in the formation of each word line 20, and thereunder, the top electrode 18, the resistance change layer 17, and the bottom electrode 16. As a result, the buried bottom electrode 16, the resistance change layer 17, and the top electrode 18 under the word line 20 become a resistance change part 19. Then, further, with the word line 20, the top electrode 18, the resistance change layer 17, and the bottom electrode 16 as a mask, the top of the element isolation insulation layer 12, and the second ion implantation layer 14a exposed between the adjacent word lines 20 are etched. As a result, the first ion implantation layer 13a is exposed, resulting in the bit line 13.

As described up to this point, in accordance with the present embodiment, the structure of the cross-point type memory cell 10 can be formed in a self-aligned manner, which enables the implementation of the minimum unit cell at the memory cell.

Tenth Embodiment

Figure 31:
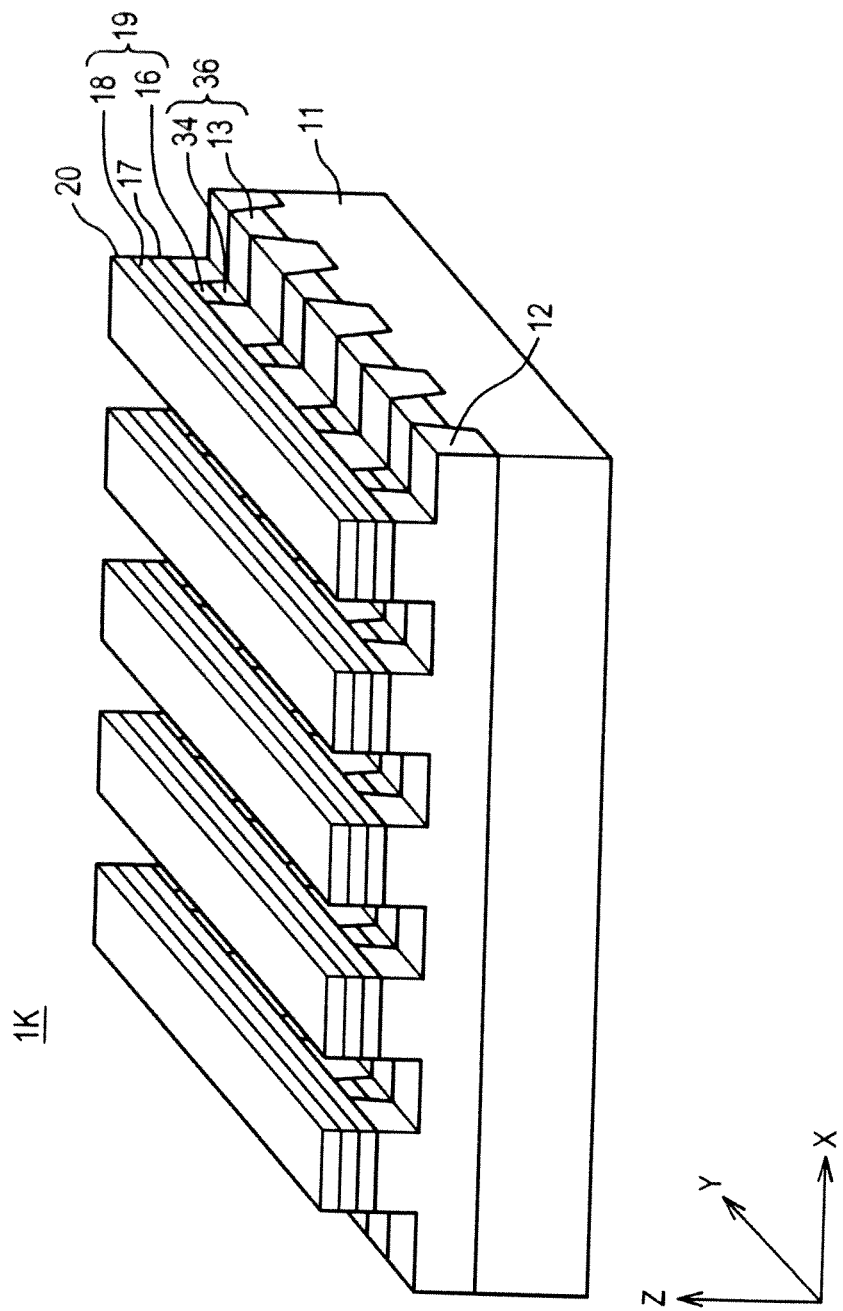
FIG. 31 is a perspective view schematically showing a method for manufacturing a nonvolatile semiconductor storage device in accordance with a tenth embodiment of the present invention.

A description will be given to a nonvolatile semiconductor storage device in accordance with a tenth embodiment of the present invention FIG. 31 is a perspective view schematically showing a configuration example of the nonvolatile semiconductor storage device in accordance with the tenth embodiment of the present invention. A nonvolatile semiconductor storage device 1K of the present embodiment is different from the nonvolatile semiconductor storage device 1J of the ninth embodiment in that the diode is a Schottky diode 36. Below, the difference will be mainly described.

The Schottky diode 36 has a rectifying function, is disposed over the bit line 13, and includes the first semiconductor layer 13 and the metal layer 34. The first semiconductor layer 13 is formed in contact with the bit line 13. The metal layer 34 is disposed in contact with the first semiconductor layer 13, and is in contact with the resistance change part 19.

Figure 32:
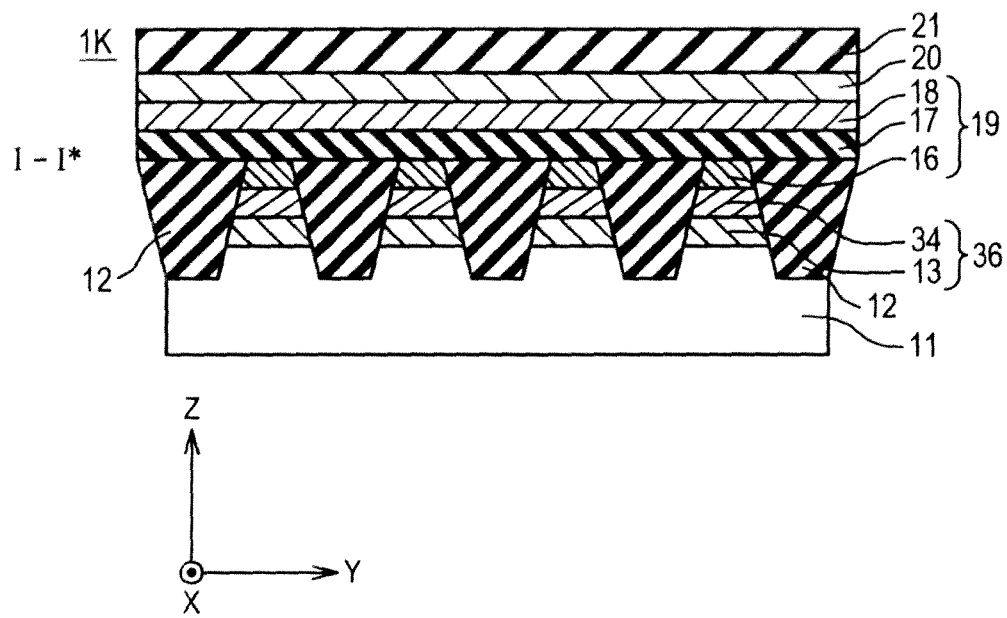
FIG. 32 is a cross-sectional view along I-I* in the configuration example of the nonvolatile semiconductor storage device in accordance with the tenth embodiment of the present invention.

FIG. 32 is a cross-sectional view along I-I* in a configuration example of the nonvolatile semiconductor storage device in accordance with the tenth embodiment of the present invention. However, the definition of the I-I* cross section is the same as in the first embodiment. Namely, the I-I* cross section is a yz cross section including the word line 20.

The first semiconductor layer 13 of the Schottky diode 36 is included in the bit line 13, and is a region including the memory cell 10 in the bit line 13. The first semiconductor layer 13 is substantially the same as the bit line 13 in the region. Namely, the bit line 13 also serves as the first semiconductor layer 13 in the region. The first semiconductor layer 13 is of the first conductivity type as with the bit line 13, and is exemplified by an n+ type Si (silicon). The metal layer 34 of the Schottky diode 36 is in contact with the top of the bit line 13 (first semiconductor layer 13). The metal layer 34 is a metal to be in Schottky contact with the first semiconductor layer 13. Examples thereof include Al (aluminum), Au (gold), W (tungsten), and Pt (platinum) when the first semiconductor layer 13 is an n type Si (silicon). Implementation of the Schottky diode 36 can increase the switching speed as compared with the PN junction diode.

Then, a description will be given to a method for manufacturing the nonvolatile semiconductor storage device in accordance with the tenth embodiment of the present invention. The method for manufacturing the nonvolatile semiconductor storage device 1K is the same as the method for manufacturing the nonvolatile semiconductor storage device 1J of the ninth embodiment, except that the steps of FIGS. 5A to 5E, the steps of FIGS. 6A to 6E, and FIGS. 7A to 7E are different.

In the steps of FIGS. 5A to 5E, the tops of the semiconductor regions 11p are etched back deeper than in the case of the nonvolatile semiconductor storage device 1J. As a result, a plurality of recessed structures 11qa each in a thin rectangular form (not shown) are formed between a plurality of the element isolation insulation layers 12. In each recessed structure 11qa, the bottom surface is the top surface of the semiconductor region 11p, and the side surface is the side surface of the element isolation insulation layer 12. A plurality of the recessed structures 11qa mutually extend in the X direction. The recessed structure 11qa has a deeper recess than the recessed structure 11q.

Then, in the steps of FIGS. 6A to 6E, a plurality of the semiconductor regions 11p are relatively shallowly ion-implanted with first conductivity type impurities. As a result, in the shallow part of the semiconductor region 11p, a first conductivity type first ion implantation layer 13a is formed. For example, the ion species including P (phosphorus) ions of n type impurities are relatively shallowly ion-implanted, so that the shallow part is changed into an n+ type Si (silicon) layer as the first ion implantation layer 13a. However, there is not performed the ion implantation of second conductivity type impurities performed for the nonvolatile semiconductor storage device 1J. The first ion implantation layer 13a becomes the bit line 13 in a step at a subsequent stage.

Then, in the steps of FIGS. 7A to 7E, a metal film for Schottky and the bottom electrode film 16a are stacked in this order in such a manner as to cover the entire surface of the substrate 11. For example, a metal film such as W (tungsten), and a metal film such as Ru (ruthenium) are stacked in this order. As a result, a plurality of the element isolation insulation layers 12 and a plurality of the recessed structures 11qa (the first ion implantation layer 13a of the semiconductor region 11p) are covered with the metal film for Schottky and the bottom electrode film 16a. The metal film for Schottky and the first ion implantation layer 13a are each a metal-semiconductor junction structure forming the Schottky diode 36 in a step at a subsequent stage.

Also in the present embodiment, it is possible to obtain the same effects as those of the ninth embodiment. In addition, implementation of the Schottky diode 36 can increase the switching speed as compared with a PN junction diode.

Figure 33:
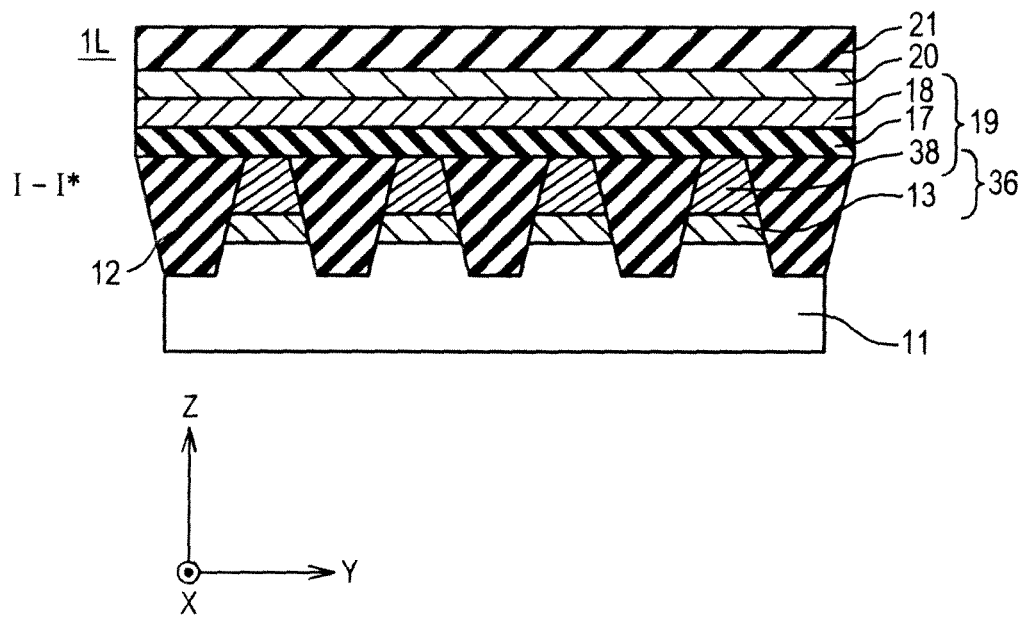
FIG. 33 is a cross-sectional view along I-I* of a nonvolatile semiconductor storage device of a modified example of the tenth embodiment of the present invention.

Then, a description will be given to a modified example of the present embodiment. FIG. 33 is a cross-sectional view along I-I* of a nonvolatile semiconductor storage device 1L in a modified example of the present embodiment.

As compared with the case of the nonvolatile semiconductor storage device 1K of FIG. 32, the case of the nonvolatile semiconductor storage device 1L of FIG. 33 is different in having a metal electrode layer 38 obtained by integrating the metal layer 34 of the Schottky diode 36 and the bottom electrode 16 of the resistance change part 19. Below, the difference will be mainly described.

The metal electrode layer 38 is obtained by integrating the integrated metal layer 34 and the bottom electrode 16. The metal electrode layer 38 has the function of the metal layer 34 and the function of the bottom electrode 16 in combination. For this reason, the metal electrode layer 38 is preferably formed with a larger film thickness than the film thickness of a general metal layer 34 alone, or the film thickness of the bottom electrode 16 alone. The metal electrode layer 38 is exemplified by a thick-film W (tungsten).

The method for manufacturing the nonvolatile semiconductor storage device 1L is the same as the case of the method for manufacturing the nonvolatile semiconductor storage device 1K, except that a metal electrode layer film (not shown) is deposited in place of the metal film for Schottky and the bottom electrode film in the method for manufacturing the nonvolatile semiconductor 1K.

Also in the present modified example, it is possible to obtain the same effects as those with the nonvolatile semiconductor storage device 1K. In addition, one metal electrode layer film is used in place of the metal film for Schottky and the bottom electrode film. As a result, it is possible to implement the simplification of the manufacturing process, the reduction of the manufacturing cost, and the shortage of the manufacturing period.

The respective nonvolatile semiconductor storage devices described up to this point are applicable not only to the case where the devices are used as nonvolatile memories (e.g., mass storage nonvolatile memories such as ReRAM), but also to semiconductor devices such as anti-fuses, mask ROMs (Read only Memories), FPGA (Field-Programmable Gate Arrays), memory-merged system LSI (Large Scale Integration), and logic-merged memories.

The present invention is not limited to the foregoing respective embodiments. It is apparent that an appropriate modification or change of the each embodiment may be made within the scope of the technical idea of the present invention. Further, the technologies used in each embodiment or modified example thereof are not exclusively applied to the embodiments, and are also applicable to other embodiments unless a technical contradiction occurs.

What is claimed is:

1. A nonvolatile semiconductor storage device, comprising:
    a plurality of first wires extending in a first direction;
    a plurality of second wires extending in a second direction different from the first direction; and
    a plurality of memory cells disposed at respective points of intersection of the first wires and the second wires,
    wherein each of the memory cells includes:
    a diode disposed over the first wire, and coupled to the first wire at one end thereof; and
    a resistance change part disposed over the diode, and coupled in series to the diode at one end thereof, and coupled to the second wire at the other end thereof, and for storing information through a change in resistance value,
    wherein the diode includes:
    a first semiconductor layer of a first conductivity type; and
    a second semiconductor layer of a second conductivity type different from the first conductivity type, and
    wherein the second semiconductor layer extends into the inside of the first semiconductor layer.

2. The nonvolatile semiconductor storage device according to claim 1,
    wherein the first wires are embedded in the substrate, and each include a semiconductor layer of the first conductivity type extending in the first direction, and
    wherein the first wires each include the first semiconductor layer.

3. The nonvolatile semiconductor storage device according to claim 2,
    wherein the resistance change part includes sidewalls formed of an insulator at both the side surfaces thereof opposing each other in the second direction.

4. The nonvolatile semiconductor storage device according to claim 3,
    wherein the first wire includes a first silicide layer disposed between the sidewalls, at a portion coupling the memory cells adjacent in the second direction.

5. The nonvolatile semiconductor storage device according to claim 2,
    wherein each of the memory cells further has a second silicide layer disposed between the diode and the resistance change part.

6. The nonvolatile semiconductor storage device according to claim 1,
    wherein the second wire includes a barrier layer between the resistance change part and it.

7. The nonvolatile semiconductor storage device according to claim 1,
    wherein the resistance change part includes:
    a top electrode coupled to the second wire;
    a bottom electrode coupled to the diode; and
    a resistance change layer disposed between the top electrode and the bottom electrode, and
    wherein the resistance change layer, the top electrode, and the second wire are stacked in this order, and extend in the second direction.

8. The nonvolatile semiconductor storage device according to claim 7,
    wherein the second wire is integral with the top electrode.

9. The nonvolatile semiconductor storage device according to claim 1,
    wherein the substrate comprises a SOI (Silicon on Insulator) substrate.

10. The nonvolatile semiconductor storage device according to claim 9,
    wherein the combinations of the substrate, the first wires, the second wires, and the memory cells are stacked in a plurality of layers.

* * * * *